(12) United States Patent
Naganarayana et al.

(10) Patent No.: US 7,289,635 B2
(45) Date of Patent: Oct. 30, 2007

(54) STRUCTURAL NOISE SOURCE PREDICTOR

(75) Inventors: Basavapatna P. Naganarayana, Farmington Hills, MI (US); Sathyanarayana Shankar, Bloomfield Hills, MI (US); Viswanath S. Bhattachar, Novi, MI (US)

(73) Assignee: EDAG AG, Fulda (DE)

( * ) Notice: Subject to any disclaimer, the term of this patent is extended or adjusted under 35 U.S.C. 154(b) by 1023 days.

(21) Appl. No.: 10/016,813

(22) Filed: Dec. 10, 2001

(65) Prior Publication Data

US 2003/0016832 A1 Jan. 23, 2003

Related U.S. Application Data

(60) Provisional application No. 60/306,944, filed on Jul. 20, 2001.

(51) Int. Cl.
| | |
|---|---|
| A61F 11/06 | (2006.01) |
| H03B 29/00 | (2006.01) |
| H04B 1/00 | (2006.01) |
| G01M 17/00 | (2006.01) |

(52) U.S. Cl. ............................ 381/71.4; 381/86; 701/29
(58) Field of Classification Search .................. 701/29; 381/86, 71.4, 94.1, 94.8, 61; 703/8
See application file for complete search history.

(56) References Cited

U.S. PATENT DOCUMENTS

| | | |
|---|---|---|
| 5,551,298 A | 9/1996 | Rayment |
| 5,675,505 A | 10/1997 | Trimboli |
| 5,940,788 A | 8/1999 | Morman et al. |
| 6,079,258 A | 6/2000 | List et al. |
| 6,090,147 A | 7/2000 | Bremner et al. |
| 6,101,432 A | 8/2000 | Her et al. |
| 6,160,758 A | 12/2000 | Spiesberger |

*Primary Examiner*—Xu Mei
(74) *Attorney, Agent, or Firm*—Dykema Gossett PLLC

(57) ABSTRACT

A method and system for determining locations in a design of an assembly likely to result in buzz, rattle, squeak ("BSR"), and/or other noise conditions. The invention uses a finite element model to represent a design. BSR effects are predicted based upon analysis performed on multiple design models. Users may engage in real-time "what if" analyses to determine the effects of various design and component changes on noise source characteristics. Additional intelligence may be applied to limit the number of model points subject to evaluation. Displacements, contact velocities, and force responses at selectively identified subsets of interesting points can evaluate noise characteristics. An "as designed" model may evaluate noise source characteristics at the beginning of the life of an assembly. Degraded models can determine the effects of aging and use. A restored model may evaluate the influence of optimal fastener design on BSR characteristics for assembly resulting from fastener degradation.

2 Claims, 32 Drawing Sheets

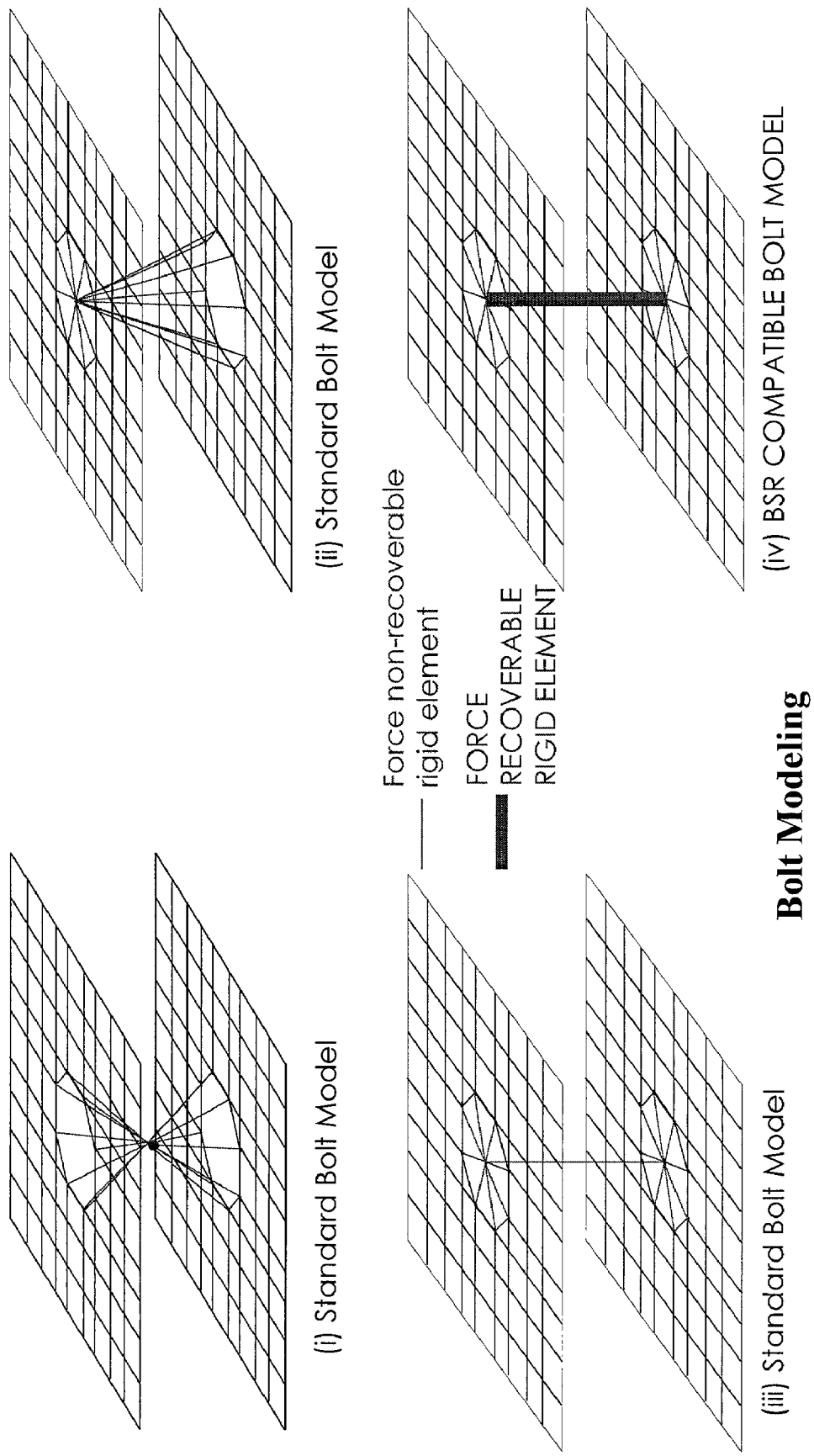

| | Rattle DOF | Squeak DOF |
|---|---|---|
| Snap-A | w | $u, v, \theta_z$ |
| Snap-B | u | $v, w, \theta_x$ |

Snaps are identified with the spring elements (CELAS)

Torsion springs are ignored

Snap Coordinate Compatibility

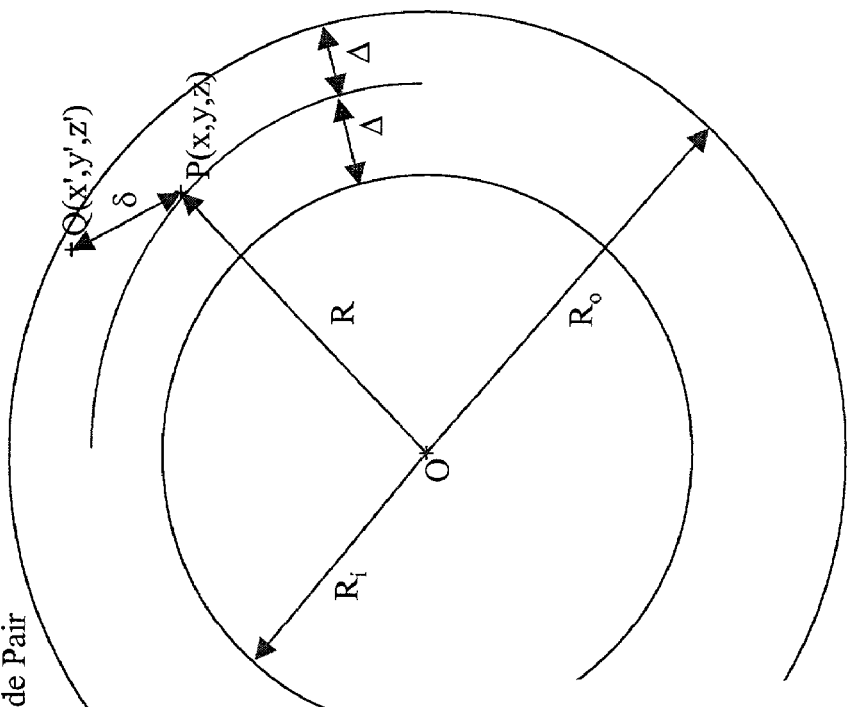

All nodes are sorted by R

If P and Q belong to different parts and if $(\delta_P \; \bullet \; \Delta)$
P and Q make a Rattle and Squeak Node Pair where, $\delta_P$ = Projected Nodal Distance along the average part normal ($\mathbf{n}_{avg}$)

$\Delta$ = Threshold Distance
　 $= \boxtimes(\Delta x^2 + \Delta y^2 + \Delta z^2)$ $\delta$ = Nodal Distance
　 $= \boxtimes\{(x-x')^2 + (y-y')^2 + (z-z')^2\}$ R = Nodal Position
　 $= \boxtimes(x^2 + y^2 + z^2)$ $R_o = R + \Delta$ $R_i = R - \Delta$

Fig. 9c

Non-Fastener Squeak and Rattle Points

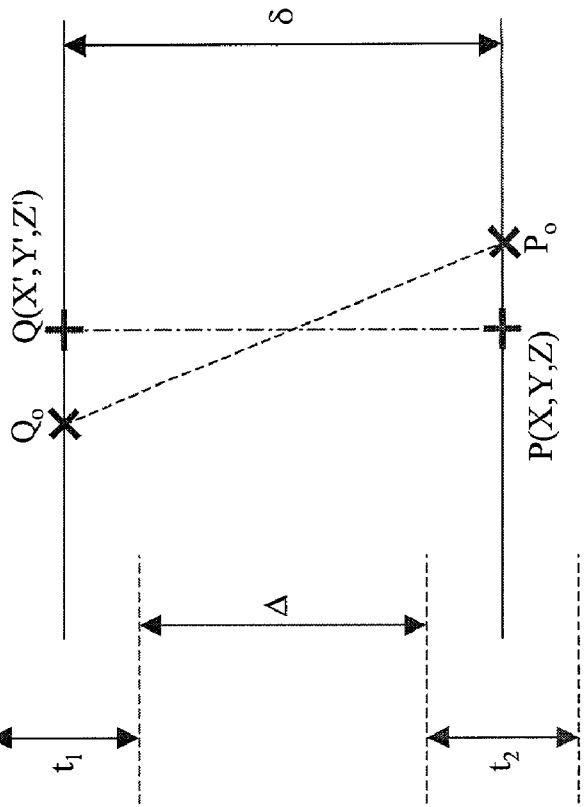

P and Q are the points projected along the average part normal ($n_{avg}$) corresponding to the original points $P_o$ and $Q_o$.

$(u_t, v_t, w_t); (u'_t, v'_t, w'_t)$    Displacements due to thermal effects
$(u_h, v_h, w_h); (u'_h, v'_h, w'_h)$    Displacements due to moisture effects
$(u_g, v_g, w_g); (u'_g, v'_g, w'_g)$    Displacements due to gravity effects $X = x - u_t - u_h - u_g$      $X' = x' - u'_t - u'_h - u'_g$
$Y = y - v_t - v_h - v_g$      $Y' = y' - v'_t - v'_h - v'_g$
$Z = z - w_t - w_h - w_g$      $Z' = z' - w'_t - w'_h - w'_g$ $\delta = \sqrt{(X-X')^2 + (Y-Y')^2 + (Z-Z')^2}$ $\Delta = \delta - (t_1 + t_2)/2$

Thickness and Environmental Effects

Fig. 10

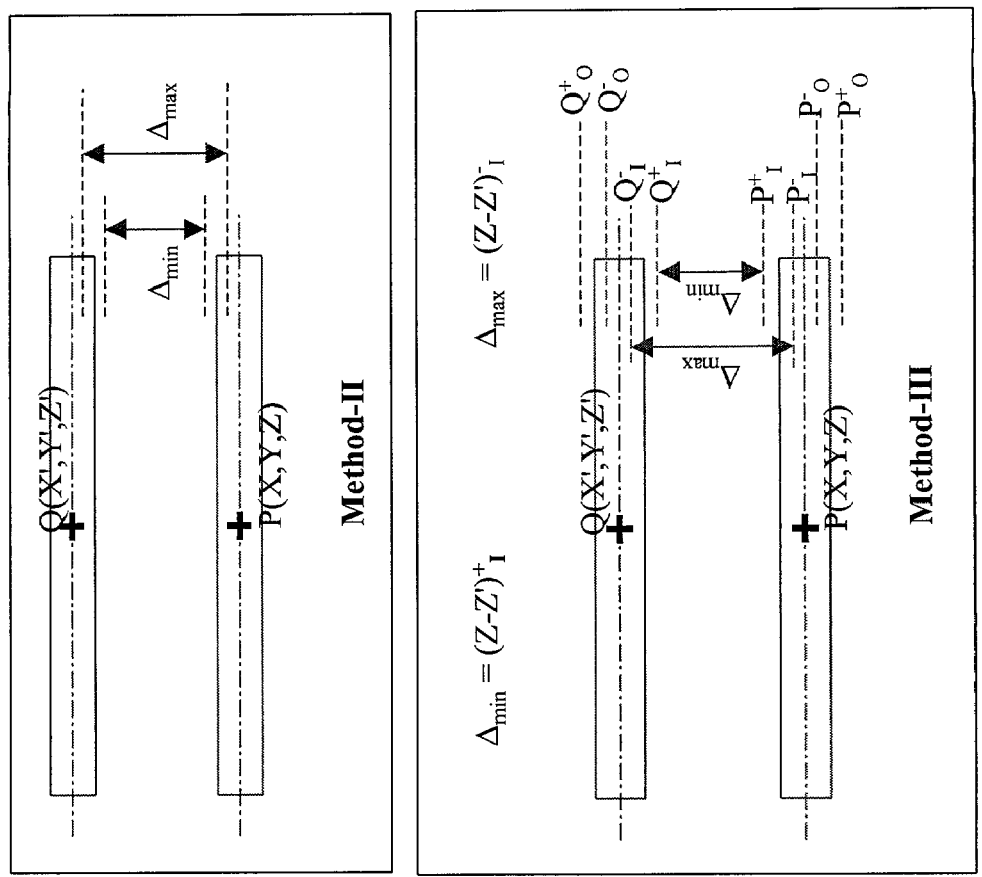
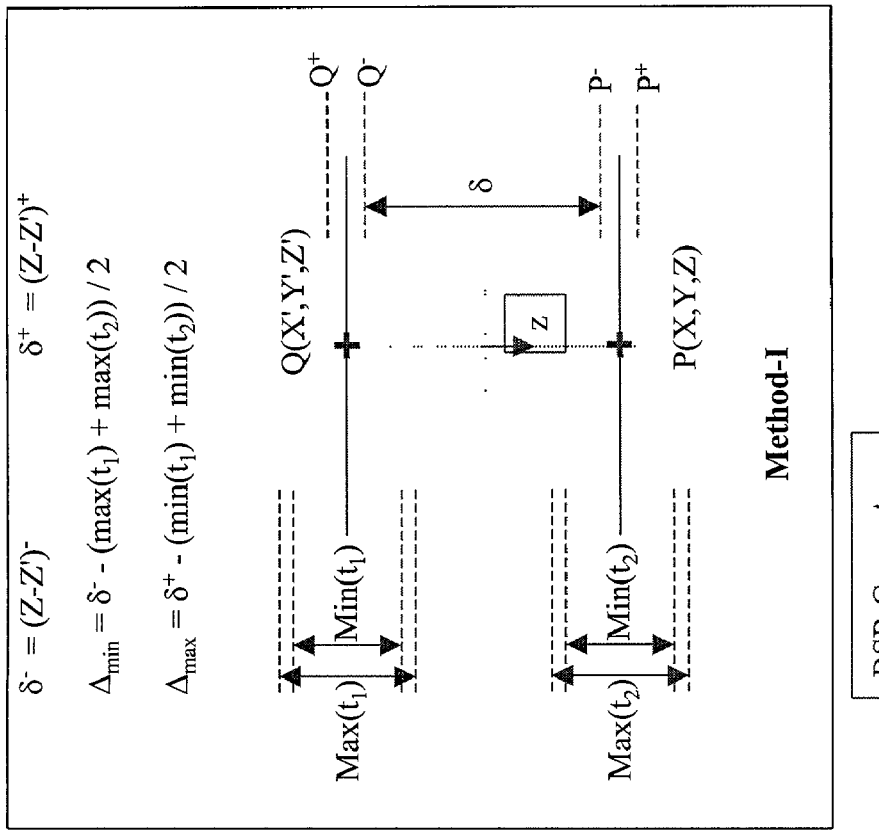
Fig. 11
Geometric Dimensioning & Tolerance Effects

Area of Interference and Velocities of Approach at First Contact

Ref : Kennith F. Alvin, " Robust model error localization for damage detection and finite element model update" structure dynamics and vibration control department, Scandi National Laboratories, A'lbuquerque, NM.

STRUCTURAL NOISE SOURCE PREDICTOR

RELATED APPLICATIONS

This application claims priority of the U.S. Provisional Application No. 60/306,944 entitled "STRUCTURAL BUZZ, SQUEAK & RATTLE PREDICTOR," filed on Jul. 20, 2001, the contents of which are hereby incorporated in their entirety by reference

BACKGROUND OF THE INVENTION

The present invention relates to a method or system used to predict the buzz, squeak, rattle, and/or other noise source characteristics (collectively "BSR source characteristics", "noise source characteristics", "BSR characteristics", or simply "noise characteristics") for an assembly of one or more components, with each component comprising one or more parts. More specifically, the invention relates to a method or system that receives design information regarding an assembly of components and/or parts in the form of a finite element analysis or model; selectively identifies a subset of points that are the most relevant with respect to noise source characteristics from all of the points in the analysis or model; and evaluates the relevant characteristics at those subset of points, using the displacements, velocities, loads, or other attributes relating to noise source characteristics at those points.

Structural noise is a significant problem in many multipart or multi-component assemblies, especially for applications in the automotive and aerospace industries. Such noise characteristics are almost always undesirable, but the current art does not provide an analytical tool to effectively predict noise source characteristics.

Structurally borne noises can originate at the locations of various fasteners, such as bolts, welds, snaps, glue, rivets, screws, nails, or any other fastener or connector (collectively "fasteners"), as well as at points on the design where a fastener is not present. Noise source characteristics often originate from relatively close gaps in a design that are subjected to dynamic loads. Noise characteristics including buzz, squeak, rattle, and other phenomena involve complex impact, friction, and damping and other noise dissipation mechanisms. Among other inadequacies, the present art does not provide an analytical means or process to mathematically predict or evaluate noise source characteristics in an accurate and comprehensive manner. Industry is left with physical testing as the unfortunate primary option for evaluating noise characteristics.

Physical tests are both expensive and time consuming. Moreover, physical testing will often result in too little information, in too late a time frame. Since a physical test often requires the actual manufacture of many assemblies for testing, noise-based design changes can only be made in the later stages of the product development and design process when such changes are most expensive and least convenient with respect to the product development schedule. By that point in time, the manufacturer will have already invested significant time and effort in a design that is not sufficiently robust for production. Making matters worse, the evaluation of the re-designed assembly may also have to wait until a sufficient number of assemblies can be manufactured.

Time and expense issues aside, physical testing suffers from other significant limitations. Assemblies often involve a potentially voluminous number of parts and components. Noise sources at internal locations are often not externally audible or identifiable from the outside, and thus are difficult to identify. Several iterations of testing may be required before such characteristics can be identified with adequate specificity. This is especially true when conducting a physical test in actual conditions, such as a road test for automobiles. Problems and challenges relating to physical testing make an analytical solution desirable outside of the time and expense involved. It is desirable for a system or method to apply analytical intelligence to the prediction and evaluation of noise source characteristics including buzz, squeak, rattle, and/or other phenomenon in a real-time manner. It is also beneficial if certain critical locations with respect to noise source characteristics in a design may be isolated from less important non-critical locations with relative ease and speed. Such a system or method may be used for product development, especially in earlier stages, without compromising the timeline and cost.

Another weakness of physical testing is that physical tests may need to be repeated in order to identify the correct timeline for multiple different instances of noise source characteristics in the design of an assembly. An analytical approach capable of identifying a subset of key data points out of the potentially voluminous number of representative data points in a model may not require such repetition. Such a subset of key data points would include the locations in a design with the most significant noise characteristics. By limiting the noise evaluation to only a subset of points, noise source characteristics for a design can be evaluated in a real-time manner. It is also desirable if a noise source evaluation system or method is able to prioritize the analysis relating to noise source characteristics to identify those locations in the design with the most significant noise characteristics.

Reliance on physical testing also requires that a sufficient number of physical samples are tested in order to generate statistically significant data. This is both time consuming and expensive, and it magnifies the other difficulties associated with physical testing because such testing must be repeated numerous times. It is desirable for an analytical approach to replace the need for such extensive physical testing. An analytical solution may also provide useful insights to the critical points in a design so that when physical testing is necessary, it can be done as efficiently and inexpensively as possible.

Industry heavily depends on the computer-aided engineering tools using finite element solvers, finite element modelers, and finite element processors (collectively "finite element analyzers") for product development. The present invention recognizes the reliability, robustness, efficiency and cost-effectiveness of such a computational approach. It is desirable for a noise prediction system or method to interface with the cost-effective finite element analyzers, existing finite element models of assemblies, and other similar data and tools.

To the extent that noise characteristic analytical models exist in the current art, they do not provide a comprehensive analysis of noise characteristics as well as an analysis relating to the fasteners themselves. It is desirable for an analytical solution to provide comprehensive functionality with regards to predicting and evaluating sources of noise in a design. A fully automated and intelligent system is highly desirable to identify and resolve noise source characteristics and related issues in real-time. Structurally borne noise characteristics are ultimately generated at specific points or specific pairs of points. It may often be desirable for an analytical solution to have the capability of analyzing potential noise sources on a point-by-point or point-pair-by-pointpair basis, instead of being limited to using grids or other approaches. Building intelligence into a comprehensive and non-aggregated or overly generalized approach may also facilitate better and faster solutions.

SUMMARY OF INVENTION

The present invention relates to a method or system used to evaluate buzz, squeak, rattle, and/or other noise source characteristics (collectively "BSR source characteristics," "noise source characteristics," "BSR characteristics" or simply "noise characteristics") for an assembly of one or more components, with each component comprising one or more parts. The invention is capable of evaluating and predicting both present and future noise source characteristics relating to an analytical representation of an assembly, such as a finite element model. The invention does not require the existence of a physical assembly.

A model processing subsystem/process is used to input, modify, and/or create finite element models or some other analytical representation of a design. A point selection subsystem/process is used to identify a subset of representative data points for performing an evaluation of noise source characteristics. A point evaluation subsystem/process is used to evaluate one or more subsets of points with respect to noise source characteristics.

In a preferred embodiment of the invention, multiple finite element models or other analytical representations (collectively "finite element models") are used to represent an assembly. An original element model is preferably inputted in to the system, for example using a commercially available finite element analyzer. The original model can then be reformatted as needed to create an as-designed model, which generally represents the assembly before the wear and tear effects of usage affect the noise source characteristics of the assembly. A degraded or degenerated model represents the assembly after it is affected by the wear and tear of usage and time. A degraded model can be created by reducing the strength of the fasteners in the as-designed model to simulate the wear and tear of the assembly. The degraded model is used to determine the critical fastener(s) in a design, e.g., fasteners that will first experience degradation due to usage. The strength of these critical fasteners is enhanced to create a regenerated or restored model. The restored model represents the assembly where critical fasteners of the degraded model have been enhanced, revealing the fasteners with the next most significant effects. The system can identify as many or as few critical data points as the user desires, and the entire subset of representative data points can be ranked in terms of significant noise effects.

A point selection subsystem/process may be used to selectively identify a subset of data points from all of the representative data points in a model. Only a subset (or subsets) of selectively identified points is subject to analysis by the point evaluation subsystem. Further, the point selection process can be different for different types of noise characteristics. For example, a data point may constitute a buzz data point but not a squeak or rattle data point. In a preferred embodiment, squeak data points and rattle data points are identified in terms of data point pairs. Typically, all fastener locations are considered in the subset of representative data points for noise analysis, at least in terms of squeak and rattle. Fastener locations do not necessarily need to be evaluated in terms of buzz characteristics. Fasteners include but are not limited to bolts, welds, snaps, rivets, glue, screws, nails or any other type of connector or conventional means for fastening (collectively "fasteners").

Non-fastener locations can also be identified as belonging to the subset of representative data points for evaluation ("interesting points") on the basis of the natural modes and the gap distances between such points. Various geometric and mathematical heuristics can be used to limit the number of non-fastener locations selected for the subset of representative data points and subsequent analysis. In a preferred embodiment of the invention, a radial distance is compared to a predefined gap limit in order to determine whether or not a non-fastener locations constitutes squeak or rattle data point pairs. Generally the gaps between points will be incorporated into the process of determining which data points are interesting points.

A point evaluation subsystem or process is used to evaluate and predict the noise source characteristics at a particular data point or a particular data point pair within the subset of representative data points identified by the point selection subsystem. Displacements, velocities, force-response, and/or other characteristics at selectively identified data points or data point pairs are then used to determine or predict the noise source characteristics at these data points or data point pairs. Using such information, the invention generates propensity indices for noise source characteristics along with the appropriate or desired curves, pictures, and other representations of those noise source characteristics. The influence of environmental effects such as extreme thermal or moisture conditions, gravity, and other static load properties is incorporated into the noise evaluation. Geometric dimensioning and tolerance ("GD&T") issues can also be incorporated into the analysis in an effective manner. Noise source analysis can be carried out in both time and frequency domains, for e.g. as Fourier Fast Transformation can be effectively used to transform the fields between time and the frequency domain in the system.

The results of the noise source evaluations for all evaluated data points and data point pairs can be compared with each other, generating a list of one or more critical data points or critical data point pairs that are to be enhanced in the regenerated or restored model. "What if" analysis can be performed with regards to fastener selection and design, and to enhance those aspects of the design that are the least acceptable with respect to noise characteristics.

In a preferred embodiment of the invention, a graphical user interface allows the user to use the noise source predictor and the commercially available finite element solver in a transparent way. The invention may also utilize one or more databases to store information relating to the various models, data points and data point pairs selected for analysis and the noise source characteristics associated with the analyzed locations. The invention can also incorporate reporting and comparison functionality.

BRIEF DESCRIPTION OF THE DRAWINGS

FIG. 9a illustrates how standard bolt models are converted into a usable format.

FIG. 9c is a geometric diagram of the radial distance heuristic applied by the point selection subsystem to identify relevant data point pairs at non-fastener locations.

FIG. 10 is a geometric diagram illustrating how thickness and environmental effects impact the gap evaluation performed by the point evaluation subsystem.

FIG. 11 is a set of geometric diagrams illustrating how geometric dimensioning and tolerance effects impact the gap evaluation performed by the point evaluation subsystem.

DETAILED DESCRIPTION OF PREFERRED EMBODIMENTS

I. Overview of the Method and System

The inventive system and method (collectively "the system") provides the ability to evaluate and predict buzz, squeak, rattle, and/or other phenomenon (collectively "noise characteristics", "noise source characteristics", "BSR source characteristics", or "BSR characteristics") for a component or multi-part or multi-component assembly. Noise source characteristics generally relate to the propensity of buzz, squeak, rattle, or other noise phenomenon to originate from a particular location or source. The phrase "noise source characteristics" does not generally relate to the acoustical attributes of the noise itself. Use of the system does not require that an assembly physically exist, because the system uses analytical representations such as finite element models to represent the design of the assembly.

Generally, the system evaluates buzz characteristics by evaluating the energy loss occurring through structural damping that occurs in self-excitation. The system typically evaluates rattle characteristics by evaluating energy loss caused by the impact between parts. The system can evaluate squeak characteristics by evaluating the energy loss resulting from friction between parts that have been impacted. The system can also analyze attributes not related noise, such as the force response in critical fasteners, displacements caused by environmental and other causes, and geometric dimensioning and tolerance effects. Preferably, such characteristics are incorporated into the noise source analysis performed by the system.

A. Key Elements and Terminology

Figure 1:
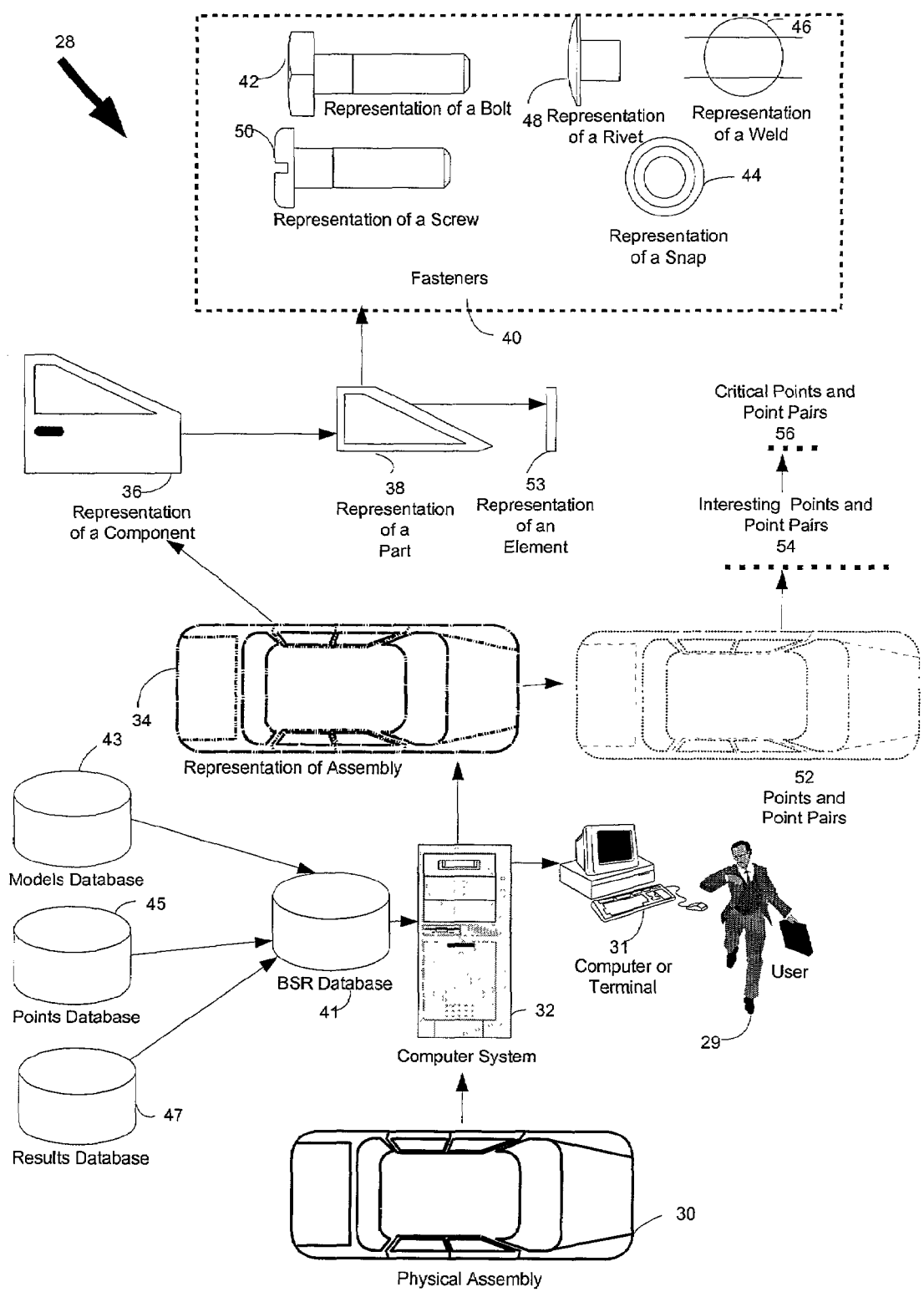
FIG. 1 is a partial environmental view of the invention, illustrating how the invention can incorporate analytical models representing physical objects, such as assemblies, components, parts, and fasteners.

FIG. 1 discloses a high-level view of a noise source prediction system 28, and some of the key elements processed by that system 28. The system 28 allows a user 29 to evaluate and predict BSR and other noise source characteristics and phenomenon relating to a design 34 representing a physical assembly 30. The user 29 interacts with the system 28 through the use of a computer or terminal 31. The computer 31 can be potentially any device capable of running software or communicating with a device capable of running software. Relevant information can be stored in one or more databases 41. In a preferred embodiment of the invention, a single object-oriented database is used to store relevant data. In alternative embodiments, multiple databases may be used, and such database schemes may be relational, hierarchical, or employ some other database methodology. If multiple databases are used, they system 28 will preferably include as a model database 43, a points database 45, and a results database 47, as generally described in greater detail below.

The system 28 preferably utilizes a computer system 32 to read, create, manipulate, or analyze an analytical representation of a design 34 of a physical assembly 30. In a preferred embodiment, the computer system 32 includes a work station networked to other work stations and personal computers, with another networked work station running a commercially available finite element solver, finite element modeler, or finite element processor (collectively "finite element analyzer") in tandem with the system 28. In alternative embodiments, the computer system 32 can be any type of stand-alone or networked computer or any other device capable of performing analysis similar to that of a finite element analyzer.

Like the physical assembly 30 it represents, a design 34 is comprised of one or more components 36, and components 36 are in turn comprised of one or more parts 38. Parts 38 and components 36 are attached to the assembly 30 by a fastener 50. A fastener 40 may comprise a bolt 42, a snap 44, a weld 46, a rivet 48, a screw 50, a portion of glue, a nail, or any other form of connector or means for fastening (collectively "fastener") that can attach a component 38 or part 36 to an assembly 30 of components 36 or parts 38.

In a typical finite element solver, each design 34 is comprised of data points 52 of varying significance, origin, and characteristics. Such representative data points 52 allow a finite element solver to evaluate the characteristics of a particular element 53 of a design 34. One or more elements 53 make up each part 38. Data points 52 can also be referred to as nodes or grids, representative data points, locations, or simply points. Data points 52 are usually geometric points describing each element domain completely in space. Thus, for example, a segment requires two points 52 to be completely defined, a triangle requires three points 52, quads require four points and a cube requires eight points, etc. In a preferred embodiment of the system, linear representations of all types of commercially available elements with finite number of vertices are supported. In alternative embodiments of the system, any other representation of the finite elements could be used. A subset 54 of representative data points 52 will be relevant (interesting points 54) for the purposes of noise analysis. Points within the subset 54 of data points can also be referred to as BSR data points, evaluation data points, interesting data points, selected data points, or some other similar description. Data points 52 that the system 28 determines may possess significant noise source characteristics are selected into a group of interesting data points 54 that are actually evaluated by the system 28. Each interesting point 54 may be analyzed by the system 28 in one or more different ways. For example, a buzz point is a point 52 that constitutes an interesting point 54 for the purposes of buzz analysis. That particular buzz point may or may not also be a squeak point, a rattle point, or an interesting point 54 in any other characteristic or aspect. A subset of interesting points 54 will be identified by the system as a critical data point 56 for the purposes of an evaluated characteristic, such as buzz, squeak, rattle, or other characteristic or phenomenon. Generally, the system 28 performs analysis on a point by point basis as it relates to buzz analysis and on data point pair by data point pair basis for other types of noise source analysis. The analysis is preferably performed by the system 28 in an automated manner requiring little or no user 29 interaction.

The system 28 does not require a physical assembly 30 and is not required to measure, manipulate, or otherwise physically interact with the attributes of the physical assembly 30. Rather the analysis and predictions are preferably generated from the design 34 of the physical assembly 30. The design 34 incorporates a mesh or finite element mesh as a set of contiguous elements arranged in a prescribed sequence to represent the physical structure, or at least a part of the physical structure, in an analytical domain. In finite element or other analysis, an element or finite element is the smallest subset of a part that retains finite element attributes. By evaluating the disembodied design 34 before the time, effort, and expense are incurred to manufacture a physical assembly 30, a user 29 of the system 28 can maximize the benefits of using a purely analytical system 28. In a preferred embodiment of the invention, the design 34 is inputted into the system from a conventional finite element analyzer such as NASTRAN. In alternative embodiments, the design 34 can be created or generated by the system 28 itself. Alternative embodiments may also utilize designs 34 that are not in the format of a finite element model.

For the purposes of this invention, parts 38, components 36, fasteners 40, points 52, interesting points 54, critical points 56, and other aspects of the design 34 are defined as constituting an analytical representation of the corresponding part, component, fastener, etc. For the purposes of defining this invention and its claims, the prefix "physical" will be used to identify any reference to the actual physical part, physical component, physical fastener, etc. Otherwise, any reference to an element, term, characteristic, or attribute that exists in both the physical assembly 30 and the disembodied design 34 of the assembly, refers generally to the disembodied design 34 or model of the assembly. Thus, the word fastener 40 is synonymous with fastener representation 40, bolt 42 with bolt representation 42, snap 44 with snap representation 44, weld 46 with weld representation 46, etc.

In a preferred embodiment, the system 28 utilizes a graphical user interface ("GUI"). The system 28 provides certain common tools and windows that can be used throughout the process of modeling, evaluating, and predicting characteristics of a design 34. In a preferred embodiment of the invention, the system 28 interfaces, preferably in a seamless manner, with a conventional finite element analyzer. In alternative embodiments of the invention, a finite element analyzer can be part of the system 28 itself, eliminating the need to interface the invention with a finite element analyzer.

A preferred embodiment may include a view tools window to provide the user 29 the ability to view the design 34 from many different perspectives, without modifying the substance of the model itself. In a preferred embodiment of the invention, the view tools window 62 behaves in a manner consistent with the way such functionality is provided by a conventional finite element analyzer. A "special tools" window may provide the user 29 with whatever interface controls are specifically required to perform functionality specifically relating to the current particular stage of processing. Different buttons may appear in the special tools window depending on the type of processing currently underway. A utility tools window can allow the user 29 to modify the substance of a design 34 or model; modify the display of a design 34 or model; and/or display special purpose objects that are not part of the model, including graphs of analysis, and other types of processing by the user 29. A main window can display specific information relating only to a single interesting point 54, or broad aggregate information relating to the entire design 34. A menu box can be included to allow the user 29 to control the flow of analysis and predictions made by the system 28. If the system 28 utilizes the functionality of a finite element solver, a menu box can be used to activate the interface between the system 28 and the finite element solver.

In a preferred embodiment, fasteners 40 are represented by particular shapes in the system 28. A bolt 42 is preferably represented by a rigid web connecting multiple parts 38 with at least one point or node 52 not attached to any part 38 with each part having a hole filled by rigid web. Preferably, a snap 44 is represented by an elastic spring element. Similarly, a weld 46 may be represented by rigid elements connecting parts 38 individually or a rigid chain connecting multiple parts with every point 52 or node attached to a part 38. In alternative embodiments of the system 28, fasteners 40 can be represented in any other forms of 1-, 2- and 3-dimensional rigid and elastic elements as well as multi-point constraints. Bolts 42 may also be represented using rigid elements. Other fasteners 40 can be represented by combinations of rigid and spring elements, or from other derivations of elements. In a preferred embodiment of the invention, welds 46 can be identified as rigid chains with the number of nodes 52 equal to the number of parts 38 attached. Bolts 42 can be identified as rigid chains with at least one node not attached to any part. Each weld 46 chain can be remodeled with a separate force recoverable rigid element. Each bolt 42 chain may be remodeled with rigid webs for each part connected by separate force recoverable rigid elements along the non-part nodes.

B. Three Primary Model Types

Figure 2:
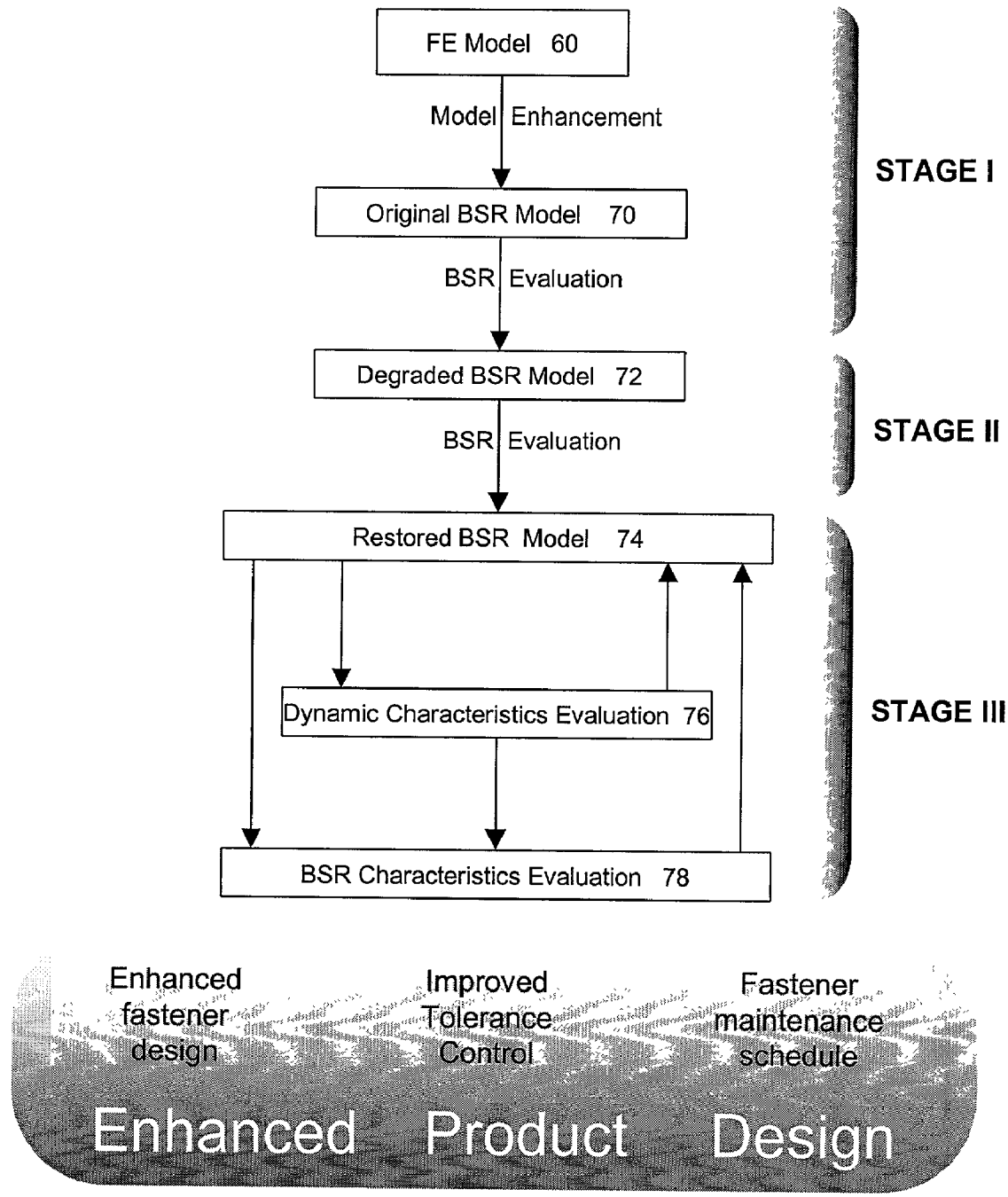
FIG. 2 is a high-level flow chart illustrating how a preferred embodiment of the invention processes information in three stages to evaluate BSR characteristics.

FIG. 2 discloses a high-level flowchart illustrating three preferred and typically distinct stages and models used by the system 28 to evaluate noise characteristics.

1. As-designed Model

The Stage I process begins with a finite element model 68 or some other analytical representation 34 of a physical assembly 30. The model 68 can either be inputted from an outside source such as a finite element analyzer, or in alternative embodiments, can be created directly by the system 28. The newly inputted or created model at 68 may be cleaned and enhanced so that fasteners 40 may be defined in format that allows the system 28 to perform a comprehensive analysis. The cleaning and enhancement process is described in greater detail below. The enhanced model can then be saved in a database of models ("models database") 43 as an as-designed model 70. An as-designed model can also be referred to as an enhanced model 70 or an original model 70. The as-designed model 70 represents the physical and structural characteristics of the physical assembly 30 at the time that the physical assembly 30 is first manufactured. The as-designed model 70 represents the physical assembly 30 before the wear and tear of use and time alter the characteristics of the physical assembly 30. The process of creating an as-designed model 70 is described in greater detail below. The as-designed model 70 is used to create a degenerated model 72 as generally described below.

2. Degraded Model

The as-designed model 70 is evaluated by the system 28, and can then used to generate a degraded model 72 in Stage II. The degraded model 72 may also be referred to as a degenerated model 72, or an aged model 72. The degraded model 72 represents the design 34 of the physical assembly 30 after the physical assembly 30 has aged or has been subjected to the wear or tear of use. The impacts of "age" and "use" on a physical assembly 30 can be represented by "loosening"/weakening fasteners 40.

To create the degraded model 72, the system 28 may "loosen" bolts 42 in the in-plane rotation degree of freedom (deteriorating the torque retention capability of the bolts 42), and snaps 44 may be weakened to a prescribed fraction of their stiffness (e.g., half strength in a preferred embodiment). Degrees of freedom ("DOF") refer to the number of potential directions, both translational and rotational, in which a structure is allowed to move or deform in space. By "aging" the model, the system 28 can determine which interesting points 54 will ultimately result in the least favorable characteristics or BSR phenomenon, identifying a small group of interesting points 54 as critical points 56. By identifying critical points 56, those data points of the most severe buzz, squeak, rattle, and/or other characteristics, the system 28 facilitates the ability to a user 29 to maximize the impact of a single design 34, component 36, part 38, or fastener 40 change at the critical points 56. Enhancements made at critical points 56 of a design 34 may substantially reduce or eliminate unfavorable characteristics and potentially lengthen the life expectancy of the physical assembly 30. In a preferred embodiment, the system 28 identifies one critical buzz point, one pair of critical squeak points, and one pair of critical rattle points. The degenerated model 72 allows the system 28 to evaluate the wear and tear effects of "aging" and "use" on the design 34. The process of creating a degraded model 72 is described in greater detail below. The BSR characteristics of the as-designed model 70 and the degraded model 72 are used to create a restored model 74.

3. Restored Model

After the degraded model is evaluated at 72 and a subset of critical points 56 have been identified from the group of interesting points 54, a restored model 74 is created in Stage III by restoring specific characteristics or fasteners 40 back to their original status. For example, but without limitation, critical bolts (bolts 42 located at critical points 56) may be set back to their original condition and critical snaps (snaps 44 located at critical points 56) may be strengthened to their original stiffness. Analysis from the as-designed model 70 can also be incorporated to determine critical points 56. By strengthening the resilience of a design 34 against BSR and other characteristics at the weakest points (the critical points 56) of a design 34, the overall desirability of a particular design 34 and ultimately physical assembly 30, can be substantially enhanced.

The restored model 74 can also be referred to as a regenerated model 74. Many different characteristics of the restored model 74 can be evaluated, including dynamic characteristics 76, BSR characteristics 78, and any other characteristics. The restored model 74 is discussed in greater detail below. By restoring critical points 56 of the degraded model 72, the restored model 74 allows the system to identify the second-most important interesting points 54 in terms of severe noise source characteristics. The iterative process can be continued until the dynamic characteristics of the restored model match with that of the original model to the extent dictated by the user 29.

C. Three Primary Subsystems

1. Model Processing Subsystem

Figure 3:
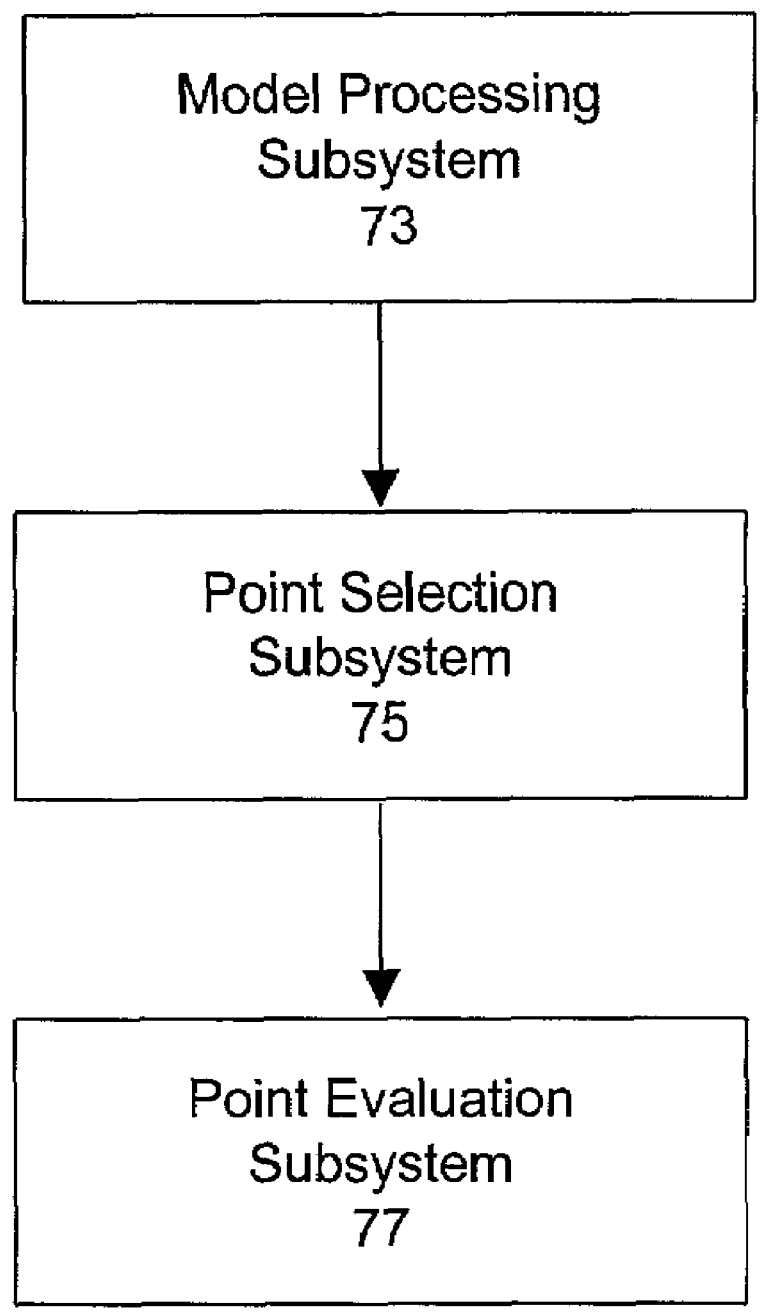
FIG. 3 is a high-level flow chart illustrating the three high-level subsystems of the invention, model creation, point selection, and point evaluation.

FIG. 3 discloses the three primary subsystems used by the evaluation and prediction system 28. A model processing subsystem 73 generates, manipulates, and/or saves design information, in all of the various models supported by the system 28. Model attributes may include any information relating to a model. All model information to be saved may be saved on a model database 43. The processes relating to the model processing subsystem 73 are described in greater detail below.

2. Point Selection Subsystem

A point selection subsystem 75 selectively determines which points 52 or point pairs in a particular design 34 constitute interesting points 54 with respect to BSR and/or other noise characteristics. The point selection subsystem 75 uses various point selection subroutines or heuristics to determine which points 52 constitute interesting points 54. All interesting points 54 may be saved on a points database 45. The processes relating to the point selection subsystem 75 are described in greater detail below. A preferred point selection subsystem 75 includes a read natural modes module, a create BSR point data module, and a BSR point map module, as discussed in greater detail below. In a preferred embodiment of the invention, the point selection subsystem 75 can further eliminate interesting points 54 from consideration if the underlying noise parameter at a point 52 or point pair 52 is less than a particular predetermined percentage, such as 1% of the maximum in the category. The user 29 may specify the predetermined percentage.

3. Point Evaluation Subsystem

A point evaluation subsystem 77 analyzes each interesting point 54 with respect to one or more characteristics, including buzz, squeak, rattle, dynamic, environmental, geometric dimensioning and tolerance, and other characteristics (collectively "characteristics"). The point evaluation subsystem 77 utilizes various point evaluation heuristics to evaluate and predict characteristics. All point characteristics and analysis are saved on a results database 47. Preferably, the point selection subsystem 77 includes a read dynamic response module, a gap evaluation module, an environmental effects module, a geometric dimensioning and tolerance effects module, a buzz evaluation module, a rattle evaluation module, a squeak evaluation module, a bolt evaluation module, a snap evaluation module, and a display results module, as generally described in greater detail below.

D. Overall Process Flow

Figure 4:
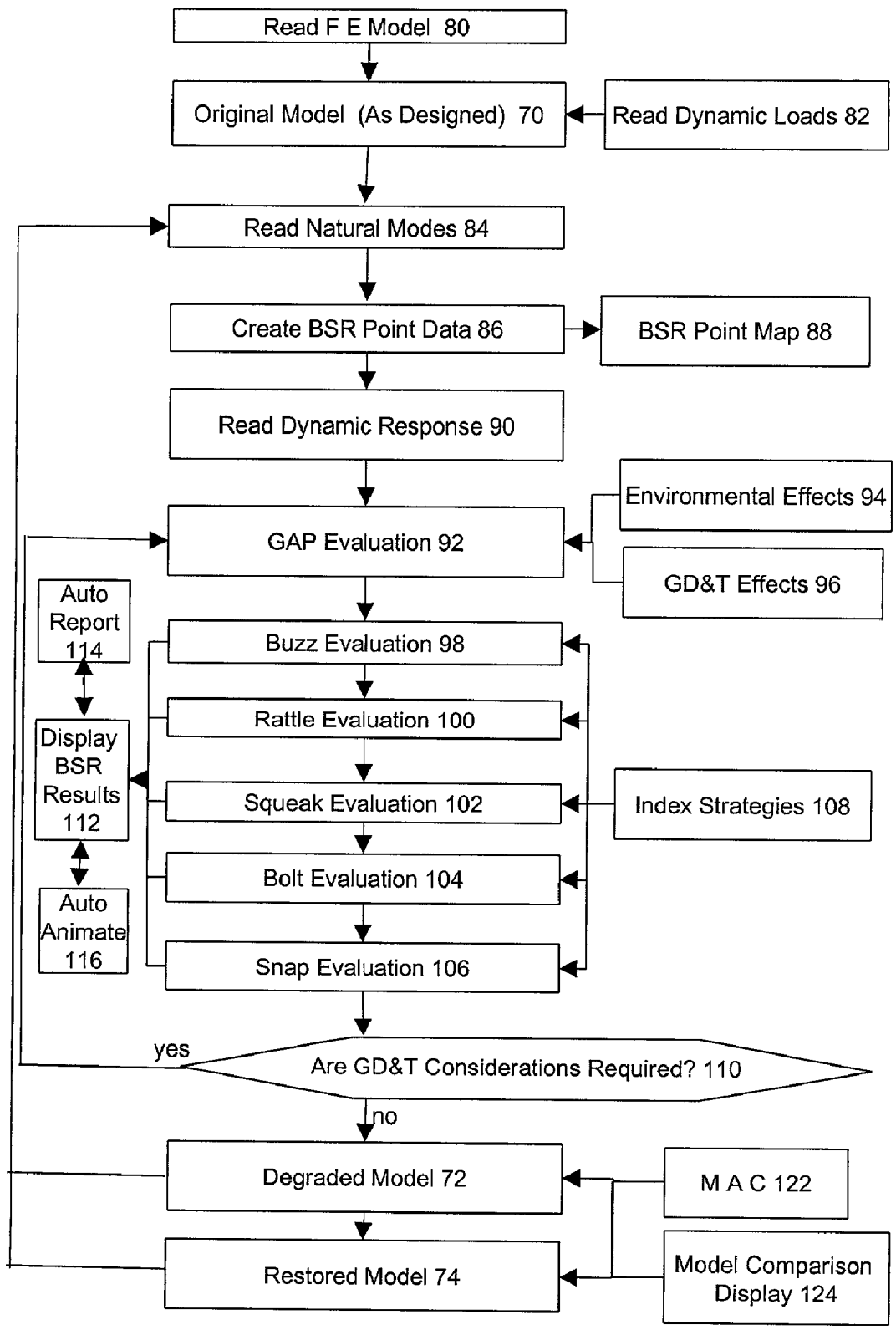
FIG. 4 is a flow chart illustrating the some of the functionality of the invention, and some of the modules used by the invention.

FIG. 4 discloses some of the primary functional modules of the system 28. Each of those modules is generally illustrated in greater detail in subsequently referred to figures and descriptions. Arrows generally indicate the flow of processing between the modules. Some modules (such as an environmental effects module at 94) have no arrows pointing toward the module and with just an arrow leading away. Such modules are optional support modules which may have their results incorporated into the system 28 in accordance with processing flow between modules. In a preferred embodiment of the invention, a module beginning with the word "read" involves inputting or reading data from a conventional available finite element analyzer. In alternative embodiments of the system 28, function preferably performed outside the system 28 can be performed by the system 28 itself. Moreover, the system 28 can utilize any analytical representation of a design 34, and is not limited to finite element representations.

A read finite element module 80 may be used to input a finite element model 68 of a design 34 into the system 28. In a preferred embodiment of the invention, the initial finite element model 68 (as well as the structural solution for the model) is extracted by a conventional finite element analyzer. In an alternative embodiment of the invention, the system 28 itself incorporates a full-fledged finite element analyzer and that part of the system 28 is then used to create the initial finite element model 68 as well as the finite element solutions.

The inputted model 68 can be "cleaned" and enhanced so that fasteners 40 can be represented in a format that allows the system 28 to conduct further processing and analysis. The "cleaned" model is then saved as the as-designed model 70, which can also be called an original model 70 or an enhanced model 70. If dynamic load information is available or desired, a dynamic load module 82 can input such information, and incorporate the dynamic loads into the system 28 so that the information fully incorporated into the as-designed model 70 as well as the other alternative models.

The next step in the process involves a reading of natural modes module 84, a process that is ultimately performed on the as-designed model 70, the degraded model 72, and the restored model 74. Modes are generalized deformation shapes when referring to an eigen-solution or natural mode. Modes are actual deformation shapes when referring to forced response of the model. In a preferred embodiment of the invention, the user 29 determines how many different modes will be supported by the system 28. The system 28 allows the user 29 to perform a vibration analysis (linear normal mode analysis) to generate a normal mode shape solution. The natural modes can then be utilized by a module for creating BSR point data 86. The create-BSR point data module 86 uses a point selection heuristic or subroutine to identify a subset of interesting points 54 from all of the representative data points 52 in the design 34. Interesting points 54 are those points that the system 28 has determined require analysis for the purposes of BSR phenomenon and/or other characteristics. Interesting points 54 include buzz points, squeak points, rattle points, fastener points, and any other type of points 52 relating to characteristics evaluated by the system 28. A BSR point map module 88 may then be invoked to display the interesting points 54 relating to bolts 42, welds 46, snaps 44, or any other type of fastener 40. Buzz points, squeak points, rattle points, or other points related to a characteristic tracked by the system 28 and can be viewed by a user 29 through the BSR point map module 88.

A read dynamic response module 90 is then invoked. In a preferred embodiment of the invention, the dynamic response can be inputted from an outside source although the parameters for the inputted data are typically set in the system 28 by the user 29. In alternative embodiments of the invention, dynamic response data can be generated from within the system 28 itself. Dynamic responses include displacement responses, force responses, and other physical attributes used by the system 28 to evaluate and predict characteristics.

A gap evaluation module 92 is then utilized to determine the distance between pairs of interesting points 54 or nodes. The system 28 can utilize the projected distance between two nodes 54 as the final condition for identifying the spatial relationship for potential rattle and squeak characteristics. Gap calculations can be based on the assumption that the parts are modeled in their mid-surfaces. The system 28 can identify modeling errors while computing the initial gap when the parts 38 are not modeled at the mid-surface. The system 28 can then automatically correct the initial gap for the purposes of the gap calculation. The gap between two nodes, e.g. the gap between a pair of data points, may be affected by environmental conditions or simply by geometric dimensioning and tolerance effects. An environmental effects module 94 may incorporate environmental effects such as thermal, gravitational, and other deformations into the gap evaluation module 92. A geometric dimensioning and tolerance effects module 96 may incorporate geometric dimensioning and tolerance effects in the gap evaluation module 92.

A noise source characteristic generally evaluated by the system 28 is buzz. A buzz evaluation module 98 uses a dynamic forced frequency displacement to evaluate buzz at each of the pre-determined buzz points. Buzz points consist of individual representative data points 52 that the system determined constitute interesting points 54 for the purposes of buzz characteristics. Generally, all frequency domain displacement components are transformed into a time domain using a Fast Fourier transformation. The translational displacement components are added vectorially at each time step to compute the buzz curve for each buzz point. The results of the buzz evaluations are indexed by an index strategies module 108. In a preferred embodiment of the invention, the absolute integral of the buzz curve over the time period is considered the default buzz propensity index. Such a default index can be changed by the user 29. Alternative buzz propensity indexes can include the maximum magnitude of the buzz curve, a weighted average of the absolute integral of the buzz curve and the maximum magnitude of the buzz curve, or any other measurement or heuristic/subroutine that can be used to rank the severity of a buzz characteristic in a design 34.

After completing the buzz evaluation, the system 28 invokes a rattle evaluation module 100. Rattle is evaluated using the dynamic forced frequency deflection response (the projected displacement component along the node-pair axis) at predetermined rattle pairs to compute rattle curves. Rattle pairs, which can also be called rattle points, consist of data point pairs 52 that are selectively identified as interesting points 54 for the purposes of rattle characteristics. Generally, all frequency domain displacement components can be transformed into a time domain using a Fast Fourier transformation. Rattle curves can be subject to indexing by the index strategies module 108. Rattle indexes can include loss of energy, loss of momentum, other physical attributes, and/or a weighted combination of two or more physical attributes.

A squeak evaluation subsystem or module 102 can use rattle characteristics computed at 100 and the gap characteristics calculated at 92 to determine rotational and/or translational squeak characteristics. Some interesting squeak points 54 (e.g. the set of potentially critical squeak points), can be eliminated from consideration as potential critical squeak points 56 because squeaking at those locations would not be physically possible. The in-plane translational displacement is used to calculate translational squeak characteristics and the in-plane rotational displacement is used to calculate rotational squeak characteristics. Squeak characteristics are evaluated for each squeak pair, which can also be called squeak points. Squeak pairs consist of data point pairs 52 that are selectively identified as interesting points 54 for the purposes of squeak analysis. In a preferred embodiment, all frequency domain displacement components can be transformed into a time domain using a Fast Fourier transformation. Squeak characteristics are subject to indexing by the index strategies module 108, which will rank squeak points on the basis of the area of interference between the two squeak curves, the maximum interference between the two squeak curves, some other characteristic, or a weighted combination of two or more squeak indexes.

A bolt evaluation module 104 can be invoked to identify critical bolts. In a preferred embodiment, all frequency domain force components can be transformed into a time domain using a Fast Fourier transformation. Bolt stress is calculated from force components, such as using a standard three-dimensional Von Mises stress definition in a prescribed diameter for each bolt. Each bolt point may be subject to the index strategies module 108 which ranks bolt points in terms of a Von Mises stress-equivalent, torque, other characteristics, or a weighted combination of two or more indices.

A snap evaluation module 106 can be used to identify critical snaps. In a preferred embodiment, all frequency domain displacement components can be transformed into a time domain using a Fast Fourier transformation. Snap forces can be computed as the differential displacement between two snap points and the associated snap stiffness in the corresponding direction at every time step. The effective snap force may be computed from the force components, such as by using the standard 3-D Von Mises equivalent force definition. Snap characteristics can be subject to the index strategies module 108 which can rank snaps by an absolute integral about the mean response, or other heuristics/subroutines.

The system 28 can determine if geometric dimensioning and tolerance ("GD&T") effects are desirable at 110. GD&T information can be provided from a separate Variation Simulation Analysis ("VSA") at critical locations to enhance the quality of the rattle predictions. If desirable, and if the system 28 has not already done so, the GD&T effects module 96 can be invoked, and the system 28 can redo the processing of the model beginning with the gap evaluation module 92.

If desired, the user 29 can invoke a display results module 112 generally after any of the evaluation modules performs processing. In a preferred embodiment, display results are influenced by three parameters: (1) evaluation type such as buzz, squeak, rattle, or some other characteristic; (2) point type such as buzz points, bolt points, snap points, non-fastener squeak-rattle points, or some other point type; and (3) presentation style such as rank, participation, report, time history, magnitude phase, real/imaginary, organ plots, animation, or some other presentation style. An auto report module 114 can be used to set or generate default reports and displays, although a user 29 is free to override or change such defaults. An auto animate module 116 allows a user 29 to actually view the model generating the noise or other characteristic in a cinematic matter.

If GD&T effects have already been incorporated, or are not required, available, or desirable, then the system 28 can invoke a degraded model module 72. The as-designed model 70 is degraded by degrading the fasteners 40 in the model 70. The rigid elements associated with critical bolts from the bolt evaluation module 104 and other fasteners 40 are modified to reflect loss of torque retention by releasing the in-plane rotation degree of freedom. Snaps 44 can be weakened to a prescribed fraction of their stiffness. The degraded model 72 can be subjected to the loop of processing beginning with the gap evaluation module 92 through the snap evaluation module 106, and the determination at 110 of whether GD&T considerations need to be added. A modal assurance criteria module 122 can be used to compare the dynamic characteristics of the as-designed model 70 with the degenerated model 72 and track the modes of the as-designed model 70 in the degraded model 72. The user 29 can direct the system 28 to create a restored model 74 from the degraded model 72.

The degraded model at 72 can be used to generate a restored model 74. In a restored model 74, fasteners 40 are structurally restored, for instance, with no loss of torque retention in bolts and no degradation in stiffness for snaps. The restored model 74 can then be subjected to the analysis loop previously performed on both the as-designed model 70 and the degraded model 72, from the gap evaluation module 92 through to the snap evaluation module 106, and the determination at 110 of whether GD&T considerations should be added.

If desired, a modal assurance criteria module 122 can be used to compare the dynamic characteristics of any two models. A model comparison display module 124 can provide a graphical presentation of the model to model comparison. The system 28 preferably provides a generic tool for comparing mode shapes of two different but comparable models to establish a frequency correlation between the two models. Models can be compared in numerous different ways. Each of the modules discussed in this section are described in greater detail below.

II. Detailed Description of Preferred Modules

A. Read Initial Finite Element Model

In a preferred embodiment of the invention, the system 28 interfaces with a conventional finite element analyzer that can export the finite element model 68 into the system 28. In alternative embodiments, the system 28 itself creates the model.

The system 28 can use a GUI to allow users 29 to select model files to input into the system 28. In a preferred embodiment, input files can be in either an ASCII or binary format since those are the file formats generally used by conventional finite element analyzers. However, a wide variety of other formats can be used, including virtually any format capable of supporting a finite element or other analytical model 68 of an assembly 30. The inputted model 68 can be saved in the models database 43 so it can be reused at any time in the form that it was initially received by the system 28.

Figure 5:
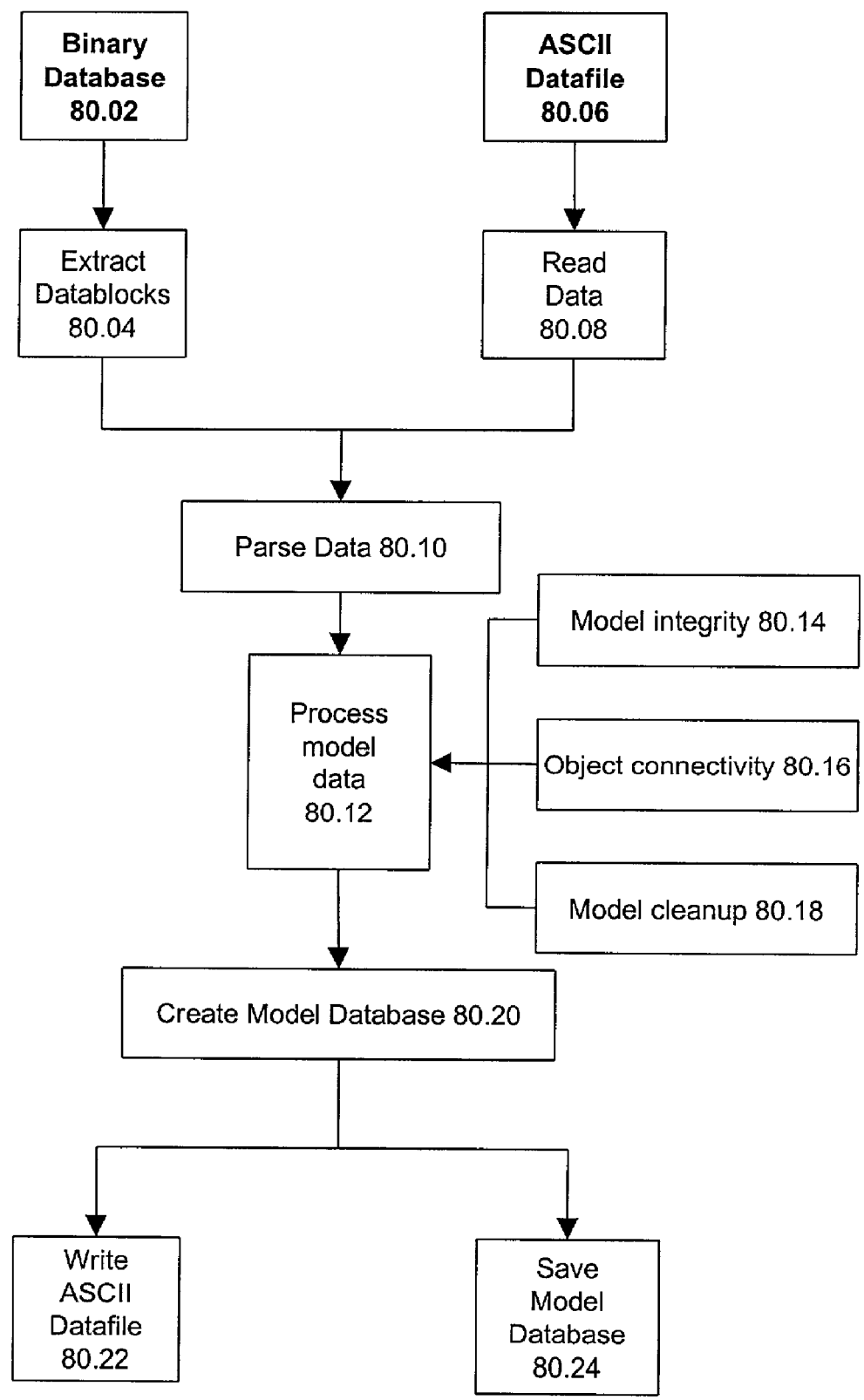
FIG. 5 is a flow chart of a model input module, through which finite element models can be directly inputted into the inventive system.

FIG. 5 shows the typical steps involved in the input/output operations of the system 28. If the input source is a binary database at 80.02, data blocks can be extracted at 80.04 so that data can be parsed at 80.10. If the input source is an ASCII data file at 80.06, the data can be read at 80.08 to facilitate the parsing of the data at 80.10. The processing of model data at 80.12 may require that the data be parsed at 80.10. Model integrity can be confirmed at 80.14. Confirmation of model integrity at 80.14 involves determining whether the model is consistent in its object definitions. Object connectivity can be facilitated at 80.16. This involves storing the interdependency of objects. In a preferred embodiment, the dependency of each and every object relating to any of the other objects participating in the model description supported by the system 28 should be stored. This may also involve storing information relating to the participation of each "object" in the description of any other object in the model description supported by the system 28. In a preferred embodiment, object-oriented programming techniques are used to build the system 28, and all databases 41 are similarly object-oriented. The relations used to connect or relate objects to other objects can be stored at 80.16.

Model cleanup can be performed at 80.18. Model cleanup 80.18 may involve making sure that fastener representations 40 in the system 28 are in a format that allows the system 28 to accurately process and evaluate noise source and other characteristics. Commercially available finite element analyzers may permit fastener representation 40 formats that preclude effective analysis by the system 28. The process of converting standard fastener representations 40 into formats usable by the system 28 is described in greater detail below and in FIGS. 8a, 8b, 9a, and 9b.

When the system 28 has completed any prerequisites to facilitate the processing of model data at 80.12, database entries representing the model can be created at 80.20 and saved at 80.24. A models database 43 can be used to store information relating to each and every model in the system 28, including the original finite element model 68 inputted into the system as well as the as-designed model 70 derived from the inputted model. In a preferred embodiment of the invention, the model database 43, a point database 45, and a results database 47 are part of the same system-wide database 41. Preferably, all databases are object-oriented databases. However, the system 28 is not so limited and can utilize other forms of databases. In addition to storing model information on a model database, model information can also be stored on an ASCII datafile that can be created at 80.22. ASCII files can be used to enhance the exchange of data between the system 28 and a conventional finite element analyzer.

B. Create Model

The system 28 can automatically identify fasteners 40 and rigid chains to isolate the rigid elements representing the fasteners 40, such as bolts 42, welds 46, snaps 44, glue, rivets 48, screws 50 and other connectors and fasteners 40. In a preferred embodiment of the invention, bolts 42 are identified with the rigid webs connecting multiple parts 38 with at least one node 52 (a node is a pair of points 52) not attached to any part 38 and each part 38 having a hole filled by a rigid web. Snaps 44 may be identified with elastic or spring elements. In alternative embodiments, a fastener 40 can be graphically represented in any number of different ways, and consistency with finite element analyzers is desirable.

Model cleanup at 80.18 can be an important process in creating the as-designed model 70. Finite element analyzers may permit fasteners 40 and other rigid elements to be attached to a representation an assembly 34 in ways that defeat the realistic intentions of the design (e.g. a bolt is attached to a surface at a 5 degree angle instead of a 90 degree angle or "normal"), and in ways that could defeat the ability of the system 28 to effectively evaluate noise source characteristics. The system 28 can "clean" such references and elements before a meaningful analysis is conducted. The normality of the identified fasteners 40 and rigid elements with reference to the attaching parts 38 can be evaluated to assess the quality of their representation in the model 70. The associated nodes 52 and elements 53 can be manipulated to make the fasteners 40 and rigid elements as normal as possible (90-degree angle) to all the associated parts 38. The system 24 may clean and modify the original inputted model 68 for consistent and correct fastener 40 and rigid modeling. The average location and normal vector can be computed for each bolt 42 and weld 46. Nodes 52 associated with a bolt 42 or weld 46 can be moved in their respective part planes to align themselves along the average normal vector. If the node movement is not acceptable from the neighborhood element size point of view, the neighborhood elements can be appropriately split to accommodate a new grid location at the average normal alignment. Bolt 42 and weld 46 elements can then be re-chained to represent the part stack-up in proper sequence with reference to the average grid location.

The system 28 can then save the an enhanced finite element model 70, which can also be called the as-designed model 70, for further analysis. The as-designed model 70 is stored as part of the models database 43. The cleaning process and other changes made to the original model 68 in creating the as-designed model 70 will not alter the dynamic characteristics of the assembly 34.

Figure 6:
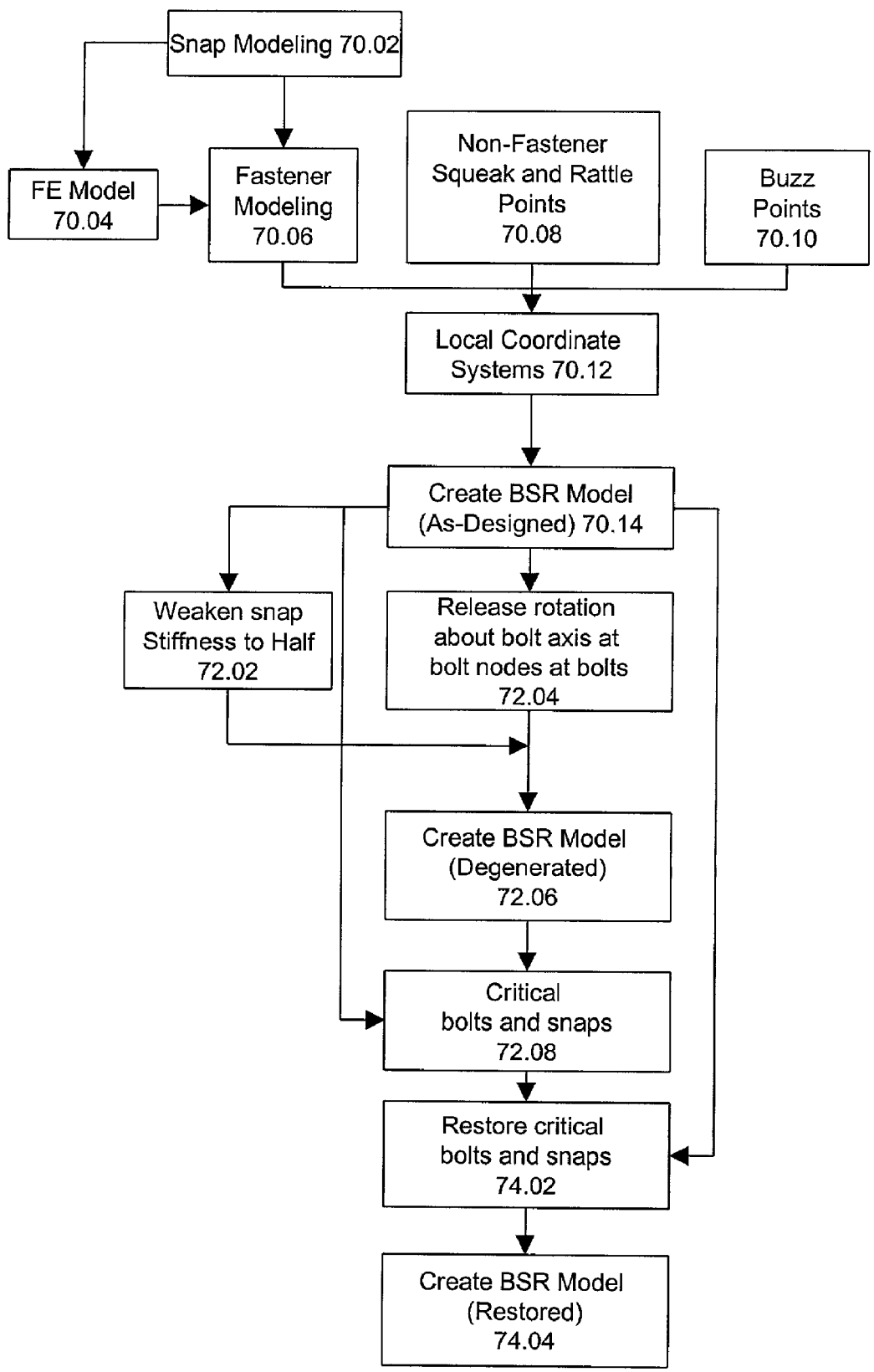
FIG. 6 is flow chart of how the model generation module creates as-designed, degraded, and restored models.
Figure 9B:
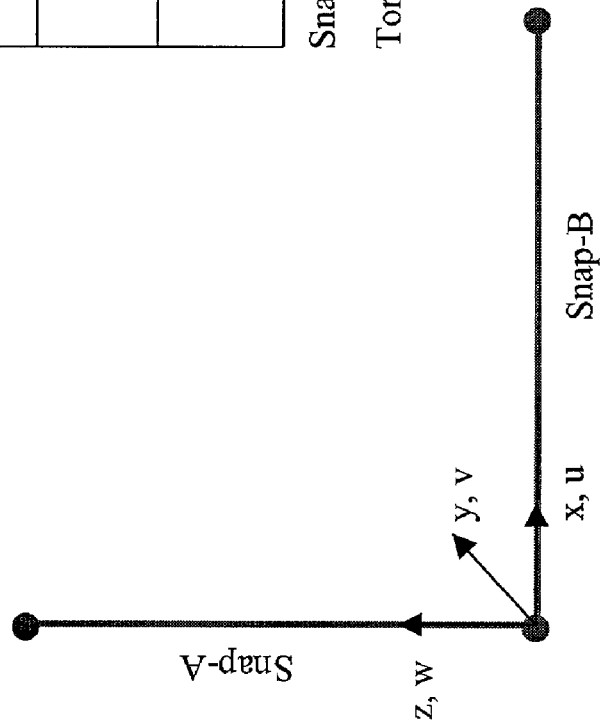
FIG. 9b illustrates how standard snap models are converted into a usable format.

FIG. 6 shows the different steps that can be involved in creating the as-designed model 70, the degraded model 72, and the restored model 74. A finite element model 68 can be inputted at 70.04. The steps of snap modeling at 70.02 and fastener modeling 70.06 relate to the process of model cleanup as generally described in greater detail both above and below. Snap modeling 70.02 as illustrated in FIG. 9b can be enhanced as necessary. Fastener modeling 70.06 as illustrated in FIG. 9a can also be enhanced as necessary.

Non-fastener squeak and rattle points 70.08 and buzz points 70.10 can also be identified during the process of model creation. The system 28 can invoke the model processing subsystem 73 at the same time in which the point selection subsystem 75 is invoked. Point selection is described in greater detail below. The generation of local coordinate systems at 70.12 may require that buzz points 70.10, non-fastener squeak and rattle points 70.08 and all fastener locations 70.06 are already identified. The as-designed model 70 can be created at 70.14.

To create a degraded or degenerated model 72 from the as-designed model, snap stiffness can be weakened by a predetermined metric (e.g., 50% in a preferred embodiment) at 72.02 for snaps 44 and the torque for bolts 42 can be reduced as generally described in greater detail above. The reduction in torque for all bolts 42 can simulate the loosening of the bolt 42. Critical bolts 42 and snaps 44 can then be identified at 72.08, and restored at 74.02. The model with critical bolts and/or snaps restored is saved as the restored model at 74.04.

C. Read Dynamic Loads

In a preferred embodiment of the invention, the system 28 provides an optional GUI for the user 29 to generate dynamic load information based on specified load profiles either inputted as entire files into the system 28, or inputted as individual data fields by a user 29 using a keyboard or similar device. Individual data fields for inputted files are preferably subject to modification even if inputted from a file.

Figure 7:
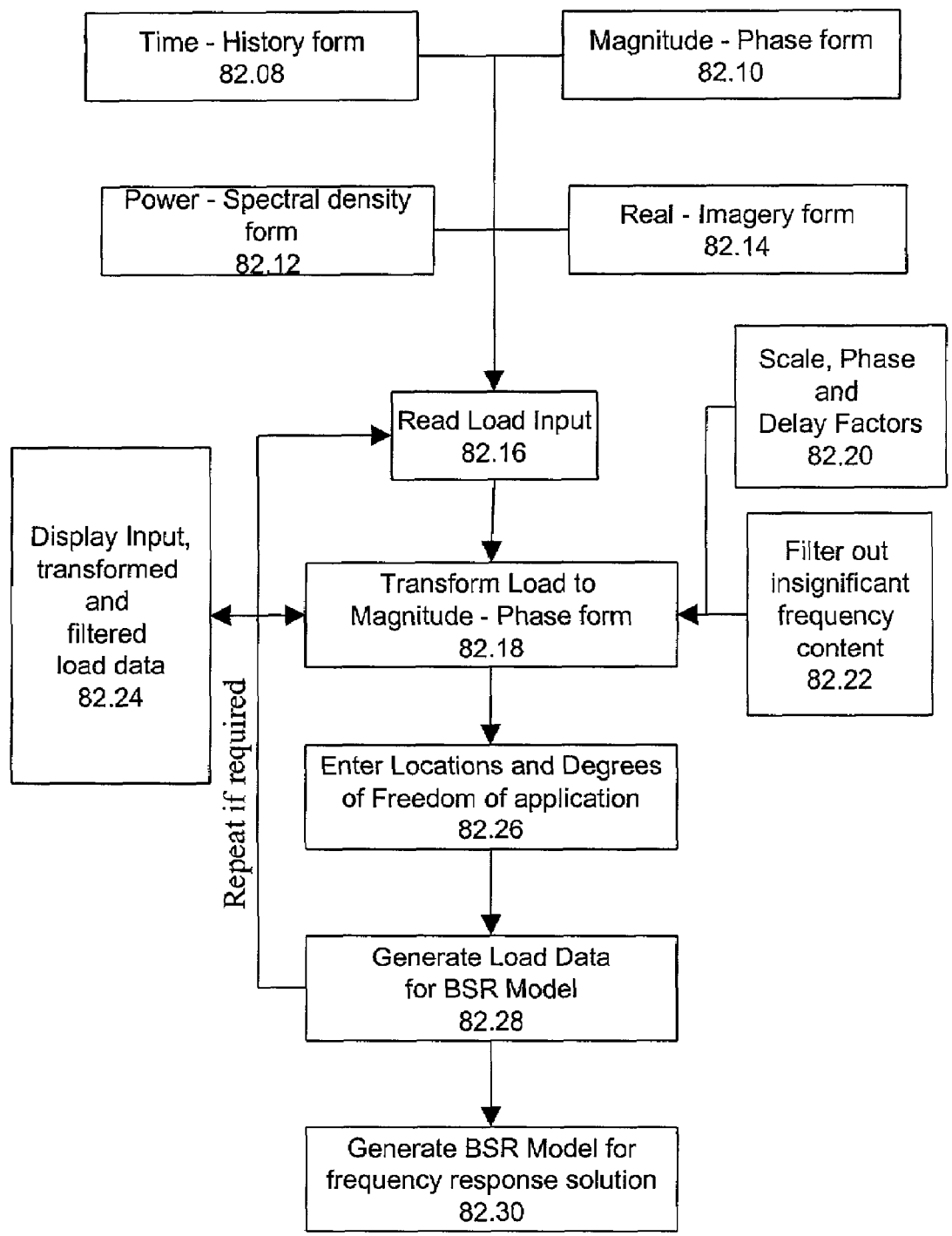
FIG. 7 is a flow chart of the dynamic load data module.

FIG. 7 shows a flowchart of the dynamic load data management module 82. The input load profiles can be in any standard format, including but not limited to such formats as time history at 82.08, magnitude-phase 82.10, real-imaginary 82.14, or power spectral density functions 82.12. Single point (shaker) or multiple point excitation can also be considered and evaluated. Additional non-standard formats can also be incorporated into the system 28. Input, regardless of the format, may be read at 82.16. A built-in domain transformation algorithm based on a Fast Fourier transformation ("FFT") or other methodology can be used to convert the input from the time domain into the frequency domain, and vice versa. In a preferred embodiment of the system 28, the finite element solution to the model is sought in the frequency domain in magnitude-phase form. In alternative embodiments of the system 28, other forms of frequency domain solution as well as solutions in other domains (such as time domain) can be employed. A load can be transformed to a magnitude-phase form at 82.18. Scale, phase, and delay factors can be incorporated at 82.20. Insignificant frequency content can be filtered out at 82.22. The input and transformed and filtered load data can be displayed at 82.24, if the user 29 desires to do so. The GUI allows the user 29 to filter any load profile as well as to edit different load parameters. The GUI can also provide the ability to visualize the input load in the original form as well as the original and filtered load in other forms.

Locations and degree of freedom ("DOF") information can be entered at 82.26. Load data for a model (either as-designed 70, degraded 72, or restored 74) can be generated at 82.28. The corresponding model for a frequency response solution may be generated at 82.30. The model database 43 can be used to "save" all of the inputted data in the form of a model incorporating the inputted data.

The loop from reading load input at 82.16 through generating load data for a model at 82.28 can be repeated as desired by the user 29 to ensure that meaningful data is incorporated into the system 28.

D. Read Natural Modes

Preferably, the read natural modes module 84 is part of the point selection subsystem 75. Modes are deformation shapes, and in a preferred embodiment of the invention, the user 29 can determine how many different modes the system 28 will support. Modes can be used to determine which of the vast number of representative data points 52 are interesting points 54 with respect to noise source characteristics and related analyses. The system 28 can use intelligence incorporated in the way that structures tend to deform, in order to focus attention on those points (interesting points 54) most likely to result in BSR and other noise characteristics. Thus, an analysis of natural modes can be important to the point selection process for each model, and each model can be subject to processing by this module 84. The model under consideration by the system 28 (either as-designed 70, degraded 72, or restored 74 depending on whether the system 28 is in Stage-I, Stage-II, or Stage-III) can be used for generating a solution, e.g., an Eigen value solution. In alternative embodiments, excitation frequencies or other characteristics can be used in place of Eigen frequencies. The user 29 can be required to perform linear normal mode analysis (e.g., free-vibration or eigen-value analysis) and generate a normal mode shape solution using a conventional finite element analyzer. The system 28 may then process the natural mode shapes for the model and update the results database 47. In a preferred embodiment of the invention, a Graphical User Interface ("GUI") can be used for selecting the Eigen value results file, which may be in an ASCII, binary, or some other desired format.

E. Generate Subset of Representative Data Points

A preferred module in the point generation subsystem 75 is a module for generating a subset of representative data points 86. All three primary model types can be subject to processing by this module 86, although there are some differences between how the various models are processed. For example, in a preferred embodiment of the invention, fasteners 40 typically are not considered squeak or rattle points in the as-designed model 70 because it is generally presumed that such fasteners 40 are sufficiently tight when an assembly 30 is first manufactured.

As discussed above and disclosed in FIG. 6, there are three general categories of representative data points in a preferred embodiment that are selectively identified by the system 28: buzz points, squeak points, and rattle points. Buzz points 70.10 can be identified independently of whether or not a fastener 40 exists at a particular location. In contrast, each fastener location 70.06 in a preferred embodiment constitutes a squeak point and a rattle point. Non-fastener location can also constitute squeak and rattle data points 70.08. Because fastener locations can automatically be classified as interesting points 54 for squeak and rattle characteristics in the degraded 72 and restored models 74, the process of generating a subset of selectively identified points 54 can begin with processing fastener locations in a meaningful way.

1. Create Fastener Data Points

Figure 8A:
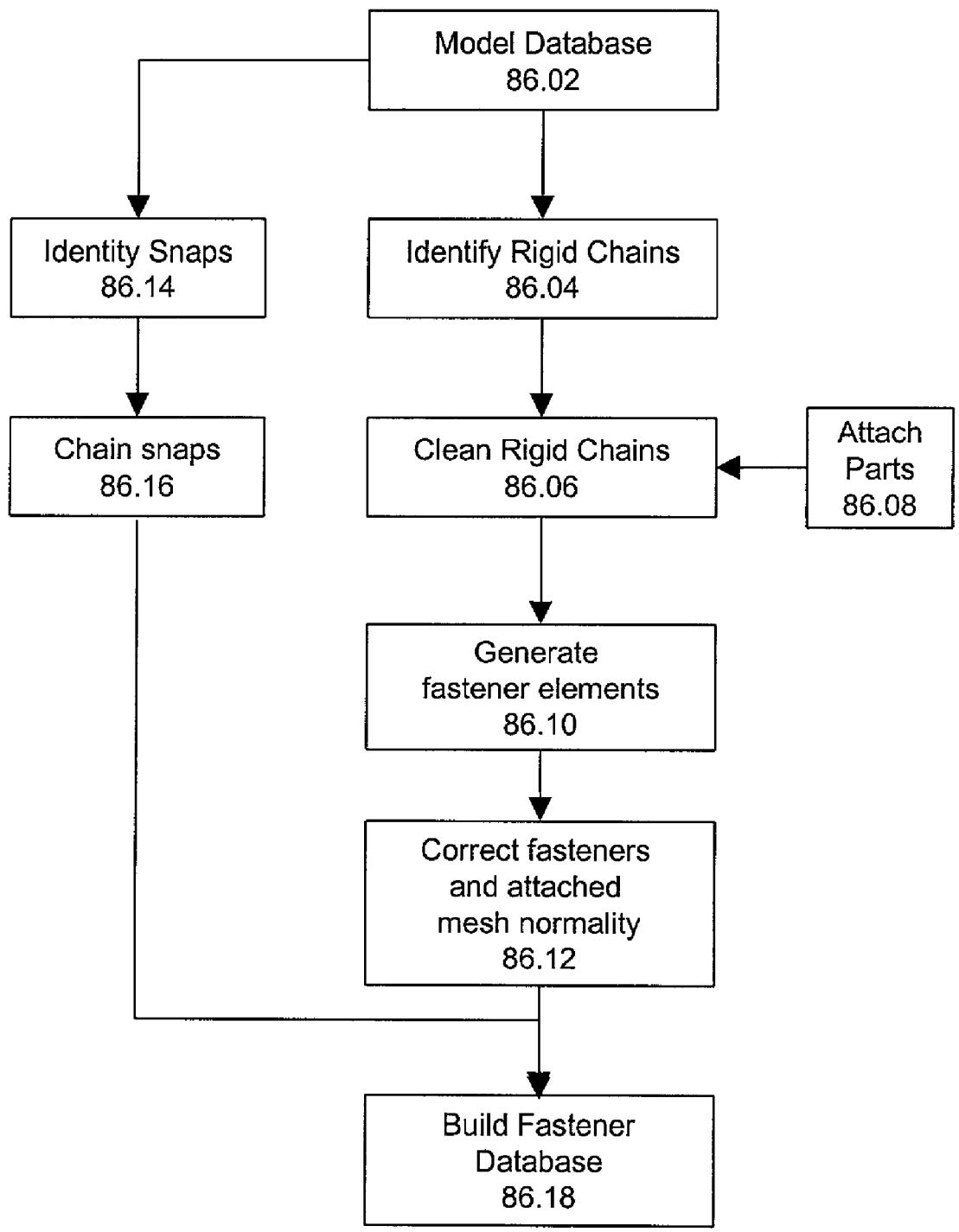
FIG. 8a is a high-level flowchart describing the part of the point selection subsystem that creates a data point pair at each fastener location.

FIG. 8a discloses a high-level flowchart for the process of identifying fasteners 40 in the models database 43 and saving the relevant information in the point database 45. The relevant model information stored in the models database 45 can be accessed at 86.02 to identify rigid chains at 86.04. The rigid chains can be cleaned at 86.06, with the system 28 removing redundant and erroneous dependencies. The internal characteristics of a fastener 40 are affected by the nature of the parts 38 that a fastener 40 connects, so part 38 information can be incorporated at 86.08 before the rigid chains are cleaned at 86.06. The parts 38 attached to each rigid chain can be analyzed to split the rigid chains into fasteners 40 and rigid webs for each part 38. After such part information is incorporated at 86.08, and the rigid chains are cleaned at 86.06, the fastener elements can be generated at 86.10. As discussed in greater detail below, the system 28 preferably requires that fasteners 40 are perpendicular (normal) to the parts 38 being connected. If in the generation of fastener elements from rigid chains, faster representations are not in a desirable format or are not attached with the required normality, corrections may be made at 86.12 before the data points are saved in the point database 45 at 86.18. The rigid elements representing the fasteners can be replaced with response recoverable rigid elements. If the rigid chains are split, the original chain and the associated elements can be deleted from the database 41.

For the purposes of fastener 40 point generation, snaps 44 can be a type of fastener 40 distinct from bolts 42, welds 46, and screws 50 in the finite element analysis of the snap itself. Snap point generation can thus follow a simultaneous and parallel track with the generation of other fastener 40 data points. Snaps 44 can be identified at 86.14 and may be correctly formatted at 86.16, as is described in greater detail below. In a preferred embodiment of the invention, the spring elements are identified as snaps 44 with an option to the user to override the default.

Figure 8B:
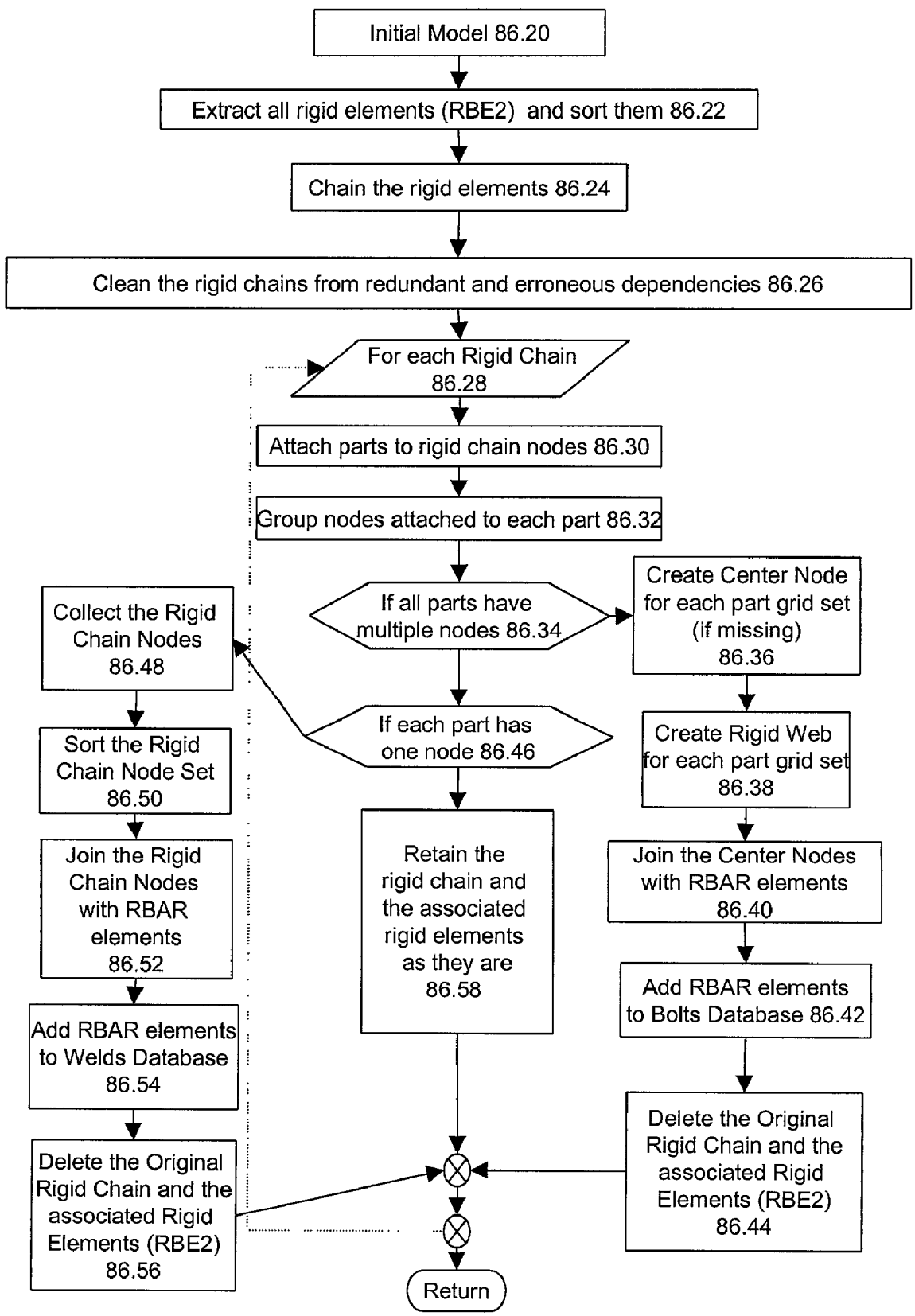
FIG. 8b is a more detailed flowchart for creating representative data points at fastener locations.

FIG. 8b discloses a more detailed flowchart for creating fastener 40 locations on the database 41. The initial model at 86.20 is the finite element model inputted into the system 28 from a conventional finite element analyzer. Rigid elements can then be extracted and sorted at 86.22. In a preferred embodiment, a conventional finite element analyzer, such as NASTRAN, is used. For instance, NASTRAN can represents such rigid elements in a non-response recoverable format. Different finite element analyzers will use different notations to represent similar concepts. The rigid elements can be chained at 86.24. Rigid models can then be cleaned with respect to redundant and erroneous dependencies at 86.26.

The remaining loop beginning at 86.28 through either 86.56 and 86.44 can performed for each rigid chain on a chain-by-chain basis. Parts 38 can be attached to rigid chain nodes at 86.30. Group nodes can then be attached to each part at 86.32. Parts with multiple nodes can be identified at 86.34, and can be subject to the loop from 86.36 through 86.44. If part of a grid set is missing, a center node can be created at 86.36. A rigid web can then be created for each part grid set at 86.38. The center nodes 52 can then be joined with response recoverable elements or "force recoverable rigid elements" at 86.40. Force recoverable rigid elements can then be added to the database 41. The original rigid chain and associated rigid elements (non-response recoverable elements) may be deleted from the active model being processed by the system 28 at 86.44. The initial model information from 86.20 can be kept intact in the model database 43, but is not processed by the system 28. Thus, at 86.58 the rigid chain and associated rigid elements can be saved as they are for reference purposes, because data in such a format should not be used by the system 28 to evaluate BSR and other noise source characteristics without enhancing the fastener 40 representations.

Each part 38 with only one node 52 can be identified at 86.46 and can be subjected to the loop between 86.46 and 86.56. Rigid chain nodes 52 can be collected at 86.46. The rigid chain node 52 set can then be sorted at 86.50. Each rigid chain node can be enhanced with response recoverable elements at 86.52 to allow subsequent processing by the system 28. At 86.54, response recoverable elements can then added to the weld 46 data points 54 in the database 41. The original rigid chain and associated non-response recoverable rigid elements can be deleted from the active model being processed by the system 28 at 86.56. The non-enhanced non-reformatted initial data can be stored for reference purposes at 86.58 as the initial model 68, but preferably no processing is performed on such a model.

2. Bolt Data Points

A standard finite element representation of a fastener 40 can be identified and converted into a format that allows a finite element analysis of the fastener 40 itself. More specifically, conventional finite element analyzers often represent fasteners 40 in a non-response recoverable format instead of a response recoverable format. A non-response recoverable format or "force non-recoverable rigid element" format may be used to represent a fastener 40, but such a format cannot provide the information required by the point evaluation subsystem 77.

FIG. 9a illustrates the differences between a format usable by the system 28, and formats supported by conventional finite element analyzers that would require reformatting by the system 28. The deficiencies displayed in FIG. 9a(i) and 9a(ii) fail to reflect the reality that a bolt 42 is the geometrical shape of a segment. FIG. 9a(iii) illustrates an acceptable finite element representation of a bolt 42 that simply fails to allow the recovery of response information. FIG. 9a(iv) discloses a bolt 42 finite element representation reformatted by the system 28.

A local coordinate system is used for each bolt 42 with the z-axis along the direction of the bolt 42. If the bolt 42 length is zero, the local z-axis is aligned with the normal axis.

3. Snap Coordinate Compatibility

Fasteners 40 are generally represented in the system 28 using a local coordinate system as disclosed in greater detail below and at 86.104 on FIG. 9f. The conflict in the reference coordinates for snaps 44 with coincident modes is depicted in the degree of freedom table in FIG. 9b. The relation between the rattle and snap degrees of freedom for snaps and the local degrees of freedom can be explicitly tracked throughout the system 28. The three dimensional graph in the Figure illustrates the use of local coordinates.

3a. Other Fasteners

In alternative embodiments of the system 28, any other fastener 40 such as welds 46, rivets 48, nails, etc. and their combinations can be used by the system 28. For example, the welds 46 can be identified with individual rigid elements 53 or rigid links/chains/webs. It can also potentially be based on any other rigid or elastic representation such as the special weld elements available in many conventional finite element analyzers.

4. Non-fastener Squeak and Rattle Points

In a preferred embodiment of the invention, only non-fastener locations will constitute squeak or rattle points 52 in the as-designed model 70. Properly manufactured assemblies 30 should not result in squeak or rattle characteristics without first being subject to wear, tear, and aging. Alternative embodiments can include fastener locations.

FIG. 9c discloses a geometric drawing illustrating the radial threshold distance heuristic for selectively identifying a subset 54 of representative data points 52 relating to non-fastener squeak and rattle locations. In a preferred embodiment of the invention, a preliminary search is conducted over the nodes 52 in the model 70, 72, or 74 in three-dimensional space within a specified threshold distance, such as the distance disclosed in FIG. 9c. Use of a threshold radial distance between two representative data points 52 is an effective heuristic/subroutine for selectively identifying a subset of interesting points 54 for the purposes of squeak and rattle characteristics. Preferably, the distance along the average part of the normal can be used. Other heuristics/subroutines relating to data points can be used in alternative embodiments of the invention.

Figure 9D:
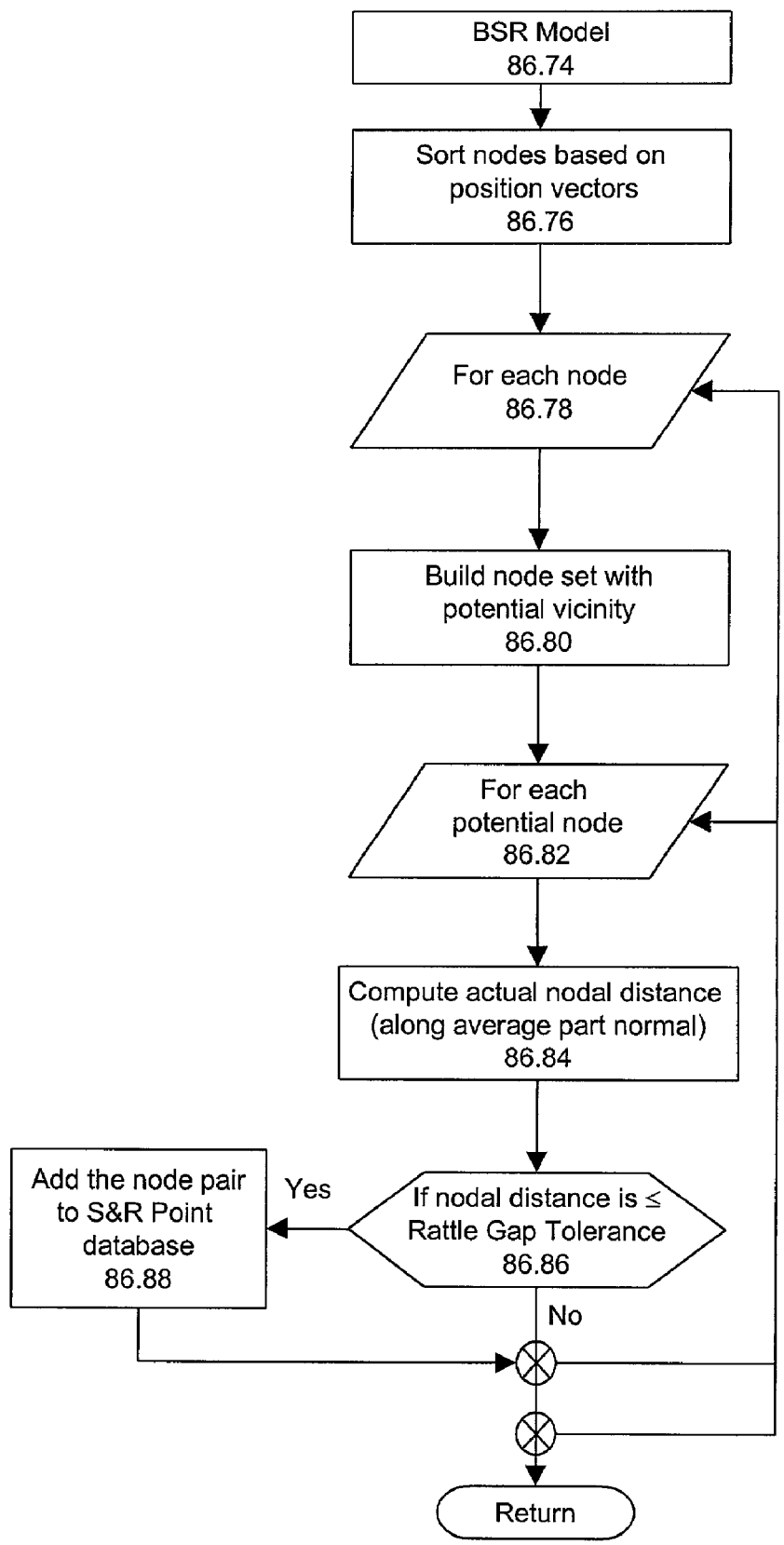
FIG. 9d is a flowchart disclosing the identification of squeak and rattle data point pairs at non-fastener locations by the point selection subsystem.

FIG. 9d discloses a flowchart of the process that can be used for identifying non-fastener squeak and rattle points.

The type of model (as-designed 70, degraded 72, or restored 74) may be selected at 86.74. Based on their position vectors, the point pairs 52 can be sorted at 86.76. Each node pair can then subjected to a loop beginning at 86.78 through 86.88. For each potential node pair 52 at 86.82, the actual projected distance between the selected nodes pairs along the average part of the normal may be calculated at 86.84. That calculation can be compared to a predefined threshold tolerance at 86.88. If the distance between the two points in the pair of data points is less then the threshold (maximum element size in the neighborhood is taken as the threshold by default; it can be overridden by the user 29), the node pairs or pair of representative data points 52 can be selectively identified as the subset of interesting points 54 at 86.88. These point pairs 54 can be further reduced using pre-selected number of modes (natural mode shapes) by eliminating the points 52 that never significantly participate in any of the natural modes of vibration. The squeak and rattle points 52 can then be further reduced by eliminating the unlikely candidates in the immediate neighborhood of the fasteners 40 including but not limited to such fasteners 40 as welds 46, bolts 42 and snaps 44 as generally described in greater detail below.

In the case of degraded 72 and restored 74 models in a preferred embodiment of the invention, the bolt and snap point pairs 52 are included in the squeak and rattle point sets.

5. Create Buzz Points

Figure 9E:
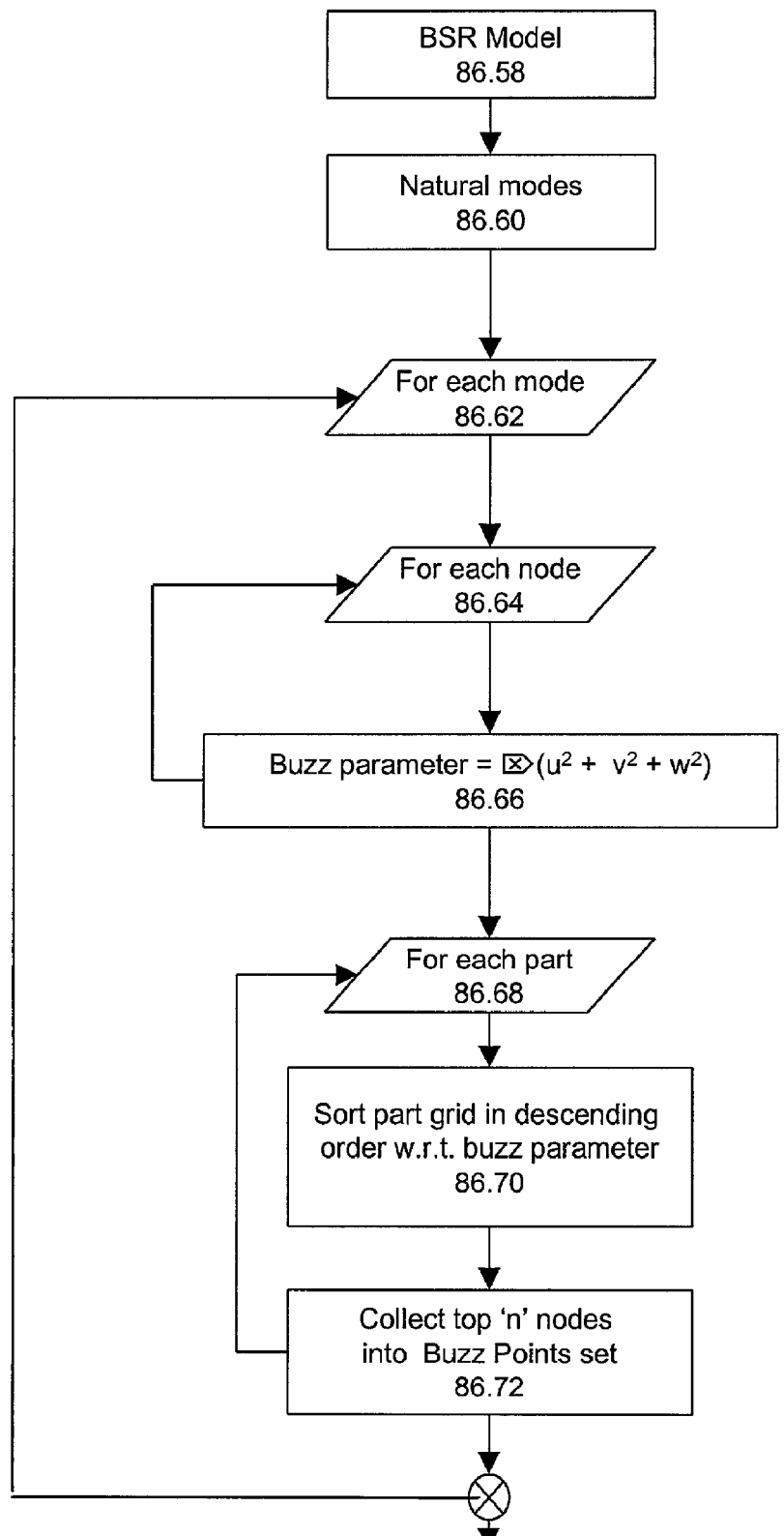
FIG. 9e is a flowchart disclosing the identification of the buzz points by the point selection subsystem.

Interesting points 54 with respect to buzz characteristics are not preferably identified on the basis of fastener 40 locations or the radial distance threshold described above for squeak and rattle points. Instead, interesting buzz points 54 are preferably identified from a pre-selected or a user-selected number of modes (natural mode shapes) at the locations where maximum displacement (translational) occurs in each mode. The heuristic/subroutine for selectively identifying interesting buzz points is disclosed in FIG. 9e.

The buzz points heuristic requires a model such as an as-designed 70, degraded 72, or restored model 74 or some other analytical representation of an assembly 30 at 86.58. Predefined modes (deformation shapes) can be used to categorize buzz points, and analyze their Eigen values. A user 29 can determine how many natural deformation modes should be supported by the system 28 and what those modes consist of. For each mode at 86.62, the system 28 can perform the loop from 86.64 through 86.72, identifying the individual representative data points 52 and parts 38 possessing that particular mode characteristic. Each representative data point 52 at 86.64 for a particular mode at 86.64 can be evaluated on the buzz parameter provided at 86.66. Preferably for each part 38 at 86.68, data points 52 in the part are sorted in descending order at 86.70 with respect to the buzz parameter. Thus, each part 38 can have a ranking of nodes 52 with respect to each natural mode of deformation. The top "n" ranking nodes can be identified as interesting points 54 for buzz characteristics at 86.72. However, in a preferred embodiment of the invention, the user 29 can override the value of "n," which is 1 by default. Moreover, in a preferred embodiment of the invention, an Eigen-value solution is generated for the model. The natural modes for the complete model can be read in and incorporated. A pre-selected or user-selected "n" number of maximum deflection nodes can be identified in each part 38 for each pre-selected/user-selected mode shape. The buzz points 54 with the maximum deflection nodes can be collected, and a local coordinate system for each buzz point with the z-axis along the grid normal direction can be generated.

6. Interesting Points in the Aggregate

Figure 9F:
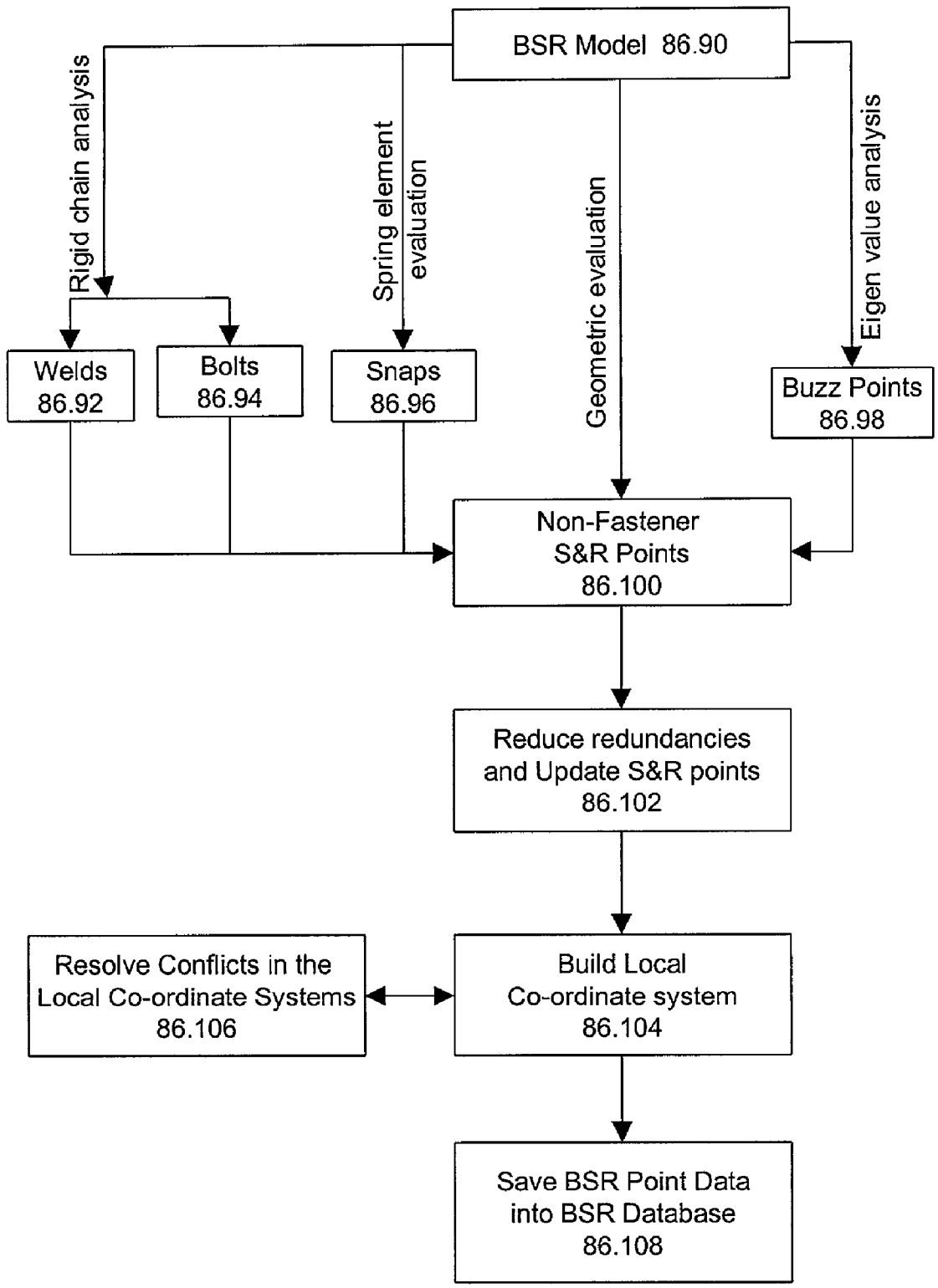
FIG. 9f is flowchart disclosing the creation of a selected point database by the point identification system.

FIG. 9f discloses a flow chart summarizing how interesting points 54 can be selected for various noise source characteristics such as buzz, squeak, and rattle, as generally described previously above. A model is required at 86.90. A rigid chain analysis may result in the identification of welds at 86.92 and bolts at 86.94. Spring element evaluations can identify snaps at 86.96. An analysis of natural mode shapes and eigen-values can identify interesting points 54 for the purposes of buzz characteristics. The non-fastener locations 54 can be identified by the radial threshold heuristic at 86.100. Redundancies can be eliminated and squeak and rattle points can be updated at 86.102. Interesting points can be identified in accordance with their own individual local coordinate system at 86.104, and snap coordinate systems conflicts in the local coordinate system can be resolved at 86.106. Preferably all the results, including but not limited to displacements and forces at the interesting points 54, may be interpreted in a corresponding local coordinate system. Interesting points 54 can then saved on the point database 43 at 86.108.

7. Display Point Map

The system 28 can provide tools for displaying the model (either as-designed 70, degraded 72, or restored 74 depending on the stage the system 28 is in) with various standard and customary visualizations. The system 28 can provide tools especially for the displaying or masking the subset of representative data points 54 associated with bolts 42, welds 46, snaps 44, rattle/squeak points and buzz points. A GUI can be used for displaying various interesting points 54 from the model database 43 and point database 45. The point map can also be plotted on each part pair basis, as well.

F. Read Dynamic Response

A GUI can be used for inputting dynamic response information from an outside source, such as an outside file. Although the dynamic response is read from an outside source in a preferred embodiment of the invention, the buzz, rattle and squeak parameters for the application of the data is generated internally by the system 28. Dynamic response information for a finite element model can be obtained from any standard commercially available finite element analyzer. The response could be in any form (random, complex, time history etc.). In a preferred embodiment of the invention, displacement responses are extracted at all buzz, squeak and rattle points 54 as well as snap points 44. Force responses can be extracted at the bolts 42. A dynamic response file is preferably in an ASCII format, but can exist in potentially any format. Alternative embodiments may extract different types of forces and responses for different types of fasteners and different types of points and locations. In a preferred embodiment of the invention, the inputted load information can be of any standard format and can be transformed into a Magnitude-Phase form using a Fourier transformation.

Model data can be generated from a conventional finite element analyzer. Response data for a finite element model can be generated from a conventional finite element analyzer. The finite element solution may be read back into the system 28 and transformed to real time history using a Fast Fourier Transformation. The buzz evaluation module 98, squeak evaluation module 102, the rattle evaluation module 100, and other processing by the system 28 interpret such time domain solution to generate the corresponding BSR parameters. In alternative embodiments of the system, the load can be provided in any domain and the solutions can be generated in any domain. The system 28 may generate and manage all information internally if the system 28 includes a finite element analyzer. Regardless of the particular configuration of the system 28, finite element solutions can be generated at the predetermined buzz, squeak and rattle points (at fastener as well as non-fastener locations) for the dynamic response of the model.

G. Gap Evaluation

1. Gap Evaluation for Squeak and Rattle Points

The system 28 can use the effective gap (projected distances) between the two interesting points 54 in a data point pair or node pair as the final condition for identifying the spatial relationship for potential rattle and squeak characteristics. In contrast, buzz characteristics are preferably determined on an individual point 52 by individual point 52 basis. The system 28 evaluates the gap as the physical gap between the parts 38 at the interesting points 54 location.

FIGS. 10 and 11 disclose an embodiment in which the gap is computed as the distance between the nodes, less the average thickness of the associated parts, including all the environmental effects as generally explained further below. The GD&T tolerances (if available) may then be applied on the two parts 38 to find the minimum gap at each interesting point(s) 54 location as disclosed in FIG. 11. Generally, gap calculations represented in the figures are based on an assumption that the parts 38 are modeled at their mid-surfaces, as in a preferred embodiment. However, if the final gap is unrealistic, the user 29 may be prompted to confirm the desired surface modeling. This final gap can be evaluated whether the part(s) are modeled at the mid-surface (default), top-surface, bottom-surface, or some other heuristic/subroutine. Accordingly, a thickness correction can be altered to find the new gap. If the gap is still not realistic, as an option, the interesting point 54 can be marked problematic for an external correction. In an automated embodiment, the system 28 automatically corrects the unrealistic gap data by replacing the gap data with a realistic value. While not required, this is preferably done automatically, without any user 29 intervention. The gap evaluation can be modified based on the environmental effects, which can be built into the model geometry, such as generally described below. If the system 28 is configured by the user 29 to incorporate GD&T effects, the GD&T influence is flag on. The system 28 can prompt the user 29 to update the GD&T data for the interesting points 54 and can repeat the noise source evaluation process if the point database 45 is updated as generally described below at 110.

2. Environmental Effects

In a preferred embodiment of the invention, the system 28 provides an optional ability to evaluate the influence of environmental effects such as extreme thermal condition, dead weight of the structure, moisture etc. on the noise source characteristics of an assembly 30. Preferably, a user 29 is given an option to incorporate environmental effects to perform noise analysis at any stage during the BSR evaluation. The impact of environmental effects can be incorporated into the resulting deformations experienced at interesting points 54, and the resulting effects in the gap analysis, for instance, as discussed above.

In a preferred embodiment of the invention, a GUI is provided to allow a user 29 to supply basic data such as thermal load, ambient temperature (e.g., the temperature that the structure is externally subjected to), and other thermal properties (e.g., coefficient of expansion and reference temperature) for the materials involved in the model. The system 28 can update the model database 43 and point database 45 with the inputted information. An updated as-designed model 70 can be provided for generating a static thermal deformation solution. If desired, a user 29 can (or may be required to) perform linear static thermal stress analysis and generate deformation solutions using a commercially available finite element analyzer, which may interface directly with the system 28. The thermal deformation can then read from the finite element solution and the model node locations may be updated by vectorially adding the translational deflection with the respective global positions of the node and stored with the point database 43. The model database 43 and point database 45 can both updated as a result of incorporating thermal deformation information. The influences of other environmental factors such as moisture and the sag due to dead weight may also handled in a similar manner. It is recommended that environmental effects be incorporated before gap evaluation, though it can be considered at any time during the noise evaluation process, or not at all.

Figure 12:
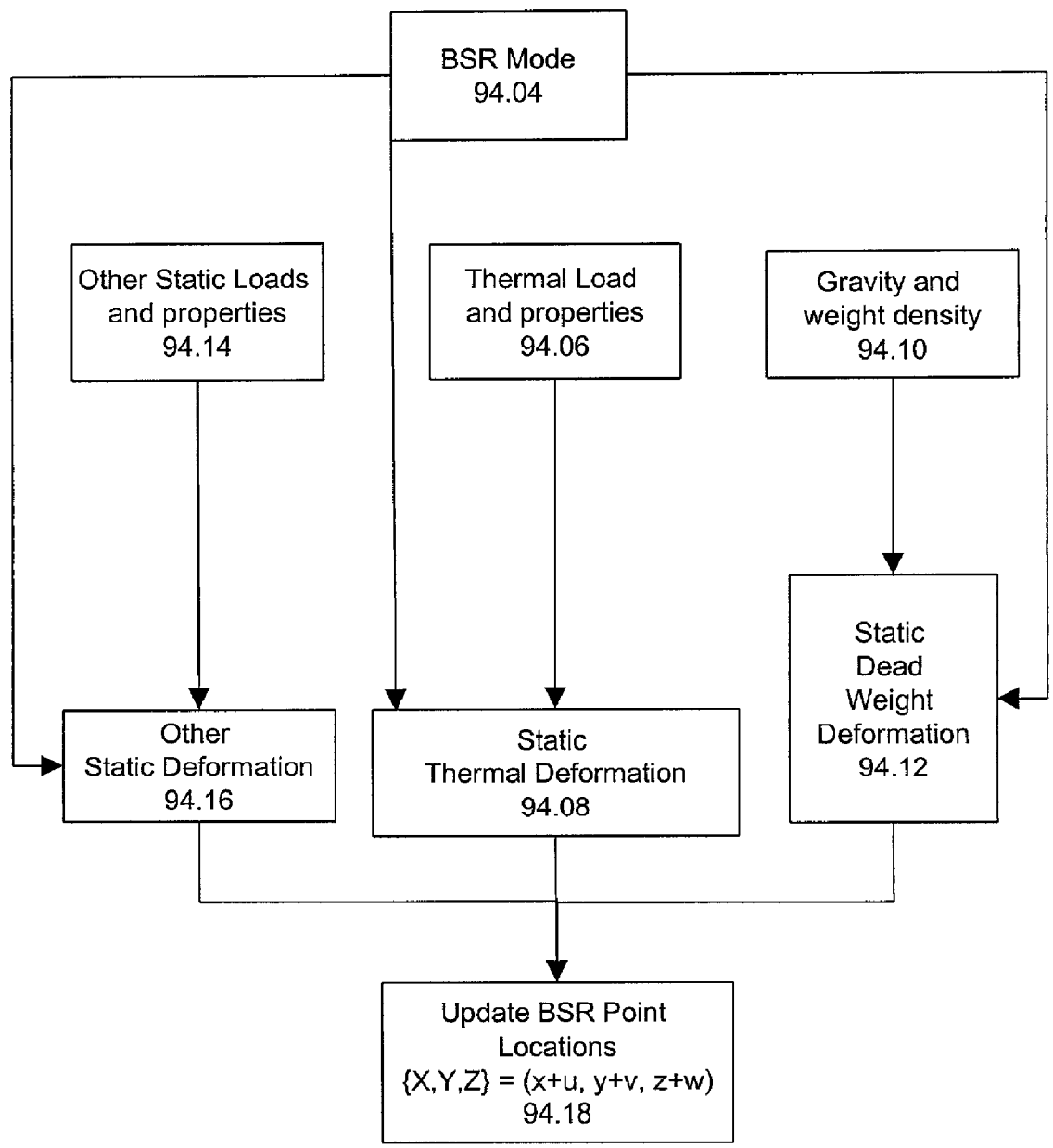
FIG. 12 is a flow chart disclosing how environmental effects are incorporated into the gap analysis performed by the point evaluation subsystem.

FIG. 12 shows some of the different steps involved in incorporating environmental effects. First, a model can be selected at 94.04. Thermal load and other properties at 94.06 can be used to generate static thermal deformation information at 94.08. Gravity and weight density properties at 94.10 can be used to generate static dead weight deformation information at 94.12. Other static load properties at 94.12 can be used to generate corresponding static deformation information at 94.16. If desired, all of the various deformations can be incorporated into the data point locations at 94.18 and the resulting gap analysis.

H. Buzz Evaluation

The dynamic forced frequency displacement response at the pre-determined buzz points can be internally processed by the system 28. In a preferred embodiment of the invention, load information can transformed from the time domain into the frequency domain using an appropriate transformation (such as a Fast Fourier transformation) so that a conventional finite element analyzer can input the load information and generate the required response information. Response information generated by a finite element analyzer is typically generated in the frequency domain. The frequency domain displacement components (Magnitude-Phase, Real-Imaginary, or any other form) can be transformed back into the time domain using Fast Fourier transformation. The translational displacement components of the time domain response of the model may be added vectorially at each time step to compute the buzz parameter (displayed graphically as a buzz curve) for each buzz point. Each buzz point may be ranked and sorted according to the index strategy module 108, described in greater detail below. In a preferred embodiment of invention, a default index is set by the system 28, but such an index can also be overridden by a user 29.

Figure 13:
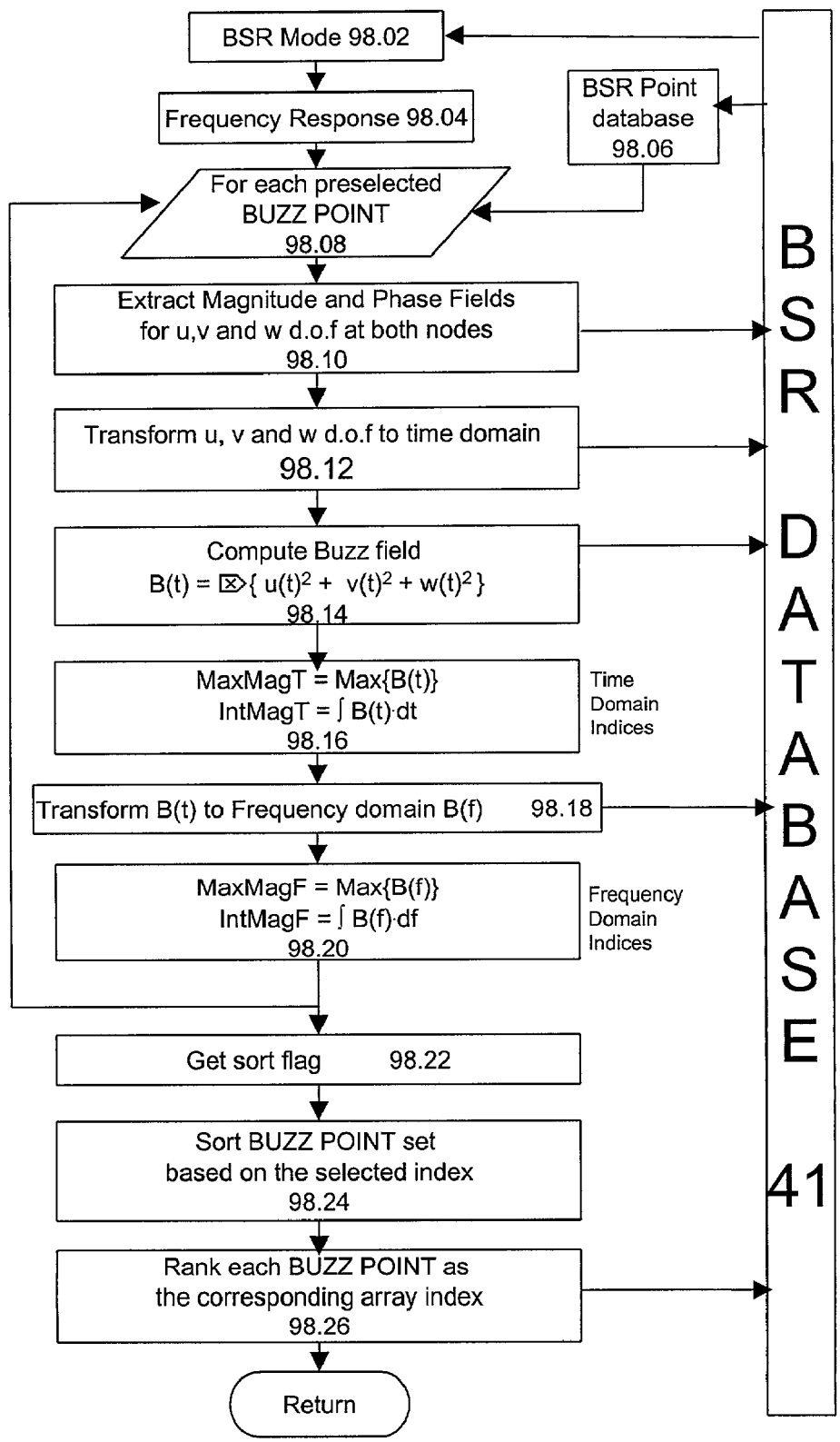
FIG. 13 is a flow chart disclosing how the point evaluation subsystem performs buzz evaluation.

FIG. 13 is a flow chart of a preferred buzz evaluation process 98. A model at 98.02 can be retrieved from the model database 43 for the purposes of buzz evaluation. A frequency response can be obtained at the predetermined set of potentially critical buzz points from a conventional finite element analyzer at 98.04. In an alternative embodiment, the system generates such solutions internally by incorporating the function of a finite element analyzer. Previously determined buzz points by the point selection subsystem 75 are obtained from the point database 45 at 94.06. Each buzz point can be subject to the looping process from 98.08 through 98.20.

A single buzz point can be selected at 98.08. The magnitude and phase fields are extracted at 98.10. Frequency domain responses can be transformed into the time domain with a Fast Fourier transformation at 98.12. The buzz field may be calculated at 98.14. Time domain indices can be calculated at 98.16. The buzz parameter may then transformed back to the frequency domain at 98.18 so that frequency domain indices can be created at 98.20. In a preferred embodiment of the invention, both time domain and frequency domains may be used to index buzz characteristics. The loop beginning at 98.08 can be repeated for each buzz point, with each step in the loop being saved to the database 41.

After buzz indices have been generated for all buzz points, the sort flag may be obtained at 98.22. In a preferred embodiment of the invention, the time domain of the energy loss is a preferred index as discussed in greater detail below, but the user 29 is given an option to change the sort index at 98.24. Each buzz point 54 can then be ranked in accordance with the selected index at 98.26.

I. Rattle Evaluation

A preferred embodiment of the invention uses three indices for rattle evaluation based on estimated loss of energy, loss of momentum and a weighted average combination which includes both loss of energy and loss of momentum. Alternative embodiments may incorporate other characteristics as indices. Such indices can be used in either the time or frequency domains, and are discussed in greater detail below.

Figure 14:
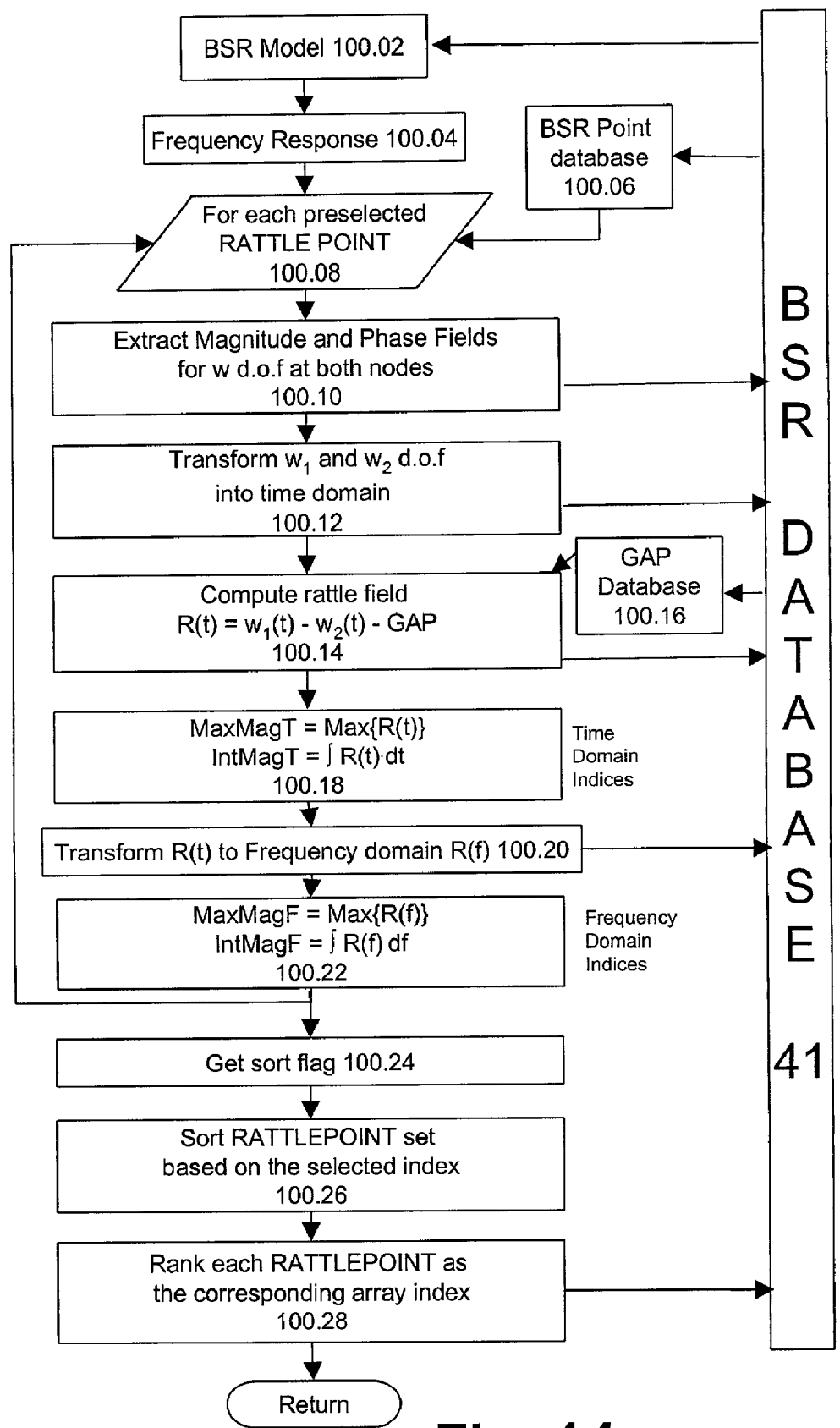
FIG. 14 is a flow chart disclosing how the point evaluation subsystem performs rattle evaluation.

FIG. 14 is a flow chart of a preferred rattle evaluation module 100. A model can selected from the database 41 at 100.02. Rattle points at 100.06 may be retrieved from the point database 43. The dynamic forced frequency displacement response (the projected displacement component along the node-pair axis) at 100.04 can be transformed to time domain for each node and the time domain fields may then used to compute the rattle parameters which are displayed visually as rattle curves. Each pre-selected rattle point-pair can then subject to the process beginning at 100.08 through 100.28.

Potentially every pre-selected rattle point-pair at 100.08 can have magnitude and phase fields extracted for both nodes 54 in the pair. The two displacement components ($w_1$ and $w_2$) at the two nodes can then transformed from the frequency domain into the time domain. Gap information from the gap evaluation module 92 can be used to compute the rattle response at 100.14 with $R(t)=w_1(t)-w_2(t)-GAP$. The potential penetration can be used as an indicator for the relative loss of energy at rattle locations. Alternative embodiments of the invention use different default indices, but in a preferred embodiment a user 29 will have one or more options to change the default indices.

Time domain indices can be calculated at 100.18 for whichever indices are selected by the user 29. The rattle response can then transformed into the frequency domain using a Fast Fourier transform at 200.22. Sort flag information can be obtained at 200.24 and the rattle point pairs are sorted at 200.26 on the basis of the sort flag. Each pair of rattle points 54 can then ranked by the relevant index at 200.28. The sorting can be conducted independently for the non-fastener points, the bolt points, the snap points (if any), and any other type of fastener. The sorted rattle data in time domain and frequency domain, and the associated file positions can be added to the results database 47 and the points database 45.

J. Squeak Evaluation

The results of the rattle evaluation module 102 are preferably used to further eliminate potential interesting point pairs 54 with respect to squeak characteristics. The point pairs 52 where contact between the parts 38 (rattle) is not ensured are eliminated from the set of interesting squeak point pairs 54. Thus, the squeak evaluation module 102 can use the rattle response from the rattle evaluation module 100 and gap information from the gap evaluation module 92 to ensure that only contacting data point pairs are evaluated for squeak characteristics. Elimination of such points facilitates the ability of the system 28 to generate real-time results in a flexible manner with better precision and reliability. In a preferred embodiment of the system, translational squeak points are referred to non-fastener locations while rotational squeak points are referred to bolt 42 locations. In alternative embodiments, any other combination of points 52 can be considered for the squeak evaluation. The rotational and the translational squeak evaluations are preferably conducted separately. In an alternative embodiment, they can be combined for a unified squeak evaluation.

1. Translational Squeak

Figure 15A:
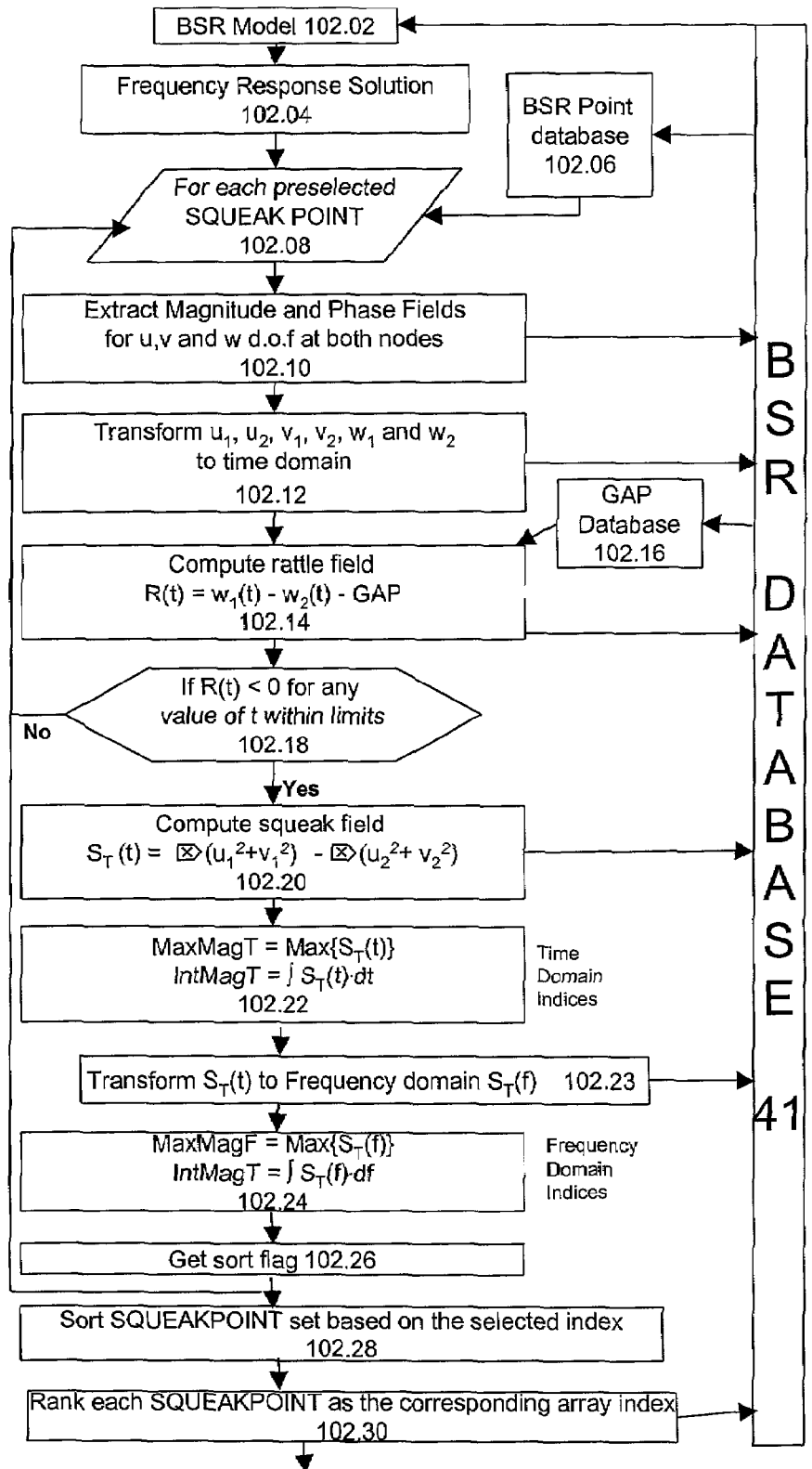
FIG. 15a is a flow chart disclosing how the point evaluation subsystem performs translational squeak evaluation.

FIG. 15*a* is a flowchart of a preferred process for evaluating translational squeak. As generally described below, a model or other analytical representation at 102.02 can be selected from the database 41. The process loop from 102.08 through 102.24 through 102.18 can be performed for each pre-selected translational squeak location. The magnitude and phase fields for the translational degrees of freedom (u, v, and w) can preferably be extracted for both nodes in the pair 102.10. The magnitude and phase information for each displacement field can be transformed into the time domain at 102.12. The rattle parameter described above can be computed at 102.14, incorporating the results of the gap evaluation module 92 to determine if the data points 54 in the pair actually come into contact with each other (e.g. $R(t)<0$) at 102.18.

If there is no contact indicated, that location is not ranked, and processing loop begins with a new pair of squeak points at 102.08. If contact is indicated, the squeak parameter can be calculated at 102.20 using the in-plane translational displacement components of u and v at 102.20. The squeak parameter (which can be viewed as curve) can have its time domain indices calculated at 102.22. The time domain squeak parameter can be transformed at 102.23 into the frequency domain parameter at 102.24 using a Fast Fourier transformation.

After point pairs 54 have been processed, a sort flag can be accessed at 102.26 in order to sort the squeak point pairs at 102.28. Each translational squeak point pair can then ranked at 102.30 in accordance with the index criteria described in greater detail below. Information can be saved after various steps in the database 41.

2. Rotational Squeak

The process for evaluating rotational squeak can be very similar to the process for evaluating translational squeak, except that preferred physical displacement components under consideration are different. Translational squeak originates from the in-plane translational displacement components (u and v) at the non-fastener points. In contrast, rotational squeak originates from the in-plane rotational displacement component ($\theta_z$) at the rotational squeak locations. In a preferred embodiment, rotational squeak is computed at the bolts 42 and snaps 44 only when they are weakened by wear and tear (Degenerated and Restored models only). In alternative embodiments, rotational squeak can computed at other points and for other models or analytical representations. At the location of preferably each rotational squeak point pair, the squeak response can be calculated in the time domain as the potential in-plane interference between the two squeak data points in the pair:

$$S_r(t)=R_1(t)-R_2(t).$$

Figure 15B:
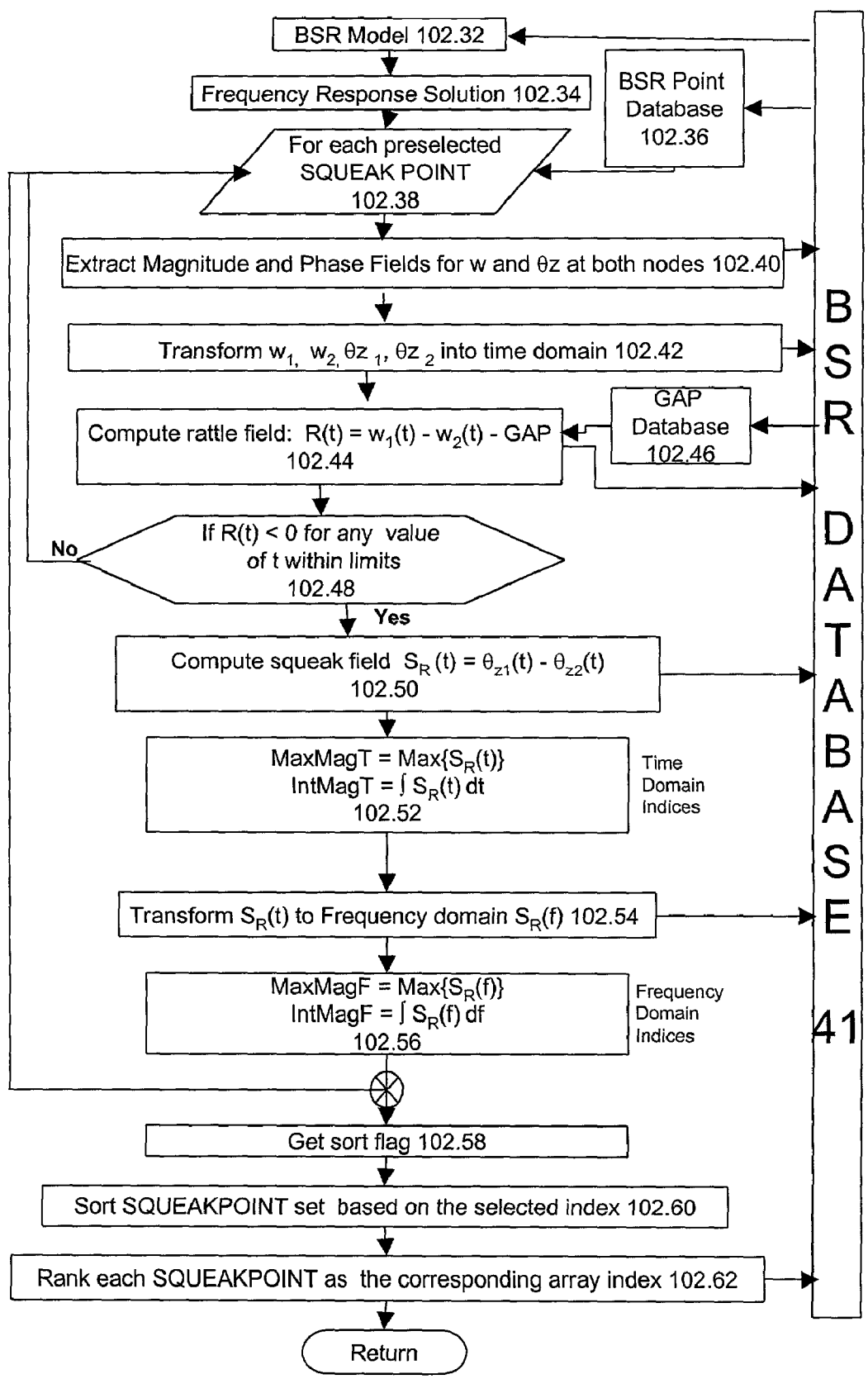
FIG. 15b is a flow chart disclosing how the point evaluation subsystem performs rotational squeak evaluation.

FIG. 15*b* is a flowchart for a preferred rotational squeak evaluation module. The differences between rotational and translational squeak are evident at 102.30 where the magnitude and phase fields are for in-plane rotational displacement are θz not u and v. The transformation into the time domain at 102.42 can utilize a Fast Fourier transformation, but θz replaces u and v in the transformation. Similarly, the squeak parameter calculated at 102.50 utilizes θz instead of u and v. When squeak points are ranked at 102.62, translational squeak points are preferably ranked separately from rotational squeak points. The other processes in the Figure are remarkably similar to those for evaluation translational squeak.

K. Bolt Evaluation

In a preferred embodiment of the system 28, bolts 42 can be evaluated from a force transfer point of view in the as-designed model while they are evaluated from rotational squeak point of view in the degenerated and restored model. They may also be evaluated in any other fashion in the alternative embodiments. The first set of critical bolts can be generated from the force response evaluation at the bolts in the as-designed model 70. The second set of critical bolts can be generated from the rotational squeak evaluation in the degenerated model. The two sets can be unified and the top pre-selected or user-selected number of bolts can be restored to their original strength (e.g., setting rigid all degrees of freedom) from the degenerated model 72 to generate the restored model 74. Both the force response evaluation and the rotational squeak evaluation can be conducted on the restored model 74. In a preferred embodiment, the bolt evaluation module 104 is used to evaluate force responses in the as-designed model 70, as generally described below.

Force components in the frequency domain can be translated into the time domain using a Fast Fourier Transformation. The effective bolt stress can computed from these force components at every time step using the standard 3-D Von Mises stress definition by using a user-prescribed diameter for each bolt (if not given default values are used). For each bolt 42, the force index can computed as generally described below. The bolts 42 can then sorted based on the index. The critical bolts 56 from these sets can form the final critical bolt set. The sorted bolt response information can be added to point database 54.

Figure 16:
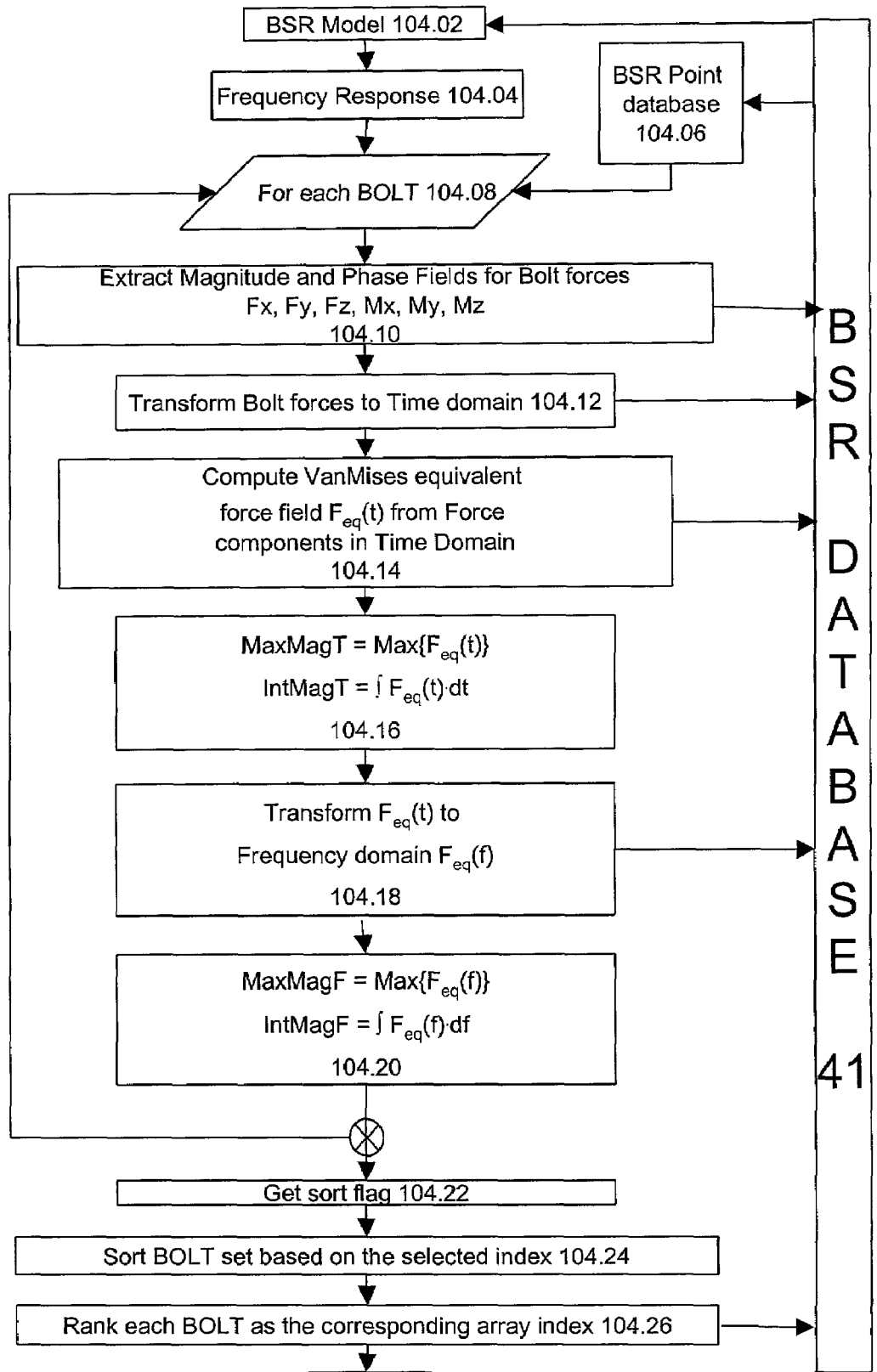
FIG. 16 is a flow chart disclosing how the point evaluation subsystem performs bolt evaluation.

FIG. 16 is a flow chart of a preferred bolt evaluation module 104. The dynamic forced frequency response can be extracted from the FE results database at 104.04 and BSR point information from the point database 45 at 104.06 may be used in processing each bolt at 104.08. The magnitude and phase fields for bolt forces can be extracted at 104.10. The Fast Fourier transformation can be used at 104.12 to transform the bolt forces into the time domain at 104.12. The effective bolt stress can be computed from the forced components using the standard 3-dimensional Von Mises stress definition by using a prescribed diameter for each bolt at 104.14. If not altered by a user 29, the system 28 can apply a default value for a bolt diameter. Time domain indices may be created for the bolt at 104.16, and the Fast Fourier transformation can be used to transform the bolt stress into the frequency domain at 104.18. Frequency indices can be created at 104.20.

After preferably all bolt locations have been processed, a sort flag can be accessed at 104.22. Bolts 42 can be sorted in accordance with the sort flag at 104.24. Each bolt can be ranked as corresponds to the bolt index at 104.26. The bolt evaluation indices are generally described in greater detail below.

K. Snap Evaluation

In a preferred embodiment of the system 28, snaps can be evaluated from a force transfer point of view in the as-designed model while they are evaluated from both squeak and rattle points of view in the degenerated and restored model. They may also be evaluated in any other fashion in the alternative embodiments. The first set of critical snaps can be generated from the force response evaluation at the snaps in the as-designed model 72 or other analytical representation. The second set of critical snaps can be generated from the rattle and squeak evaluation at the snaps in the degenerated model 70 or other analytical representation. The two sets are preferably unified and the top pre-selected or user-selected number of snaps can be restored to their original strength (original stiffness) from the degenerated model to generate the restored model 74. Both the force response evaluation and the rattle/squeak evaluation can be conducted on the restored model. The rattle and squeak evaluations is as generally described above. In order to identify critical snaps in the as designed model 70, the system 28 preferably uses a snap evaluation (from force transfer point of view only) module 106.

Figure 17:
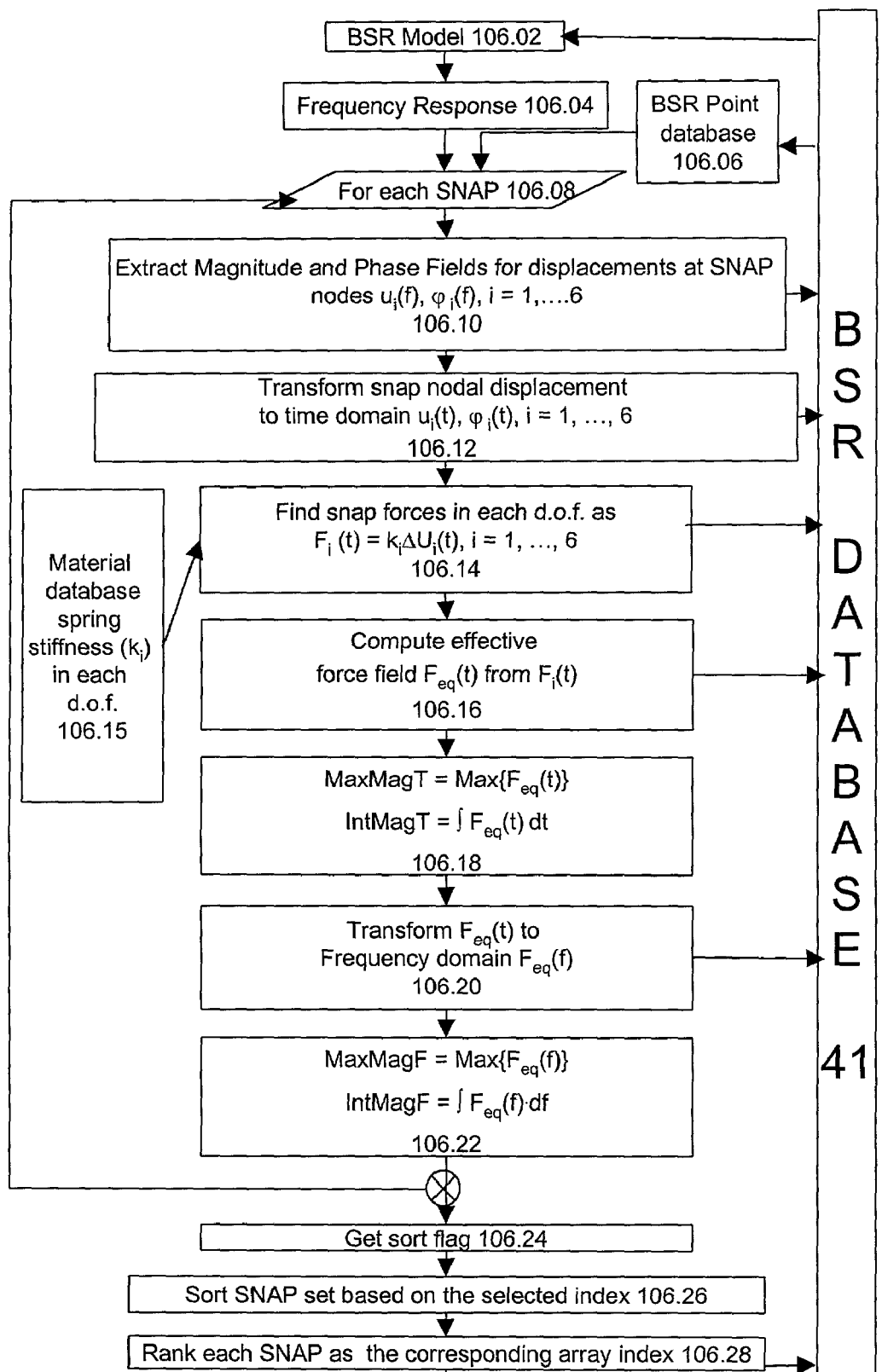
FIG. 17 is a flow chart disclosing how the point evaluation subsystem performs snap evaluation.

FIG. 17 is a flow chart of a preferred snap evaluation module 106. An as-designed model 70 can be selected at 106.02 from the database 41. The dynamic forced frequency displacement response at 106.04 can be incorporated with snap information at 106.06 in the database 41 for the individual evaluation of each snap pair at 106.08.

The displacement components can be read-in as functions of frequency at 106.10, where the magnitude and phase information is extracted. Snap displacement can be transformed into the time domain using a Fast Fourier transformation at 106.12. Snap forces can be computed in each degree of freedom at 106.14, incorporating snap stiffness information from 106.15. The snap forces can be computed as the product of the differential displacement between the two snap nodes and the associated snap stiffness in the corresponding direction at every time step. The effective snap force can be computed from the force components using the standard resultant force definition at 106.16. Time domain indices can be captured at 106.18, and a Fast Fourier transformation may be used to transform the snap forces in the frequency domain at 106.20, so that frequency domain indices can be captured at 106.22.

Preferably, when all snap locations have been processed, a sort flag is accessed at 106.22. In a preferred embodiment of the invention, energy loss in the time domain is the default index, but a user 29 is free to change the default index. Snap points 54 can be sorted at 106.26 on the basis of the sort flag at 106.24, and each snap pair may then ranked in accordance with the selected index at 106.28. Information at various steps in the process can be saved to the database 41 as indicated by the arrows in the flowchart.

L. GD&T Enhancement

Once the critical rattle and squeak locations are computed as generally described above, the user 29 can be given an option to incorporate new and/or additional geometric dimensioning and tolerance information at 110 if the user 29 has not already done so. Location specific GD&T information can be provided from a separate variation simulation analysis ("VSA") at the provided squeak and rattle critical locations 56 to enhance the quality of rattle and squeak predictions. Part specific GD&T information such as thickness variation, profile variation can also be provided to the system 28. The system 28 can extract the GD&T data either through user 29 inputted data or by inputting an ASCII file from a conventional VSA system. In either case, if location-specific data is missing, the system 28 may interpret the associated part 38 data as the GD&T specification at the interesting point 54 location. A GUI screen can allow the user to input GD&T information. The system allows the user to feed the GD&T data in different standard formats and combinations such as thickness variation, profile variation, gap variation due to stack-up in a standard assembly 30.

Figure 18:
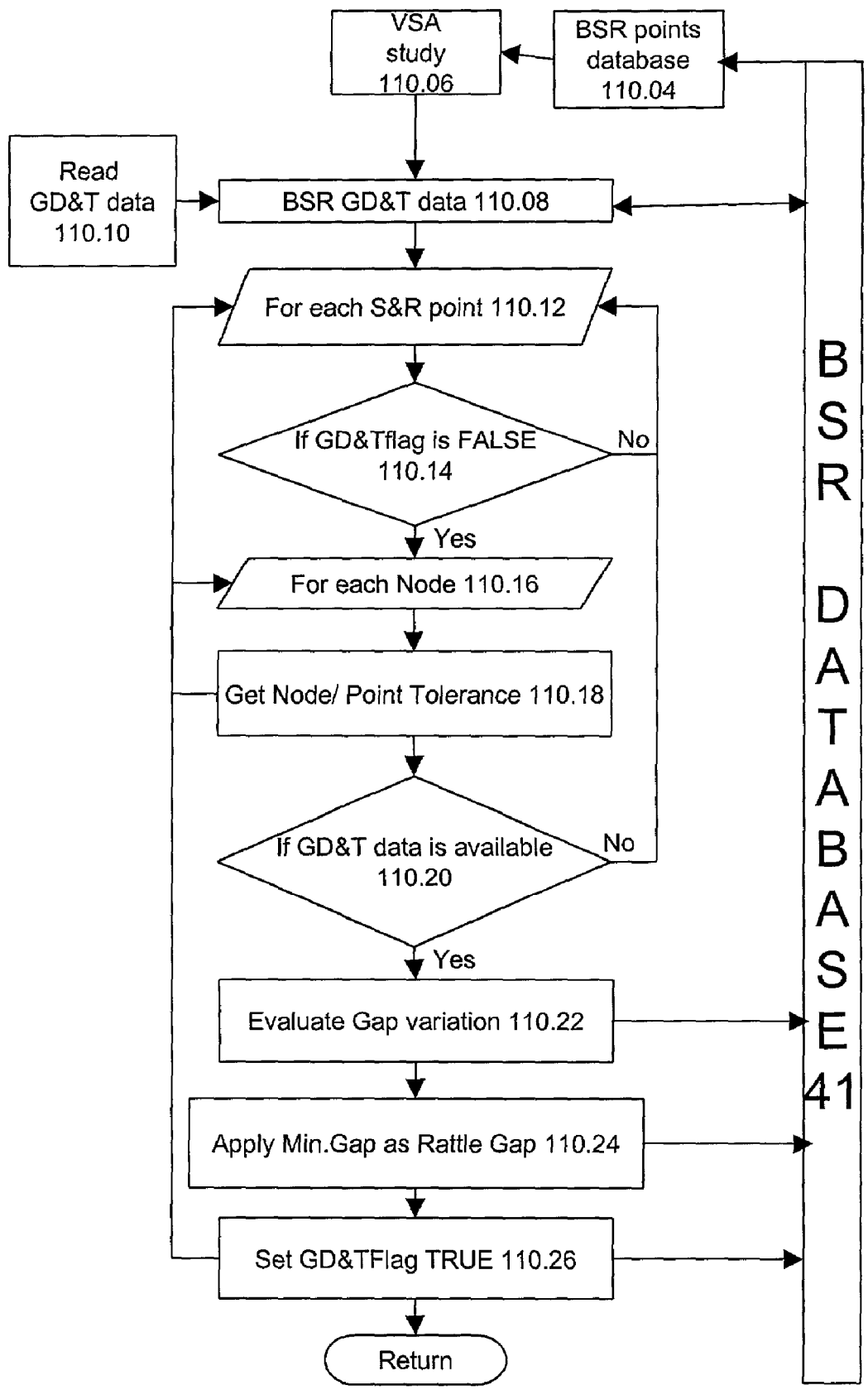
FIG. 18 is a flow chart disclosing the process by which geometric dimensioning and tolerance data is enhanced.

FIG. 18 is a flowchart of a preferred GD&T enhancement module 110. The points database 45 at 110.04 can be used to provide a variation simulation analysis ("VSA") at 110.06 to generate GD&T data at 110.08 that incorporates the read or inputted GD&T data at 110.10.

If the system senses a new GD&T data enhancement/addition, it can re-evaluate the gap for the associated squeak and rattle points, and the squeak and rattle evaluation can be carried out at the potentially critical rattle and squeak point pairs 54 again at 110.12. The minimum gap can be applied as a rattle gap at 110.24. The squeak and rattle propensity indices can be re-computed with the enhanced gap information and rattle and squeak evaluation. The database 41 can be updated with the new squeak and rattle results.

M. Index Strategies

The index strategies module 108 is an important part of the point evaluation subsystem 77. The system 28 applies various heuristics/subroutines to predict the which interesting points 54 constitute critical points 56 with respect to a particular type of noise characteristic, such as rotational squeak, etc. Interesting points 54 can be ranked with respect to noise characteristics, such as buzz, rattle, rotational squeak, and translational squeak. In a preferred embodiment, noise source characteristics can be evaluated using the mathematical concepts of a maximum spike in the associated noise source characteristic (a noise curve such as a buzz, rattle or squeak curve) or the integral of the associated noise source characteristic (the area under a noise curve such as a buzz, rattle, or squeak curve). Noise source characteristics can also ranked separately depending on the domain, so frequency domain characteristics can be ranked distinctly from time domain characteristics. In a preferred embodiment, the overall integral in the time domain is the default propensity index. Alternative embodiments may use a weighted average, or even rely on the some of the underlying characteristics of what constitutes the noise source parameter or noise source curve, such as mass, velocity, coefficient of restitution, or other measurements.

1. Buzz Index Strategies

In a preferred embodiment of the invention, the absolute integral of the buzz parameter (viewable as a curve) in over the time period is considered as the default buzz propensity index. However, the maximum magnitude and a weighted average of the two indices can be selected by a user 29 as alternative buzz propensity index, and other metrics can be used as indices by the system 28.

2. Rattle Index Strategies

Figure 19:
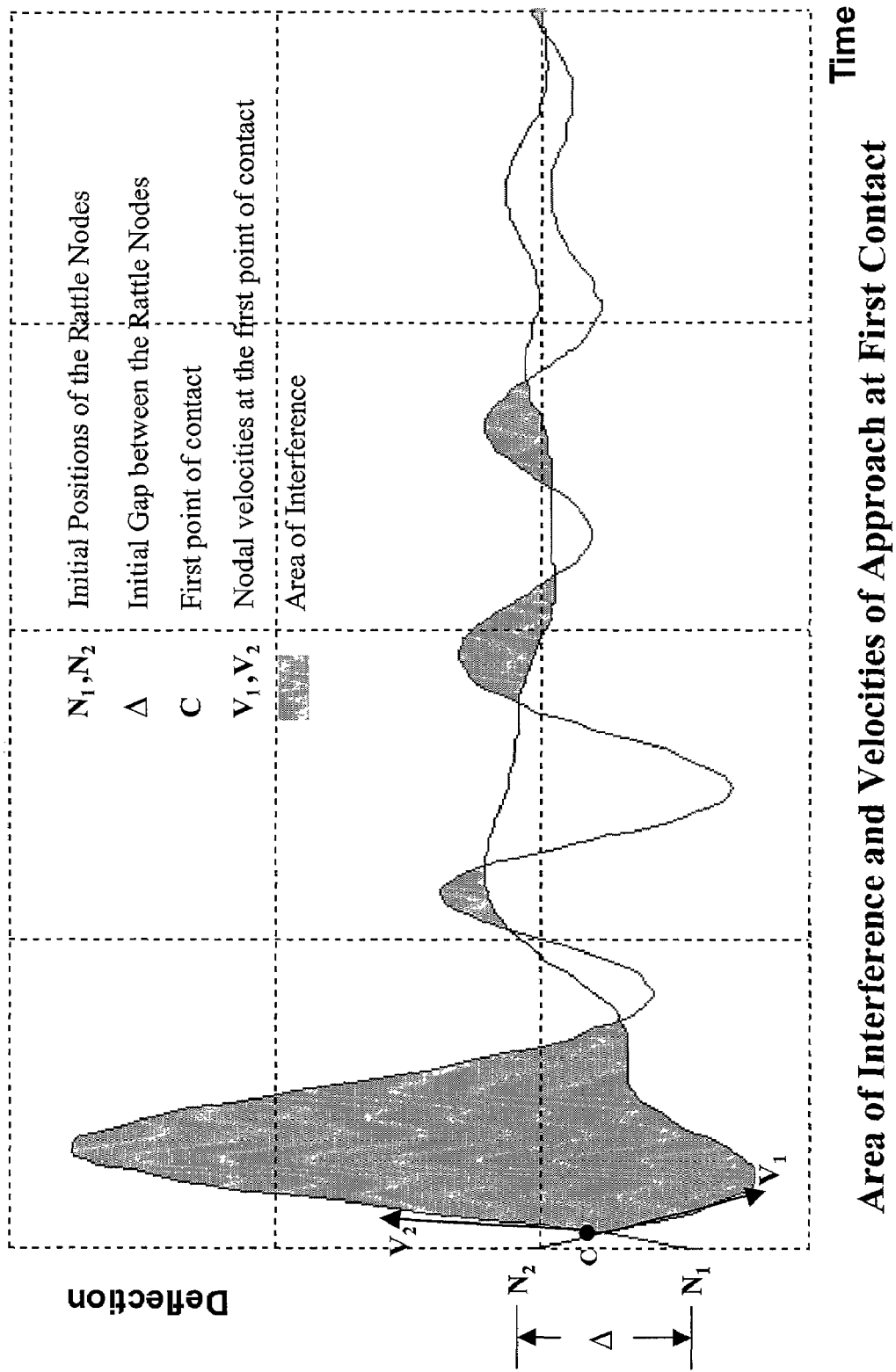
FIG. 19 is a graph illustrating two methods used by the point evaluation to evaluate noise characteristics, the area of interference between data points, and the velocities of two points at first contact.

In a preferred embodiment, the default criterion for sorting rattle points can be constructed based on relative energy loss due to impact. FIG. 19 illustrates the area of interference ($A_i$) between the two deflection curves in the time domain. This is equivalent to the positive part of the integral of the rattle response (R(t)) curve over the time domain. In alternative embodiments, alternative default criterion can be used such as momentum at the moment of first impact and other derivations.

Potential loss of momentum at first contact can also considered to enhance the rattle predictions if the impact properties of the materials are available. For estimating this index, the first point of contact can be evaluated as the time instance when the two time-domain deflection curves cross each other for the first time in FIG. 19. The slopes of the two curves at this point in time can be considered as the estimates of the velocities of approach ($V_1$ and $V_2$). The mass at the two rattle nodes ($m_1$ and $m_2$) can be computed as the diagonal assembly of the mass matrices of the elements attached to each node. The coefficient of restitution (User provided) for the material pair (e) is extracted from the model's material database. The momentum loss criterion is then computed as: $dM=(1-e)*(m_1*V_1+m_2*V_2)$.

A weighted average of the normalized energy loss criterion and the normalized momentum loss criterion can be provided as the third criterion for sorting rattling points. In a preferred embodiment this is recommended for best results, if impact properties of the materials are available. Other indices can also be used utilizing the underlying characteristics of mass, velocity, or coefficient of restitution.

3. Squek (Transactional) Index

The translational squeak propensity index for the non-fastener points are preferably computed as the area of interference in each direction as positive integrals of $S_u(t)$ and $S_v(t)$ over the time period. The translational squeak propensity index can be computed as the sum of the two components: $\int S_t(t)dt \equiv \int S_u(t)dt + \int S_v(t)dt$.

In alternative embodiments, the combined interference field can be computed as: $S_t(t) \equiv S_u(t) + S_v(t)$ and the maximum is taken as the criteria. A weighted-average of the two criteria can also be selected. Other potential indices can be used relying on other mathematical aspects of the squeak curve, or different underlying fundamental characteristics.

4. Squeak (Rotational) Index

In a preferred embodiment, the rotational squeak propensity index is computed as the area of interference between the two curves $R_1$ and $R_2$ over the time period. This is equivalent to the positive integral of $S_r(t)$ over the time period. The maximum interference is considered as alternative criteria. A weighted-average of the two criteria can also provided as a third alternative. Alternative embodiments may use different default criteria. Alternative indices include such proxies as the area under the rotational velocity curve, the coefficient of friction and the type of material, etc.

5. Bolt Response Index

By default in a preferred embodiment, the bolt response index is computed as an effective (Von Mises equivalent) stress developed in the bolt. As an alternative, the bolt torque can also provided as criteria. The user 29 can also employ a weighted-average of the two criteria. In both cases, an absolute integral about the mean response is computed. In alternative embodiments, different defaults can be set.

6. Snap Response Index

By default in a preferred embodiment, the snap response index is computed as an resultant force developed in the snap 44. An absolute integral about the mean response is computed for the index. In alternative embodiments, different defaults can be set.

N. Degraded Model Evaluation

Figure 20:
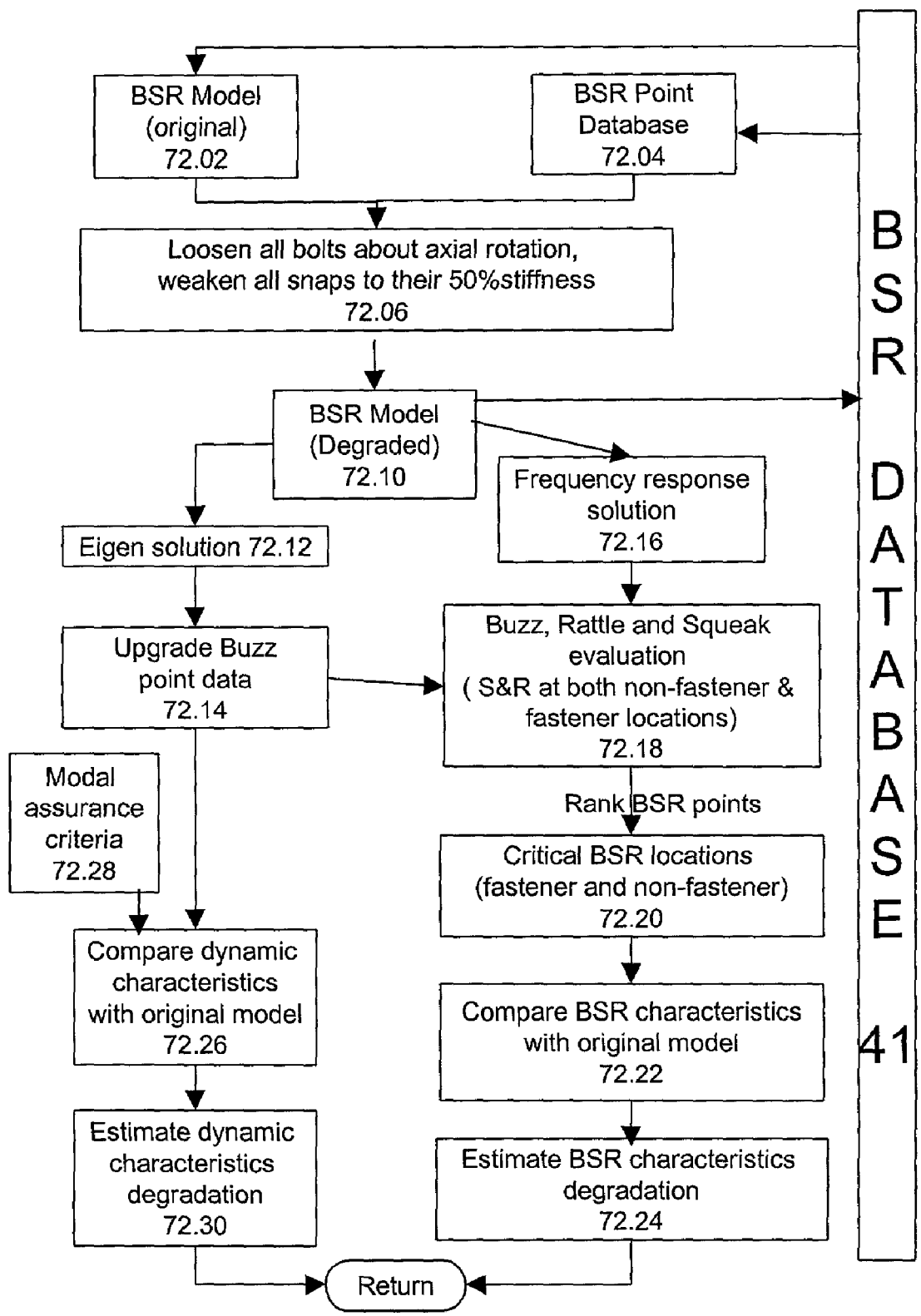
FIG. 20 is a flow chart of the process by which the point evaluation subsystem evaluates the degraded or degenerated model.

FIG. 20 is a flowchart of a degraded model evaluation model 72 evaluated in stage II. After the as-designed model 70 has been evaluated at 72.02, the point database 43 for that model can be accessed at 72.04 so that the system 28 can generate a structurally degraded model 72 by degrading all the fasteners 40 at 72.06. The rigid elements associated with the critical bolts 42 from the bolt evaluation 104 of the as-designed model 70 may be modified to reflect loss of torque retention by releasing degrees of freedom in the in-plane rotation. All the snaps 44 can be weakened to a prescribed fraction of their stiffness. In a preferred embodiment, all snaps 44 are reduced to 50% of their initial stiffness.

The system 28 then evaluates the noise characteristics of the degraded model 72 at 72.10 in a similar manner as the as-designed model 70 as generally described above. A new Eigen value solution at 72.12 can be used to update buzz point data at 72.14. Such buzz point data at 72.14 can be combined with the frequency response solution at 72.16 to evaluate buzz, rattle, and squeak points, at both fastener and non-fastener locations at 72.18. Critical points 56 can then ranked at 72.20, and the noise source characteristic results can be compared with the as-designed results at 72.22 and noise source characteristics degradation is estimated at 72.24.

The system 28 can also provide a mechanism to compare the dynamic characteristics, in addition to noise characteristics, of the as-designed model 72 with that of the degraded model 72 by applying the modal assurance criteria (for tracking the original modes in the degenerated model) at 72.28, as generally described in greater detail below. The degradation of dynamic characteristics can be estimated at 72.30.

To generate a restored model 74 at 72.30, the top "n"% of critical bolts can be strengthened and the top "n"% of critical snaps are restored to their original condition. In a preferred embodiment of the invention, the default value for "n" is 10, but the default can be changed by the user 29. If after viewing the results of enhancing the top "n"% critical fasteners 40, the user 29 can adjust "n" by either increasing the number of restored fasteners or decreasing the number of restored.

O. Restored Model Evaluation

Figure 21:
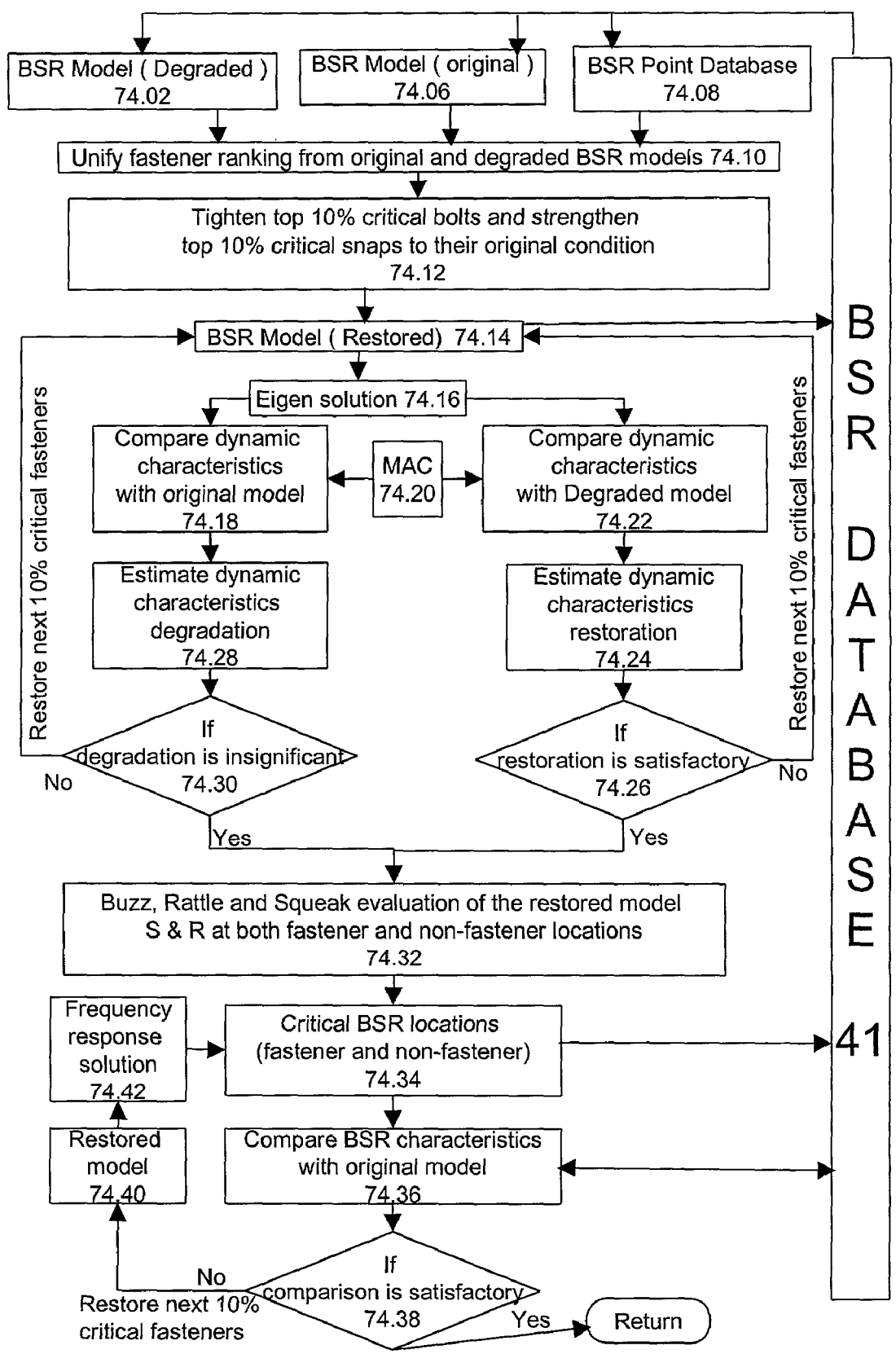
FIG. 21 is a flow chart of the process by which the point evaluation subsystem evaluates the restored or regenerated model.

FIG. 21 is a flow chart of an evaluating the restored model 74 in Stage III of the system 28. The system can evaluate the processed point database 45 at 74.08 of the as-designed model 70 at 74.06 and the degraded model 72 at 74.06 to unify fastener rankings for both models so that a single set of critical fasteners can be identified at 74.10. The top "n"% of those critical fasteners 54 can be structurally restored to their as-designed model 70 condition to create the restored model 74 at 74.14, where such fasteners have no loss of torque retention or degradation in stiffness. The required model information can be appended to the database 41.

The system 28 can then evaluate the noise source characteristics of the restored model 74 in a similar manner as with the as-designed 70 and degraded models 72 as generally described above. Eigen value solutions at 74.16 can be used to compare the dynamic characteristics of the restored model 74 with that of the as-designed model 70 at 74.18 and the degraded model 72 at 74.22 by applying the modal assurance criteria (again for tracking the original modes in the restored model) at 74.20. Dynamic characteristic can be estimated for degradation at 74.28 and restoration at 74.24. Dynamic characteristics can also be estimated at 74.28 and restored at 74.30 to generate visual representations of all three models as generally described in greater detail below. If the restoration is not satisfactory at 74.26, the next "n"% of critical fasteners can be restored.

BSR phenomenon and other noise source characteristics can be evaluated at both fastener and non-fastener locations of the restored model at 74.32. A new set of critical points 56 can be selectively identified at 74.34. BSR phenomenon and other noise source characteristics can then compared with those of the as-designed model 70 at 74.36. If that comparison is satisfactory at 74.28, the process can end. If that comparison is not satisfactory because the restored model 74 is not adequate (or for some other reason that the user 38 may have), the next "n"% of critical fasteners can be restored, and a new restored model 74 is created at 74.40 with a new eigen-value and frequency response solutions can be generated at 74.42, so the evaluation process can be repeated for the new restored model 74 until desired restoration is reached.

P. Modal Assurance Criteria

The system 28 provides a generic tool to compare the dynamic characteristics of two different (but comparable) models. The modal assurance criteria module 122 is used to insure meaningful restoration of a model. The system 28 can incorporate a GUI allowing a user 29 to view MAC results at 122.02, manipulate MAC parameters at 122.04, and to control the display of MAC results at 122.06. The user 29 may also be provided with certain special tools to apply or reject various parts, loads, components, or other attributes of a design 34 depending on his experience and/or preference. The system 28 may provide a generic tool for comparing the mode shapes of two different (but comparable) models to establish a frequency correlation between the two models.

Figure 22:
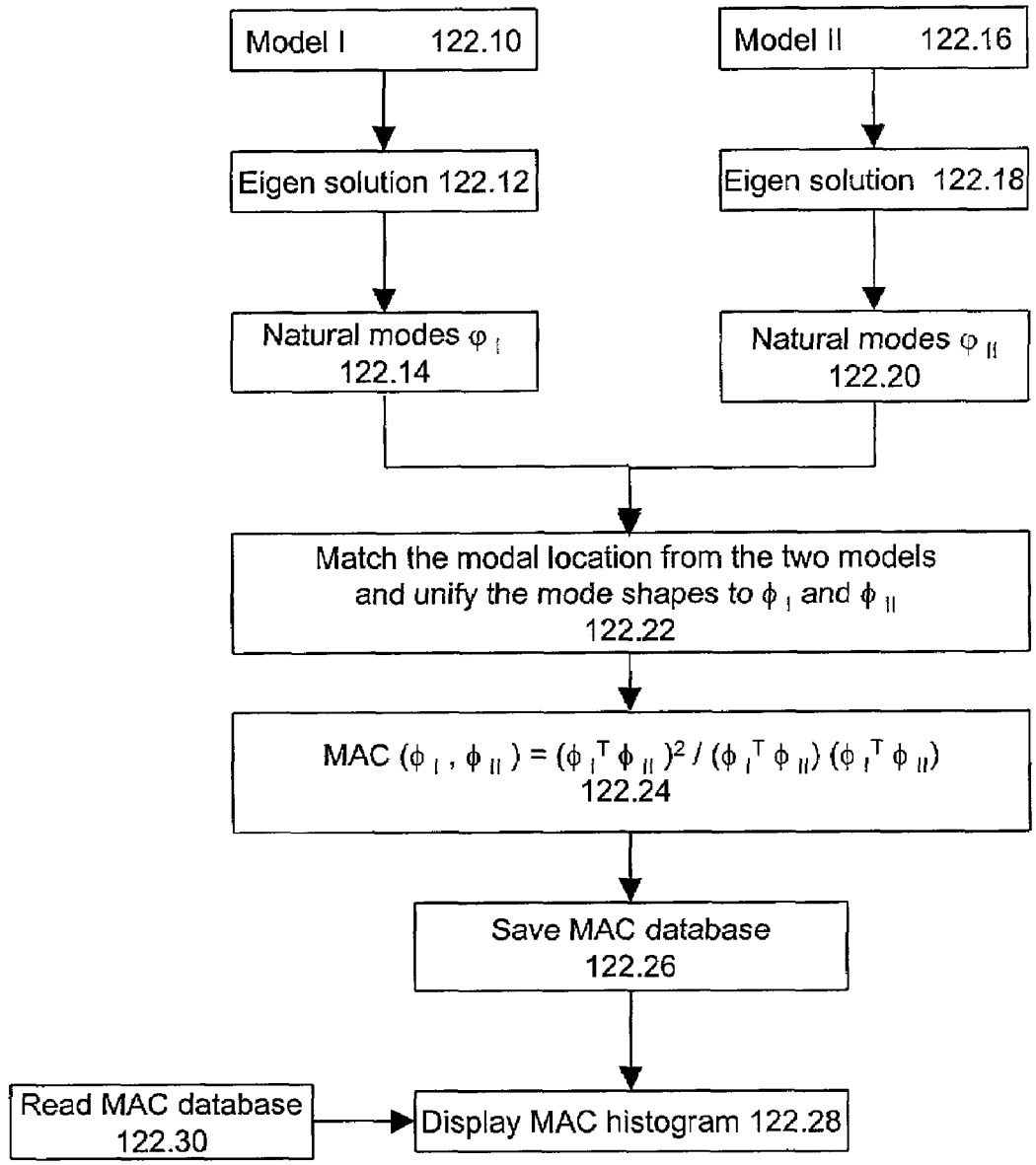
FIG. 22 is a flow chart disclosing the process modal comparison and the use of modal assurance criteria.

FIG. 22 is a flowchart of a preferred MAC process. The module can take model data at 122.10 and 122.16, Eigen value solutions (natural modes) for the two models at 122.12 and 122.18 can be used as input. Based on the mutually orthogonal property of the natural modes for each model at 122.14 and 122.20, the system 28 can generate participation factors for the different modes of the second model with reference to each mode of the first model and creates the direct participation index table at 122.22. Then the system 28 may compute the inverse participation factors table from the direct participation factors table at 122.24. The system 28 can provide facilities to filter the mode participation level as well as to display the direct and inverse modal assurance criteria between the two models at 122.28.

Q. Database Management

Binary file storage is preferably provided to save the information for model database 43, the point database 45, and the results database 47. In a preferred embodiment, all information including model, point, and index information can be stored on one single database 41. The results database 47 can be accessed through the index strategies module 108 at any time. Mechanisms can be provided for appending, deleting and modifying data blocks. Commit and rollback mechanisms for manipulating database can also be provided. Some of the potential interactions between the database 41 and the system 28 are depicted in many of the flowcharts discussed above. In a preferred embodiment of the invention, the database 41 is an object-oriented database. In alternative embodiments, any other database management scheme could be used.

The system 28 can store the model data, BSR point data, finite element results and the BSR results in binary files. File position pointers can be used to access the data blocks in the database. The file position pointers can be stored in an index file for making the file access efficient. The file position pointers can be used to access the required data block at the instance of a request for further processing. They can also be used to determine, at any time, whether a particular category of data block exists in the database 41 or not. The database management system can be equipped with mechanisms to insert, delete and/or modify a block of data at a given file position. The appending and copying mechanisms can also incorporated. The commit and rollback mechanisms can be incorporated using these intrinsic tools. Indigenous object oriented database management schemes can be used for efficient sort and search mechanism (I.D. or value-driven) on arrays and class templates. The system 28 can use its database 41 for: storing the BSR data it has generated, tracking the progress and current status of the BSR evaluation, controlling the sequence of steps/stages which is otherwise prefixed, and for accessing specific data blocks at any time from the binary file.

R. Automated Reporting

If desired, the system 28 can automatically generate reports relating to critical points 56 and the characteristics at those points. Generally, a user 29 need only determine the desired number of critical points 56 and critical locations for which the report needs to be generated. In a preferred embodiment of the invention, a default of 10% is used to determine the number of desirable critical points 56.

Figure 23:
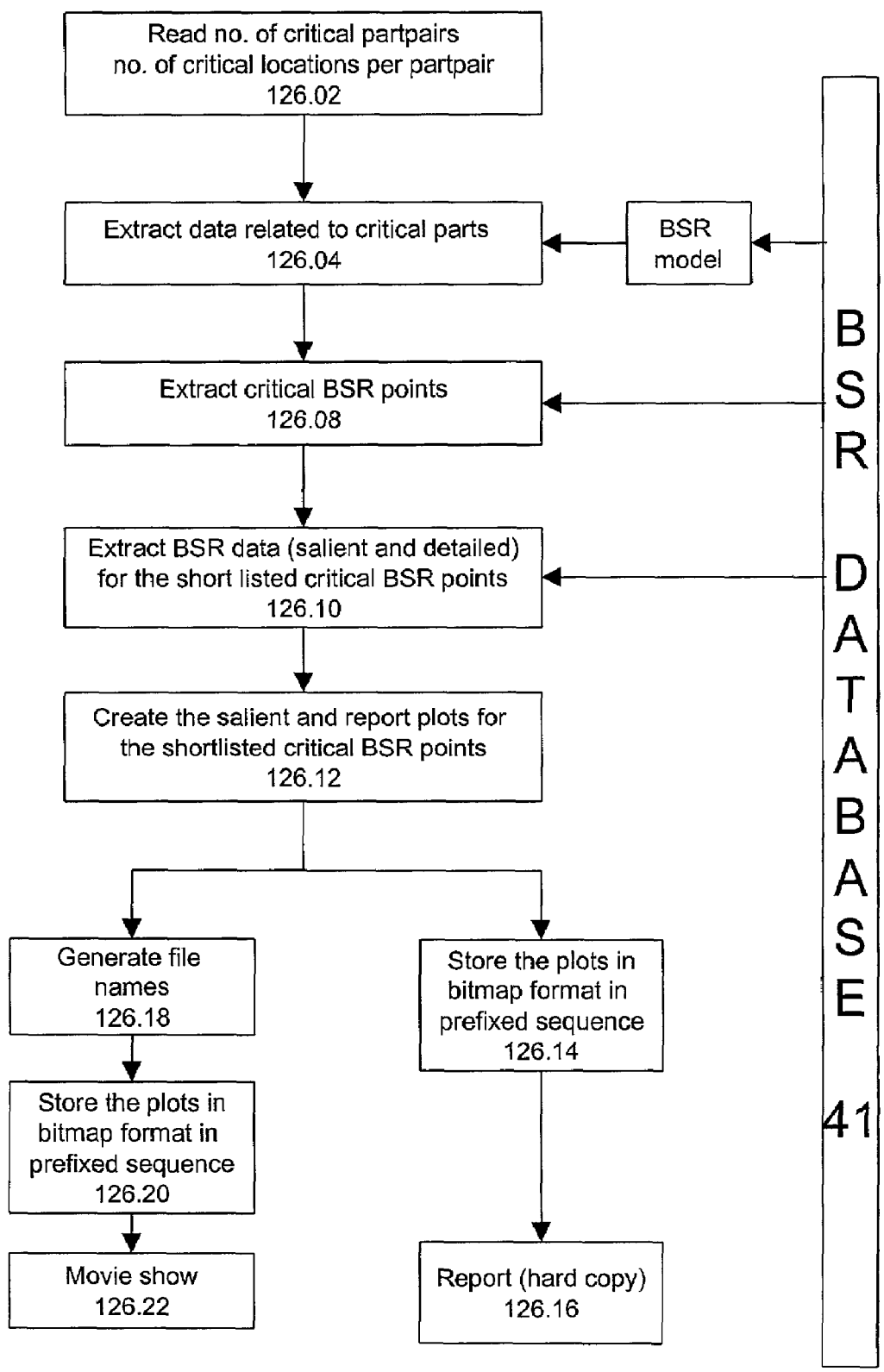
FIG. 23 is a flow chart disclosing the automatic report generation process.

FIG. 23 is a flowchart of a preferred automatic report generation process. The user 29 inputs the number of critical points 56 desired and the number of critical locations per part pair at 126.02. Model information at 126.06 and other database 41 information can be used to extract data related to the critical parts 38. Critical points 56 can then extracted at 126.08. Noise source characteristics for the critical points 56 can be extracted at 126.10. At 126.12, report plots can be created to display the information at 126.10. File names can be generated at 128.18 for the reports. The plots can be stored in a bitmap format in a prefixed sequence at 126.20, and can be viewed using the GUI at 126.22.

For hard copy reports, the plots at 126.14 can also be stored in a bitmap and various other printable formats in a predetermined sequence, so that a hard copy can be generated at 126.16.

S. Plot Display

The system 28 provides the ability of a user 29 to choose the category of noise source characteristic evaluation. This is influenced by three parameters: (1) Evaluation Type (Buzz, Squeak, Rattle or Response), BSR Point Type (squeak/rattle Points, Buzz Points, Bolts or Snaps) and the Presentation Style (Rank, Participation, Report, Time History, Magnitude Phase, Real Imaginary, Organ Plots, Animation, etc.). The system 28 can display the availability of results for the chosen category, if available, and provide a list of interesting points 54 selected where the user can choose to override. The system 28 can also provide the user 29 to control the number of critical part pairs 56 and the number of critical locations per part pair. A preferred GUI is designed to help the user 29 to monitor the databases in a selective manner. A preferred GUI allows the user 29 to select which interesting points 54 will be displayed by the system 28. The GUI can effectively supported with many facilities such as scrolling, editing, movie, saving, reading, printing, etc. Mechanisms/schemes are incorporated to prepare, store and/or print the requested report without any user interaction 29.

Preferred system 28 displays include but are not limited to: ranking information; participation density; data point reporting; magnitude-phase information, real-imaginary curves, time history, and organ plots.

T. Animation

Figure 24:
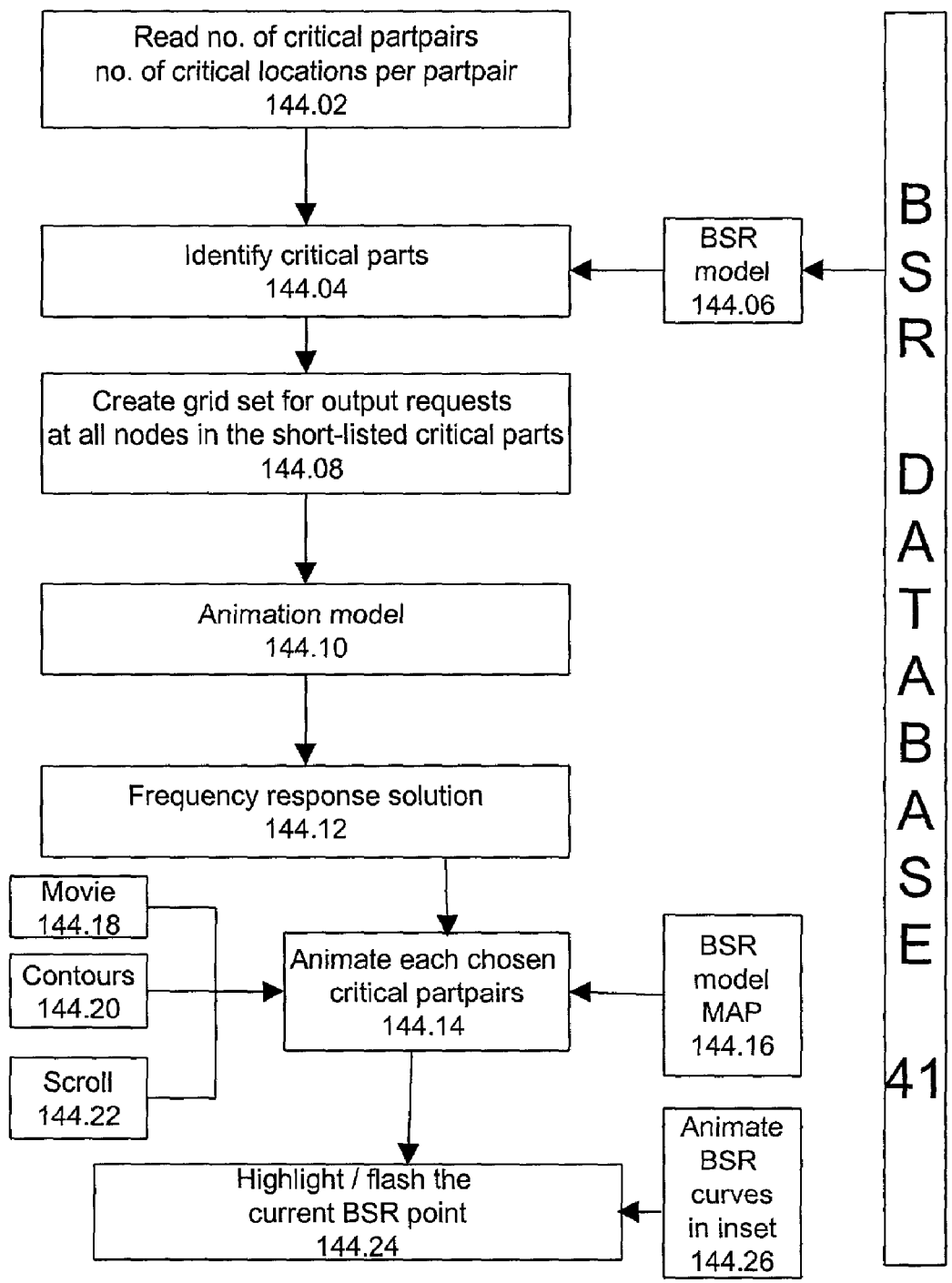
FIG. 24 is a flowchart of the animation process.

FIG. 24 is a flowchart of a preferred animation module 116. As an advanced visualization option in a preferred embodiment of the invention, the system 28 can provide the ability for viewing BSR phenomena and other noise source characteristics in a pre-selected set of critical parts 38. The user 29 can select the number of critical points and critical locations that the user 29 is interested in at 144.02. The appropriate number of critical points 56 or critical point pairs 56 can then be identified at 144.04 using database 41 and model information at 144.06. Once the number of critical parts 38 is selected, the system 28 can identify the critical parts 38 in the model database 43 and creates model data with specific output requests for displacement fields at 144.04 for preferably all interesting points 54 in the few internally selected parts 38. Then, the system 28 can read the dynamic response of these parts 38 when the model at 144.10 is subjected to the same dynamic loads. The time period for animation is computed as twice the maximum time taken by any of the rattle points for first contact. The frequency domain response at 144.12 can then be transformed to the time domain over the animation time period using a Fast Fourier transformation. The time domain data generated can be stored in the database 41 permanently for future presentation. When the animation is triggered at 144.14, the system 28 can retrieve the time domain data from the database and animates the real time deformation on the associated parts. The movie 144.18, contours 144.20, scroll 144.22, and BSR model map 144.16 can be incorporated into the animation at 144.14. Animation can be viewed for each critical part pair 56 either individually or in an automated movie. The part contact locations can be flashed with appropriate color code during the animation to provide a feel for the sequence and relative intensity of contacts. A scaled sound effect can also be provided to provide a feel for the relative intensity of noise in each category. The currently interesting point 54 can be highlight or flashed at 144.24, and curves can be animated at 144.26.

U. Model Comparisons

Figure 25:
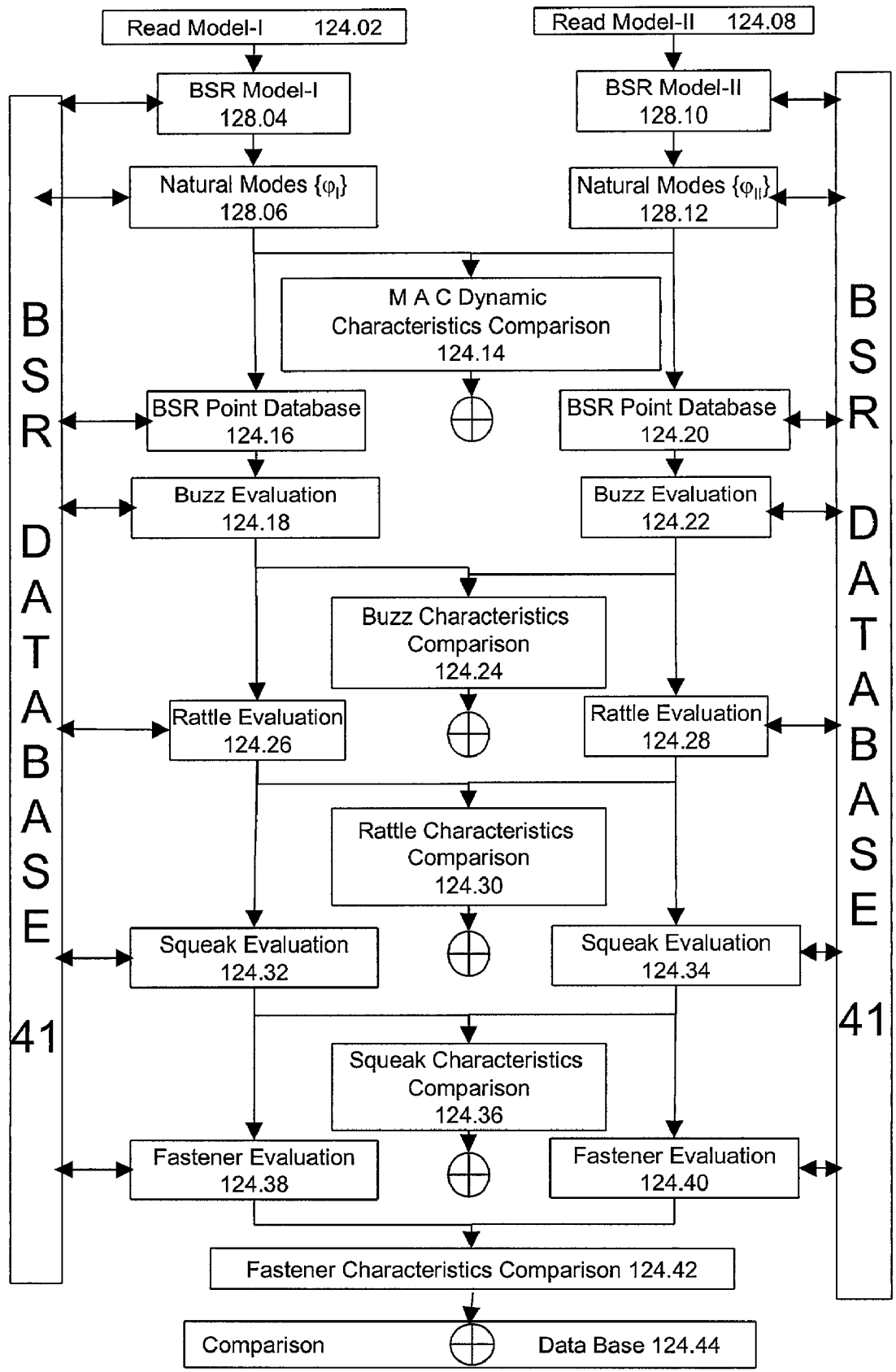
FIG. 25 is a flowchart illustrating the process by which alternative designs can be compared from the perspective of noise source characteristics.

The System 28 can also possess the capability of comparing alternative designs of an assembly 30 from a noise source characteristics standpoint. A GUI can be used to provide a wide variety of visual representations for the comparison of models. FIG. 25 discloses a flowchart of a preferred Modal Assurance Criteria.

Two finite element models 68 of the two alternative designs can be inputted in the system 28 at 124.02 and 124.04. Those models can be cleaned, enhanced, and formatted as as-designed models 70 at 124.04 and 124.10. The natural modes can then be processed at 124.06 and 124.12 to create entries on the point database 43. The natural modes can be extracted from the database 41 to carry out Modal Assurance Criteria evaluation to assess the dynamic characteristics of the two models comparatively at 124.14. The frequency response of the models can then be processed to evaluate the noise source characteristics of the two as-designed models 70. The models, point sets, characteristic fields and natural modes can be stored into the database 41. The BSR characteristic fields can then extracted from the database 41 to carry out comparative assessment of the two models from a noise source characteristics standpoint. Buzz evaluations can be conducted at 124.18 and 124.22, and then compared at 124.24. Rattle evaluations can be conducted at 124.26 and 124.28, and the compared at 124.30. Squeak evaluations can be conducted at 124.32 and 124.32, and then compared at 124.36. Fastener evaluations may be conducted at 124.38 and 124.40, and then can be compared at 124.42.

The absolute ranking indices ($\iota_I$ and $\iota_{II}$) of the two models can be used to compare the two models with two options: by maximum absolute index ($\max(\iota_I)$ and $\max(\iota_{II})$) and by integrated index parameter ($\Sigma \iota_I$ and $\Sigma \iota_{II}$). Bar charts can be provided for location-wise comparison of BSR characteristics between the two models.

V. Graphical User Interface

The generic Graphical User Interface that supports the system 28 can include standard model viewing tools (e.g. 2- and 3-dimensional rotations, zoom, pan, views, rendering styles, etc.), utilities (e.g. mask/display objects, BSR point map display, part/component/assembly management, element/mesh split, mesh stitch, part weld, feature edges, etc.), and/or the associated tools (e.g. display tools for bolts, welds, snaps, non-fastener squeak and rattle points, buzz points associated with BSR point map display utility).

Although a few exemplary embodiments of this invention have been described in detail above, those skilled in the art will appreciate that many modifications are possible in the exemplary embodiments without materially departing from the novel teachings and advantages of this invention. Accordingly, all such modifications are intended to be included within the scope of this invention as defined in the following claims, which should be construed as broadly as the prior art will allow. Moreover, the headings included herein are for the convenience of the reader and should not be construed in any manner that would limit the scope of the claimed invention.

What is claimed is:

1. A noise source evaluation system comprising:
   a analytical design of an assembly, said analytical design including an original model comprising a plurality of representative data points including fastener representations;
   a point selection subsystem that uses a point selection subroutine or heuristic to selectively identify a subset of representative data points or point pairs and designates such data points or point pairs as interesting points with respect to one or more characteristics; and
   a point evaluation subsystem that analyzes each interesting point with respect to one or more characteristics and generates a plurality of modified or enhanced design models using said subset of data points that are interesting and uses point evaluation subroutines or heuristics with modified design models to evaluate and predict a noise source characteristic in said analytical design.

2. A noise source evaluation system as recited in claim 1, wherein said noise source characteristic is a buzz, squeak, or rattle.

* * * * *